(12) United States Patent
Shibata et al.

(10) Patent No.: US 9,183,936 B2
(45) Date of Patent: Nov. 10, 2015

(54) SEMICONDUCTOR MEMORY DEVICE FOR STORING MULTIVALUED DATA

(71) Applicant: Kabushiki Kaisha Toshiba, Minato-ku (JP)

(72) Inventors: Noboru Shibata, Kawasaki (JP); Tomoharu Tanaka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/581,714

(22) Filed: Dec. 23, 2014

(65) Prior Publication Data

US 2015/0109863 A1   Apr. 23, 2015

Related U.S. Application Data

(60) Continuation of application No. 14/266,275, filed on Apr. 30, 2014, now Pat. No. 8,947,930, which is a continuation of application No. 14/079,279, filed on Nov. 13, 2013, now Pat. No. 8,743,607, which is a continuation of application No. 13/648,778, filed on Oct. 10, 2012, now Pat. No. 8,619,468, which is a (Continued)

(30) Foreign Application Priority Data

Nov. 29, 2002   (JP) ................................ 2002-347797
Dec. 1, 2003    (JP) ................................ 2003-402161

(51) Int. Cl.
| | |
|---|---|
| *G11C 11/34* | (2006.01) |
| *G11C 16/10* | (2006.01) |
| *G11C 11/56* | (2006.01) |
| *G11C 16/04* | (2006.01) |
| *G11C 16/12* | (2006.01) |
| *G11C 16/34* | (2006.01) |

(52) U.S. Cl.
CPC ............ *G11C 16/10* (2013.01); *G11C 11/5628* (2013.01); *G11C 11/5642* (2013.01); *G11C 16/0483* (2013.01); *G11C 16/12* (2013.01); *G11C 16/3459* (2013.01); *G11C 2211/5621* (2013.01); *G11C 2211/5646* (2013.01); *G11C 2211/5648* (2013.01); *G11C 2216/14* (2013.01)

(58) Field of Classification Search
CPC .............. G11C 16/10; G11C 11/5628; G11C 11/5642; G11C 16/0483
USPC .......................... 365/185.06, 185.18, 185.22
See application file for complete search history.

(56) References Cited

U.S. PATENT DOCUMENTS

| | | | |
|---|---|---|---|
| 5,428,569 A | 6/1995 | Kato et al. |
| 5,523,972 A | 6/1996 | Rashid et al. |
| 5,675,537 A | 10/1997 | Bill et al. |
| 5,724,300 A | 3/1998 | Tanaka et al. |
| 5,848,009 A | 12/1998 | Lee et al. |
| 5,901,089 A | 5/1999 | Korsh et al. |

(Continued)

FOREIGN PATENT DOCUMENTS

JP    2002-324400    11/2002

*Primary Examiner* — Viet Q Nguyen
(74) *Attorney, Agent, or Firm* — Oblon, McClelland, Maier & Neustadt, L.L.P.

(57) ABSTRACT

Data storage circuits are connected to the bit lines in a one-to-one correspondence. A write circuit writes the data on a first page into a plurality of 5 first memory cells selected simultaneously by a word line. Thereafter, the write circuit writes the data on a second page into the plurality of first memory cell. Then, the write circuit writes the data on the first and second pages into second memory cells adjoining 10 the first memory cells in the bit line direction.

18 Claims, 52 Drawing Sheets

Related U.S. Application Data continuation of application No. 13/158,508, filed on Jun. 13, 2011, now Pat. No. 8,310,871, which is a continuation of application No. 12/837,595, filed on Jul. 16, 2010, now Pat. No. 7,978,514, which is a continuation of application No. 12/365,039, filed on Feb. 3, 2009, now Pat. No. 7,782,670, which is a continuation of application No. 12/189,566, filed on Aug. 11, 2008, now Pat. No. 7,593,260, which is a continuation of application No. 11/949,649, filed on Dec. 3, 2007, now Pat. No. 7,443,724, which is a continuation of application No. 11/469,279, filed on Aug. 31, 2006, now Pat. No. 7,315,471, which is a division of application No. 11/325,917, filed on Jan. 4, 2006, now Pat. No. 7,120,052, which is a division of application No. 10/764,828, filed on Jan. 26, 2004, now Pat. No. 7,016,226, which is a continuation-in-part of application No. 10/689,868, filed on Oct. 20, 2003, now Pat. No. 6,925,004, which is a continuation-in-part of application No. 10/358,643, filed on Feb. 4, 2003, now Pat. No. 6,657,891.

(56) References Cited

U.S. PATENT DOCUMENTS

| | | | |
|---|---|---|---|
| 5,986,933 A | 11/1999 | Takeuchi et al. | |
| 5,996,041 A | 11/1999 | Kim | |
| 5,999,445 A | 12/1999 | Roland et al. | |
| 6,028,794 A | 2/2000 | Nakai et al. | |
| 6,028,799 A | 2/2000 | Beigel et al. | |
| 6,097,635 A | 8/2000 | Chang | |
| 6,195,287 B1 | 2/2001 | Hirano | |
| 6,222,779 B1 | 4/2001 | Saito et al. | |
| 6,282,117 B1 | 8/2001 | Tanaka et al. | |
| 6,288,935 B1 | 9/2001 | Shibata et al. | |
| 6,373,746 B1 | 4/2002 | Takeuchi et al. | |
| 6,414,693 B1 | 7/2002 | Berger et al. | |
| 6,414,893 B1 | 7/2002 | Miyamoto | |
| 6,522,580 B2 | 2/2003 | Chen et al. | |
| 6,525,580 B2 | 2/2003 | Singor | |
| 6,643,188 B2 | 11/2003 | Tanaka et al. | |
| 6,657,891 B1 * | 12/2003 | Shibata et al. | 365/185.03 |
| 6,671,204 B2 | 12/2003 | Im | |
| 6,717,857 B2 | 4/2004 | Byeon et al. | |
| 6,807,095 B2 | 10/2004 | Chen et al. | |
| 6,836,431 B2 | 12/2004 | Chang | |
| 6,850,435 B2 | 2/2005 | Tanaka | |
| 6,870,773 B2 | 3/2005 | Noguchi et al. | |
| 6,876,578 B2 | 4/2005 | Shibata et al. | |
| 6,914,823 B2 | 7/2005 | Chen et al. | |
| 6,925,004 B2 * | 8/2005 | Shibata et al. | 365/185.03 |
| 6,937,518 B1 | 8/2005 | Park et al. | |
| 6,944,063 B2 | 9/2005 | Chen et al. | |
| 7,016,226 B2 * | 3/2006 | Shibata et al. | 365/185.03 |
| 7,057,939 B2 | 6/2006 | Li et al. | |
| 7,061,798 B2 | 6/2006 | Chen et al. | |
| 7,120,052 B2 * | 10/2006 | Shibata et al. | 365/185.03 |
| 7,196,033 B2 | 3/2007 | Renken et al. | |
| 7,245,528 B2 | 7/2007 | Shibata et al. | |
| 7,310,269 B2 | 12/2007 | Shibata | |
| 7,315,471 B2 * | 1/2008 | Shibata et al. | 365/185.03 |
| 7,349,249 B2 | 3/2008 | Honma et al. | |
| 7,352,628 B2 | 4/2008 | Kamel | |
| 7,376,009 B2 | 5/2008 | Shibata et al. | |
| 7,388,780 B2 | 6/2008 | Arita | |
| 7,394,691 B2 | 7/2008 | Shibata et al. | |
| 7,440,325 B2 | 10/2008 | Shibata | |
| 7,443,724 B2 * | 10/2008 | Shibata et al. | 365/185.03 |
| 7,471,559 B2 | 12/2008 | Shibata | |
| 7,554,862 B2 | 6/2009 | Shibata | |
| 7,573,750 B2 | 8/2009 | Shibata | |
| 7,593,260 B2 * | 9/2009 | Shibata et al. | 365/185.03 |
| 7,636,261 B2 | 12/2009 | Shibata | |
| 7,642,138 B2 | 1/2010 | Kurjanowicz | |
| 7,738,302 B2 | 6/2010 | Shibata et al. | |
| 7,782,670 B2 * | 8/2010 | Shibata et al. | 365/185.03 |
| 7,813,171 B2 | 10/2010 | Shibata et al. | |
| 7,813,174 B2 | 10/2010 | Shibata et al. | |
| 7,855,119 B2 | 12/2010 | Petti et al. | |
| 7,929,352 B2 | 4/2011 | Shibata | |
| 7,978,514 B2 * | 7/2011 | Shibata et al. | 365/185.03 |
| 8,264,894 B2 | 9/2012 | Shibata | |
| 8,305,817 B2 | 11/2012 | Park et al. | |
| 8,310,871 B2 * | 11/2012 | Shibata et al. | 365/185.03 |
| 8,432,748 B2 | 4/2013 | Shibata | |
| 8,619,468 B2 * | 12/2013 | Shibata et al. | 365/185.03 |
| 8,743,607 B2 * | 6/2014 | Shibata et al. | 365/185.03 |
| 8,947,930 B2 * | 2/2015 | Shibata et al. | 365/185.03 |
| 2012/0147653 A1 | 6/2012 | Chung | |

* cited by examiner

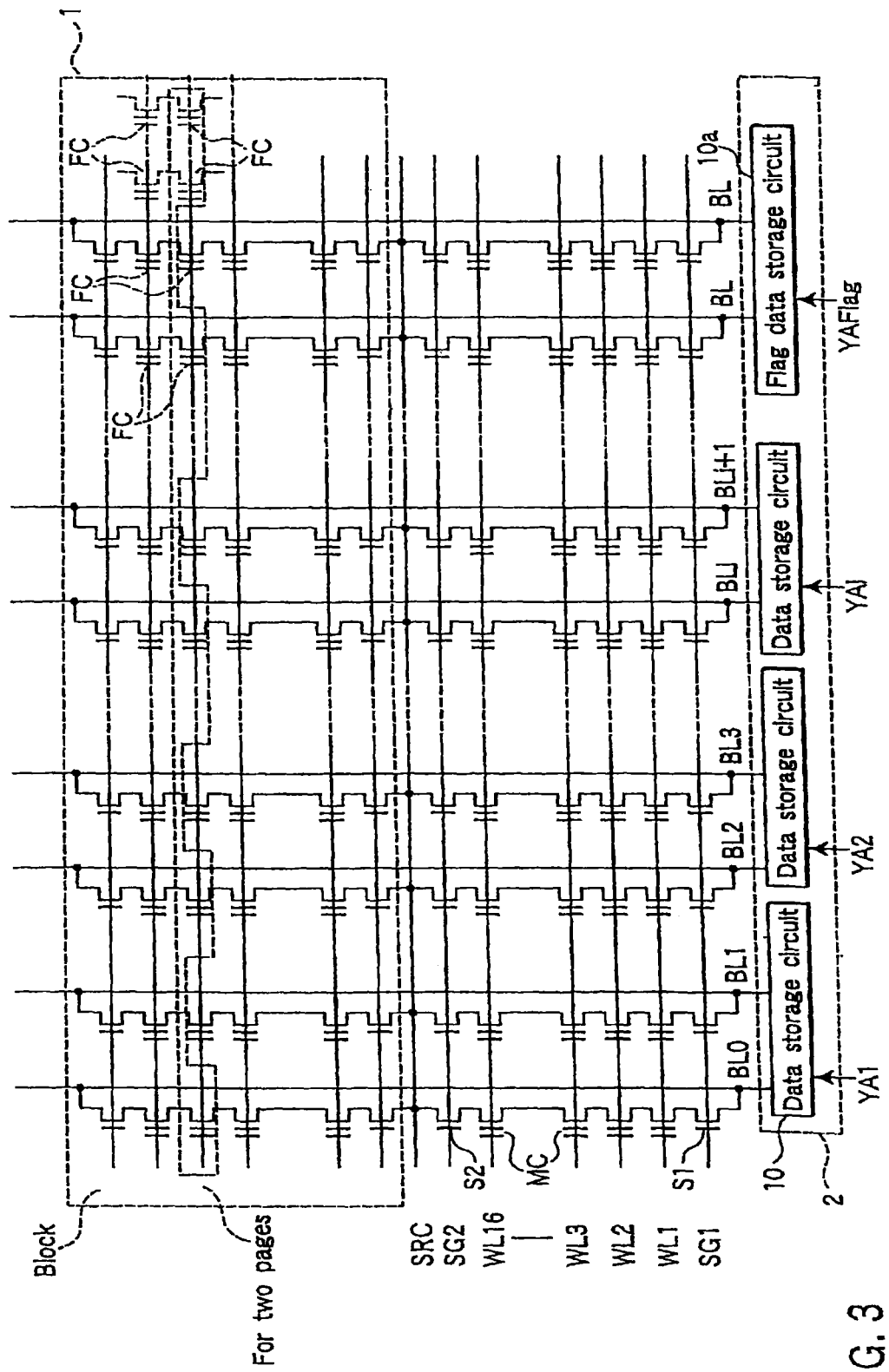
F I G. 3

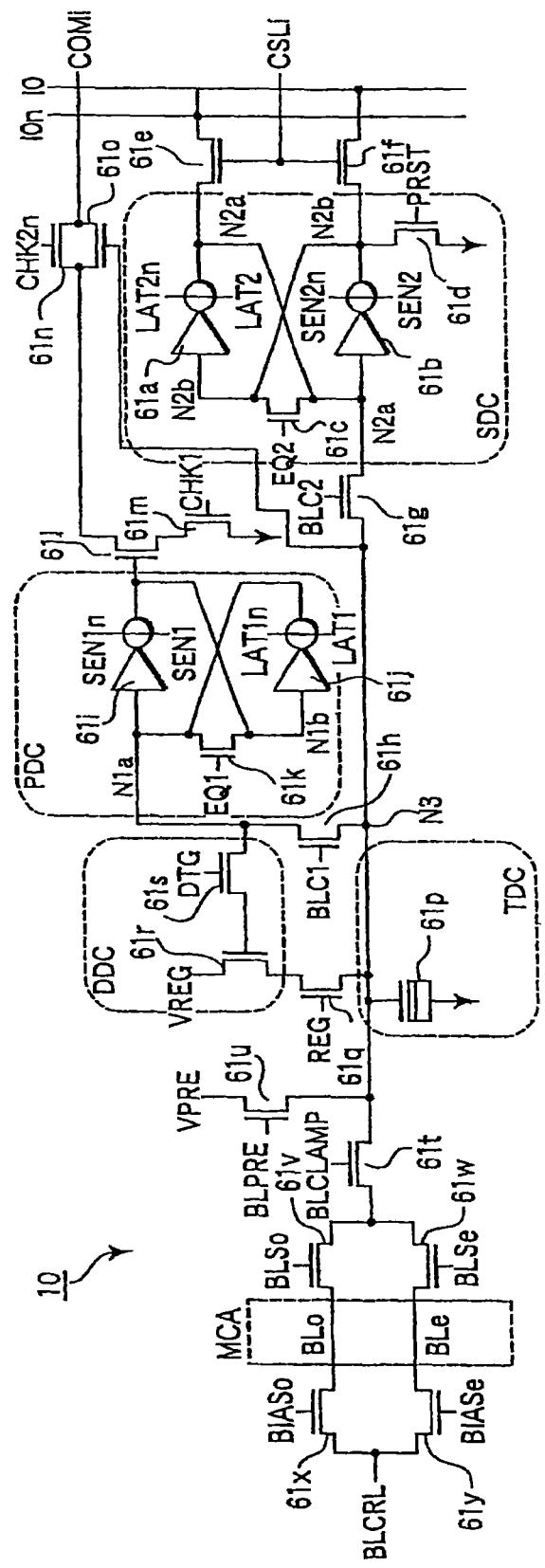
F I G. 6

After data load and internal read

| | Data in memory cell after writing | | | | |
|---|---|---|---|---|---|
| | 0 | 1 | 2 | 3 | |
| SDC | 1 | 0 | 0 | 1 | Data to be written and read inputted from the outside world |
| PDC | 0 | 0 | 1 | 1 | Data read by internal read |

F I G. 10A

After setting data caches

| | Data in memory cell after writing | | | | |
|---|---|---|---|---|---|
| | 0 | 1 | 2 | 3 | |
| SDC | 1 | 1 | 1 | 0 | Used for charging in verifying memory cell data 1 |
| DDC | 0 | 1 | 1 | 0 | Used for charging in verifying memory cell data 2 |
| PDC | 1 | 0 | 0 | 0 | 1: Write unselected 0: Write |

F I G. 10B

Data cache setting procedure

| SDC 0 | SDC 1 | SDC 2 | SDC 3 | DDC 0 | DDC 1 | DDC 2 | DDC 3 | PDC 0 | PDC 1 | PDC 2 | PDC 3 | TDC 0 | TDC 1 | TDC 2 | TDC 3 | |
|---|---|---|---|---|---|---|---|---|---|---|---|---|---|---|---|---|
| 1 | 0 | 0 | 1 |   |   |   |   |   |   |   |   |   |   |   |   | Data in memory cell after writing |
| 1 | 0 | 0 | 1 |   |   |   |   | 0 | 0 | 1 | 1 |   |   |   |   | After internal data read |
| 1 | 0 | 0 | 1 | 0 | 0 | 1 | 1 | 0 | 0 | 1 | 1 |   |   |   |   | Copy data in PDC into DDC |
| 1 | 0 | 0 | 1 | 0 | 0 | 1 | 1 | 1 | 0 | 0 | 1 |   |   |   |   | Copy data in SDC into PDC |
| 1 | 0 | 0 | 1 | 0 | 0 | 1 | 1 | 1 | 0 | 0 | 1 | 1 | 1 | 1 | 1 | TDC=H |
| 1 | 0 | 0 | 0 | 0 | 0 | 1 | 1 | 1 | 0 | 0 | 1 | 1 | 1 | 0 | 0 | VREG=L, REG=H |
| 1 | 0 | 0 | 0 | 0 | 0 | 1 | 1 | 1 | 0 | 0 | 1 | 1 | 1 | 0 | 0 | Copy data in TDC into SDC |
| 1 | 0 | 0 | 0 | 0 | 0 | 1 | 1 | 1 | 0 | 0 | 1 | 1 | 0 | 0 | 1 | Copy data in PDC into TDC |
| 1 | 0 | 0 | 0 | 1 | 0 | 1 | 1 | 1 | 0 | 0 | 1 | 1 | 0 | 0 | 0 | VREG=L, REG=H |
| 1 | 0 | 0 | 0 | 1 | 0 | 0 | 1 | 1 | 0 | 0 | 1 | 1 | 0 | 0 | 0 | Copy data in PDC into DDC |
| 1 | 0 | 0 | 0 | 1 | 0 | 0 | 1 | 1 | 0 | 0 | 0 | 1 | 0 | 0 | 0 | Copy data in TDC into PDC |

Data cache setting 1

| | Data in memory cell after writing | | | |
|---|---|---|---|---|
| | 0 | 1 | 2 | 3 |
| SDC | 1 | 0 | 0 | 1 |
| DDC | 0 | 0 | 1 | 1 |
| PDC | 1 | 0 | 1 | 1 |

1: Write unselected 0: Write

F I G. 25

Data cache setting 1

| | Data in memory cell after writing | | | |
|---|---|---|---|---|
| | 0 | 1 | 2 | 3 | |
| SDC | 0 | 1 | 0 | 0 | Used for charging in verifying memory cell data 1 |
| DDC | 0 | 1 | 1 | 0 | Used for charging in verifying memory cell data 2 |
| PDC | 1 | 0 | 0 | 0 | 1: Write unselected 0: Write |

FIG. 27A

Data cache setting 2

| | Data in memory cell after writing | | | |
|---|---|---|---|---|
| | 0 | 1 | 2 | 3 | |
| PDC | 1 | 0 | 1 | 1 | 1: Write unselected 0: Write |

FIG. 27B

After data load and internal read

| | Data in memory cell after writing | | | |
|---|---|---|---|---|
| | 0 | 1 | 2 | 3 | |
| SDC | 0 | 1 | 0 | 1 | Data to be written and read inputted from the outside world |
| PDC | 0 | 0 | 0 | 1 | Data read by internal read |

F I G. 29A

After data cache setting

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 0/1 | 0 | 0 | 1: Write unselected 0: Write |

F I G. 29B

FIG. 30A Precharge bit line on the basis of the data in DDC

| | Data in memory cell after writing | | | |
|---|---|---|---|---|
| | 0 | 1 | 2 | 3 |
| Bit line | Vdd | F(Vss) | Vdd | Vdd |

FIG. 30B With BLC1 = Vclamp, connect PDC to bit line

| | Data in memory cell after writing | | | |
|---|---|---|---|---|
| | 0 | 1 | 2 | 3 |
| Bit line | Vdd | 0/Inter-mediate | 0 | 0 |

FIG. 30C During program recovery, transfer data in PDC to DDC, invert data in DDC, and transfer the inverted data to PDC

| | Data in memory cell after writing | | | | |
|---|---|---|---|---|---|
| | 0 | 1 | 2 | 3 | |
| SDC | 0 | 1 | 0 | 0 | Used for charging in verifying memory cell data 2 |
| DDC | 1 | 0/1 | 0 | 0 | 1: Write unselected 0: Write |
| PDC | 0 | 1 | 1 | 0 | Used for precharging bit line in programming and for charging in verifying memory cell data 1 |

Verify (a)
Charge bit line on the basis of data in PDC
Discharge bit line at a potential of WL = a*
Invert data in PDC while discharging bit line

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0/1 | 0 | 0 | 1: Write unselected 0: Write |
| PDC | 1 | 0 | 1 | 1 | Used for precharging bit line in programming and for charging in verifying memory cell data 1 |

FIG. 31A

Load the potential of bit line into TDC
With VREG = H and REG = H, make TDC 1 when dynamic data is 1
Transfer data in PDC to DDC and data in TDC to PDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 0 | 1 | User for precharging bit line in programming and for chagrining in verifying memory cell data 1 |
| PDC | 1 | 0/1 | 1 | 1 | 1: Write unselected 0: Write |

FIG. 31B

With WL = a', discharge bit line
With VREG = H and REG = H, set 1 in TDC when dynamic data is 1
Transfer data in PDC to DDC
Transfer data in TDC to PDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 0 | 0/1 | 0 | 0 | 1: Write unselected 0: Write |
| PDC | 1 | 0 | 1 | 1 | Used for precharging bit line in programming and for charging in verifying memory cell data 1 |

F I G. 32A

Transfer data in DDC to PDC
Then, transfer data in PDC to DDC

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 0/1 | 0 | 0 | 1: Write unselected 0: Write |

F I G. 32B

With memory cell data 1, all of the writing with verify (a*) is completed
(the writing with verify (a') might not be completed)

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 0 | 1 | 1 | Used for precharging bit line in programming and for charging in verifying memory cell data 1 |
| PDC | 1 | 1 | 0 | 0 | 1: Write unselected  0: Write |

FIG. 33A

With memory cell data 1, all of the writing with verify (a') is completed
(the writing with verify (a') might not be completed)

| | Data in memory cell after writing | | | | |
|---|---|---|---|---|---|
| | 0 | 1 | 2 | 3 | |
| SDC | 0 | 1 | 1 | 0 | Used for charging in verifying memory cell data 2 |
| DDC | 1 | 1 | 1 | 1 | Used for precharging bit line in programming and for charging in verifying memory cell data 1 |
| PDC | 1 | 1 | 0 | 0 | 1: Write unselected  0: Write |

FIG. 33B (After writing first page and before writing second page)

After third page data load internal read 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 0 | 0 | 1 | 1 | 0 | 0 | 1 | Data to be written and read inputted from the outside world |
| DDC | 0 | 0 | 0 | 0 | 0 | 0 | 1 | 1 | Data to be read by internal read |
| PDC | 0 | 0 | 0 | 0 | 1 | 1 | 1 | 1 | Data to be read by internal read |

FIG. 39A

After third page data cache setting 1

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 1 | 1 | 1 | 1 | 0 | 0 | Used for charging in verifying memory cell data items 5, 4 |
| DDC | 0 | 1 | 1 | 0 | 0 | 1 | 1 | 0 | Used for charging in verifying memory cell data 6<br>Forced to be at VSS in verifying memory cell data 4 |
| PDC | 1 | 1 | 1 | 1 | 0 | 0 | 0 | 0 | 1: Write unselected 0: Write |

FIG. 39B

After third page data cache setting 2

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 0 | 0 | 0 | 0 | 0 | 0 | |
| DDC | 0 | 1 | 1 | 0 | 0 | 1 | 1 | 0 | |
| PDC | 1 | 0 | 1 | 1 | 1 | 1 | 1 | 1 | 1: Write unselected 0: Write |

FIG. 40A

After third page data cache setting 3

| | Data in memory cell after writing | | | | | | | | |
|---|---|---|---|---|---|---|---|---|---|
| | 0 | 1 | 2 | 3 | 4 | 5 | 6 | 7 | |
| SDC | 1 | 1 | 0 | 0 | 0 | 0 | 0 | 0 | Used for charging in verifying memory cell data 1 |
| DDC | 0 | 1 | 1 | 0 | 0 | 1 | 1 | 0 | Used for charging in verifying memory cell data 2 |
| PDC | 1 | 0 | 0 | 0 | 1 | 1 | 1 | 1 | 1: Write unselected 0: Write |

FIG. 40B

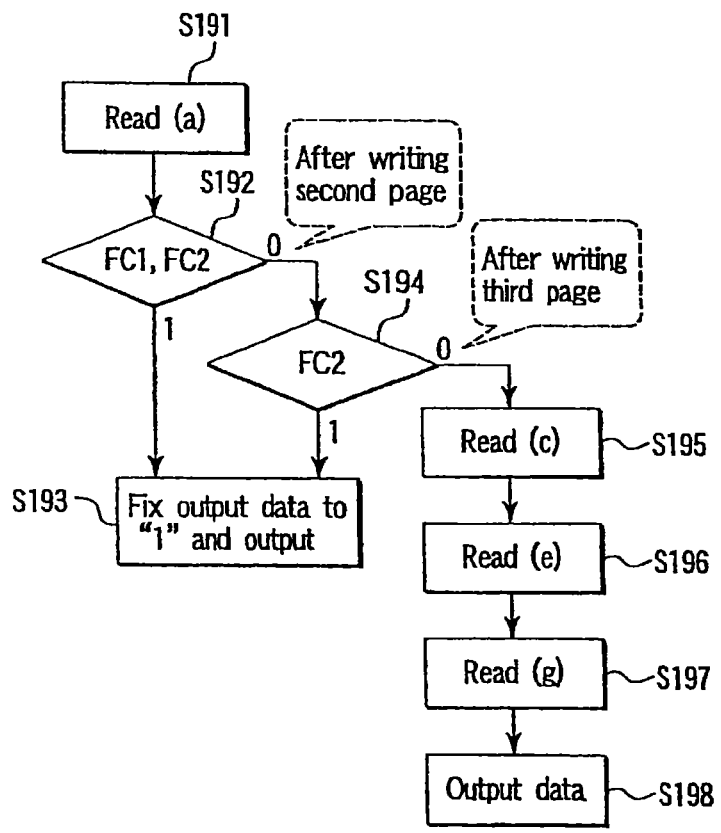
F I G. 42

After data load and internal read

| | Data in memory cell after writing | | | | |
|---|---|---|---|---|---|
| | 0 | 1 | 2 | 3 | |
| SDC | 0 | 1 | 0 | 1 | Data to be written and read inputted from the outside world |
| PDC | 0 | 0 | 1 | 1 | Data read by internal read |

FIG. 43A

After setting data caches

| | Data in memory cell after writing | | | | |
|---|---|---|---|---|---|
| | 0 | 1 | 2 | 3 | |
| SDC | 1 | 1 | 0 | 0 | Used for charging in verifying memory cell data 1 |
| DDC | 0 | 0 | 1 | 0 | Used for charging in verifying memory cell data 2 |
| PDC | 1 | 0 | 0 | 0 | 1: Write unselected, 0: Write |

FIG. 43B

Verify (a*')
Charge bit line on the basis of data in SDC
Discharge. bit line at a potential of WL=a*'

| | Data in memory cell after writing | | | | |
|---|---|---|---|---|---|
| | 0 | 1 | 2 | 3 | |
| SDC | 1 | 1 | 0 | 0 | Used for charging in verifying memory cell data 1 |
| DDC | 0 | 0 | 1 | 0 | Used for charging in verifying memory cell data 2 |
| PDC | 1 | 0 | 0 | 0 | 1: Write unselected, 0: Write |

FIG. 44A

Set Vdd in TDC and transfer the potential of bit line to TDC when BLCLAMP is H
With VREG=H, REG=H, make TDC 1 when dynamic data is 1
Transfer data in PDC to DDC and data in TDC to DDC

| | Data in memory cell after writing | | | | |
|---|---|---|---|---|---|
| | 0 | 1 | 2 | 3 | |
| SDC | 1 | 1 | 0 | 0 | Used for charging in verifying memory cell data 1 |
| DDC | 1 | 0 | 0 | 0 | 1: Write unselected, 0: Write |
| PDC | 0 | 0/1 | 1 | 0 | Used for charging in verifying memory cell data 2 When threshold voltage in memory cell into which data 1 is written exceeds a*' →1 |

FIG. 44B

Discharge bit line at a potential of WL=a'
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

| | Data in memory cell after writing | | | | |
|---|---|---|---|---|---|
| | 0 | 1pass | 1fail | 2 | 3 | |
| SDC | 1 | 1 | 1 | 0 | 0 | Used for charging in verifying memory cell data 1 |
| DDC | 0 | 1 | 0/1 | 1 | 0 | Used for charging in verifying memory cell data 2 When threshold voltage in memory cell into which data 1 is written exceeds a*' → 1 |
| PDC | 1 | 1 | 0 | 0 | 0 | 1: Write unselected, 0: Write |

F I G. 45A

Verify (b')
Charge bit line on the basis of data in DDC
Discharge bit line at a potential of WL=b'
Transfer data in DDC to TDC, PDC to DDC and TDC to PDC during the discharge
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

| | Data in memory cell after writing | | | | |
|---|---|---|---|---|---|
| | 0 | 1 | 2fail | 2pass | 3 | |
| SDC | 1 | 1 | 0 | 0 | 0 | Used for charging in verifying memory cell data 1 |
| DDC | 0 | 0/1 | 1 | 1 | 0 | Used for charging in verifying memory cell data 2 When threshold voltage in memory cell into which data 1 is written exceeds a*' →1 |
| PDC | 1 | 0 | 0 | 1 | 0 | 1:Write unselected, 0:Write |

FIG. 45B

Verify (c)
Charge bit line
Discharge bit line at a potential of WL=c'
Transfer data in DDC to TDC, PDC to DDC and TDC to PDC during the discharge
Set Vdd in TDC and transfer the potential of bit line to TDC when BLCLAMP is H
With VREG=H, REG=H, make TDC 1 when dynamic data is 1
Transfer data in PDC to DDC and data in TDC to DDC

|  | Data in memory cell after writing | | | | |  |
| --- | --- | --- | --- | --- | --- | --- |
|  | 0 | 1 | 2 | 3fail | 3pass |  |
| SDC | 0 | 1 | 0 | 0 | 0 | Used for charging in verifying memory cell data 1 |
| DDC | 0 | 0/1 | 1 | 0 | 0 | Used for charging in verifying memory cell data 2 When threshold voltage in memory cell into which data 1 is written exceeds a*→1 |
| PDC | 1 | 0 | 0 | 0 | 1 | 1: Write unselected, 0: Write |

F I G. 46

Before writing the second page

After writing the second page

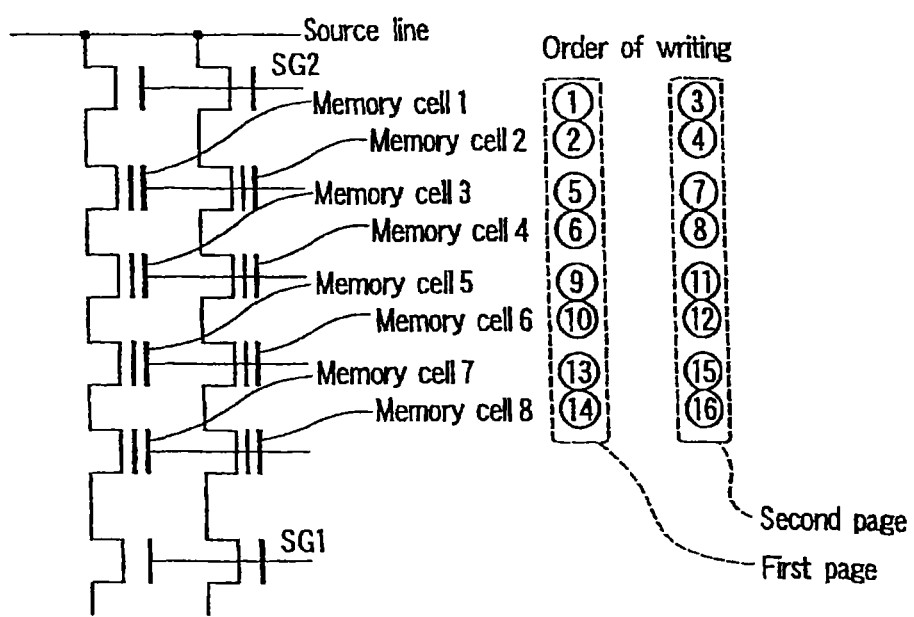
F I G. 49

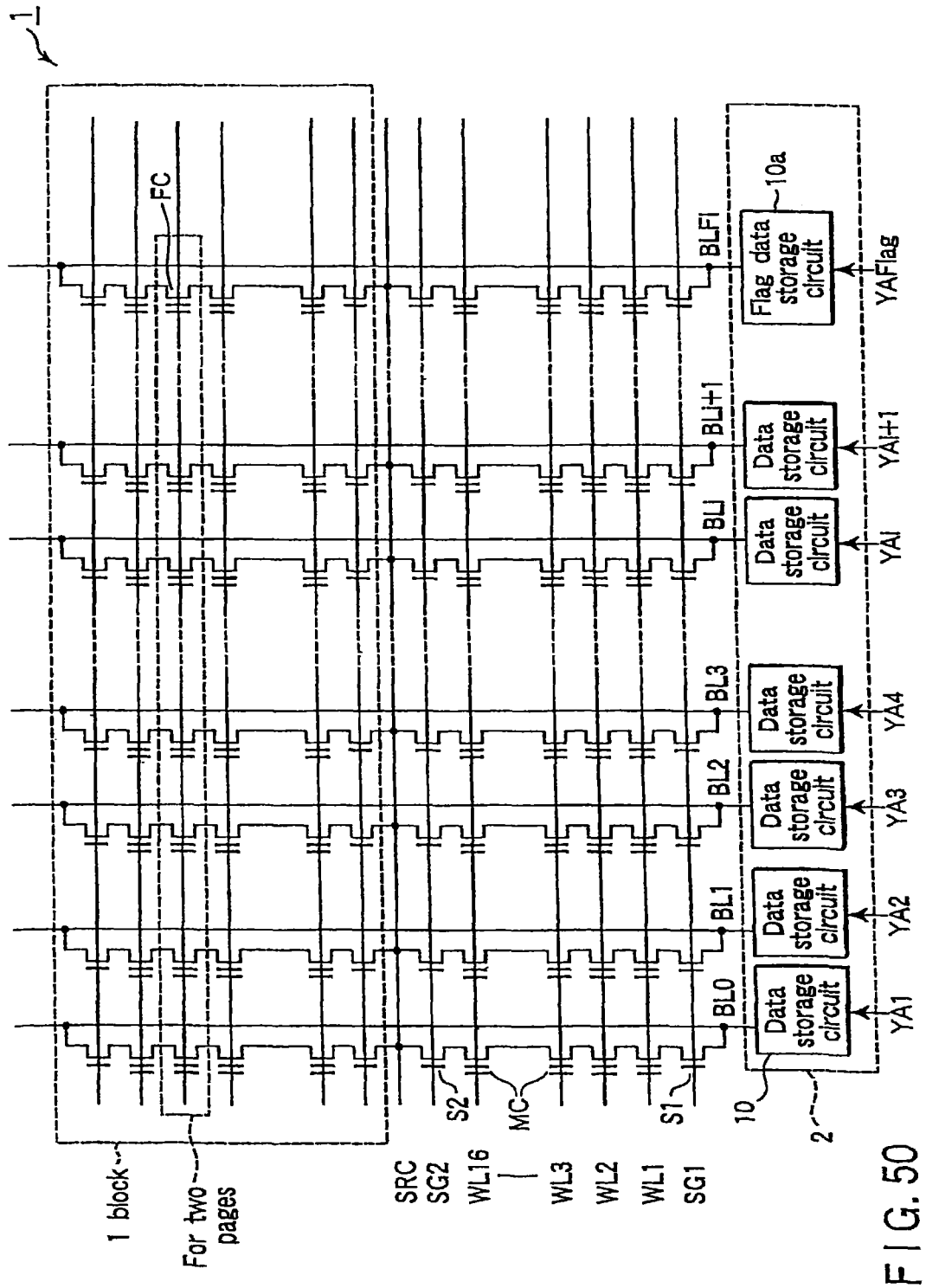
F I G. 50

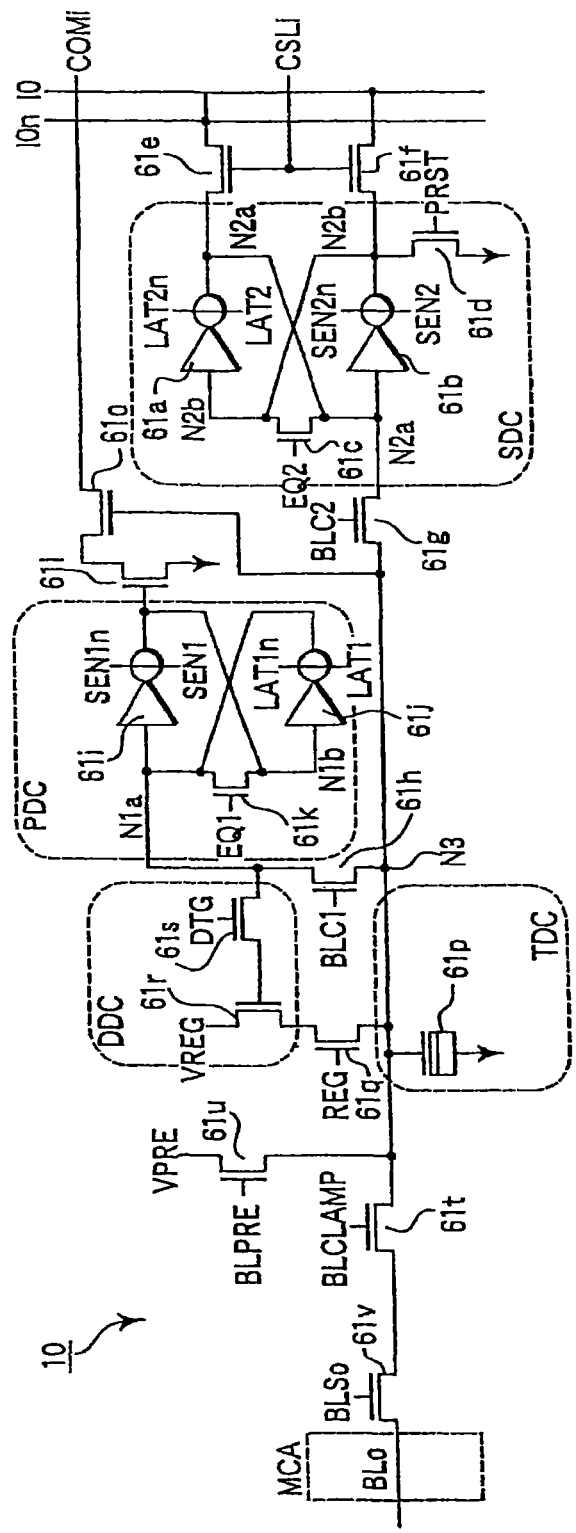
F I G. 51

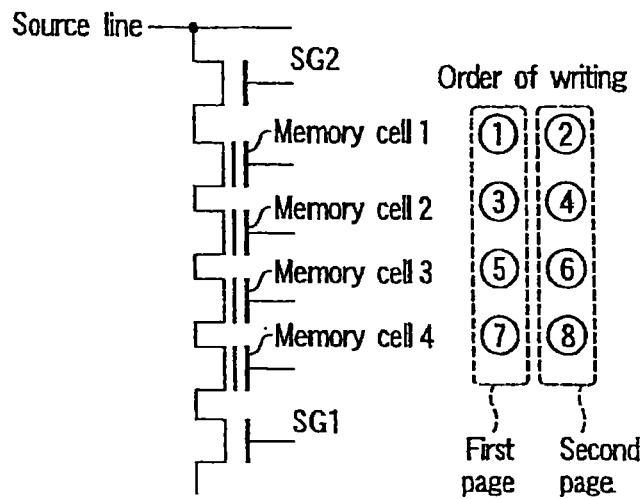
F I G. 52
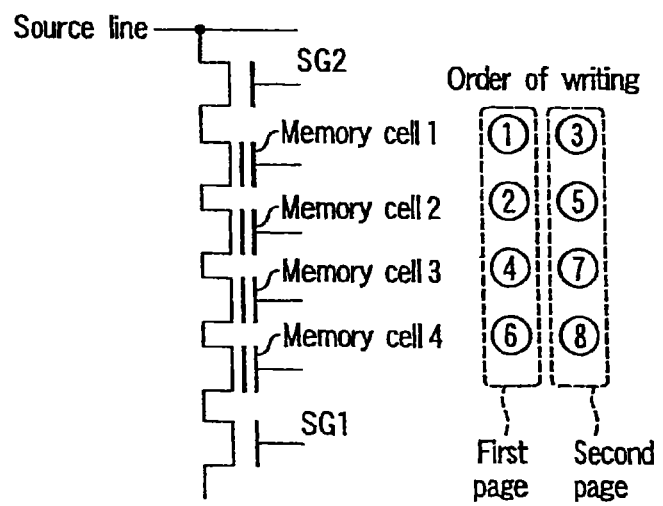
F I G. 53

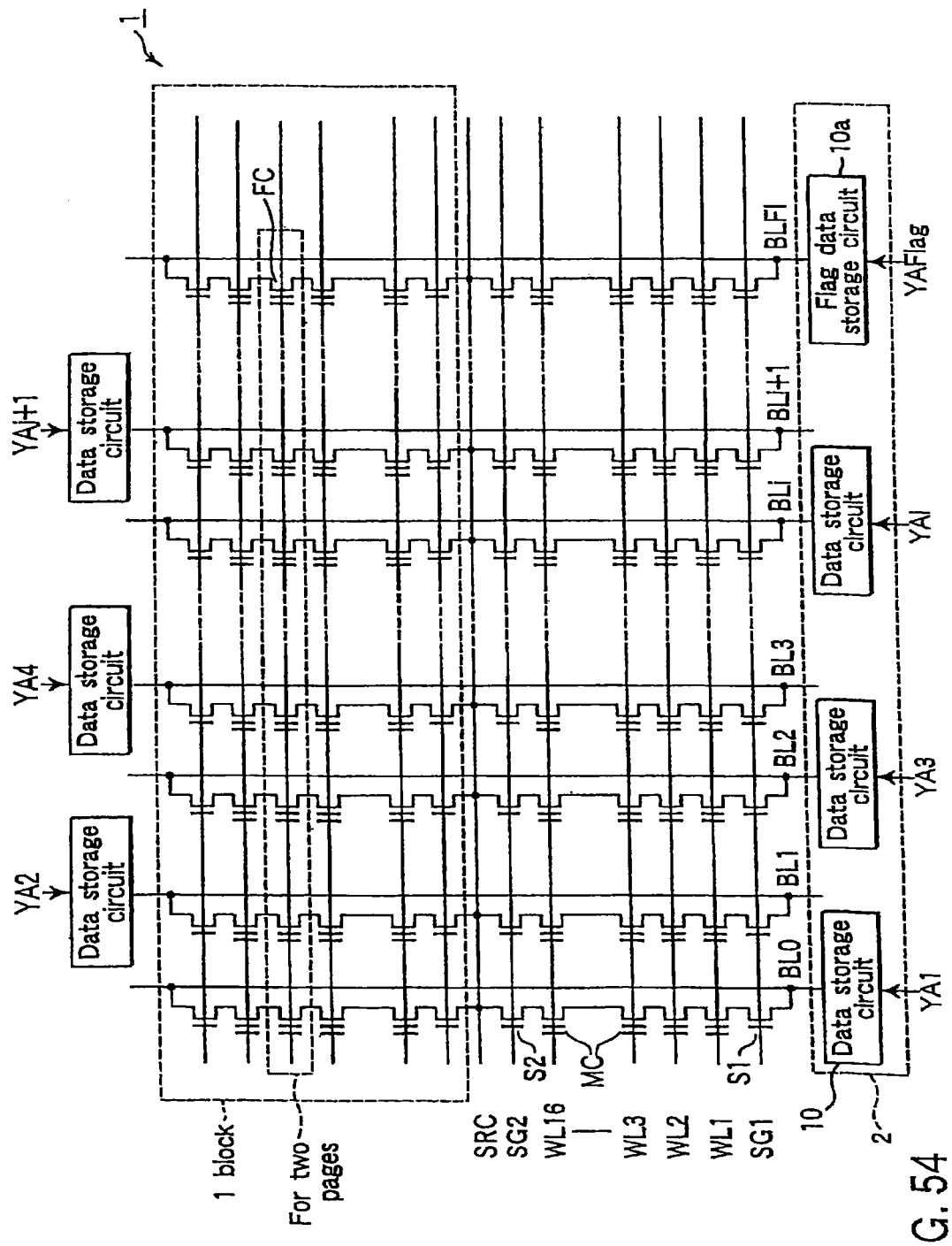
F I G. 54

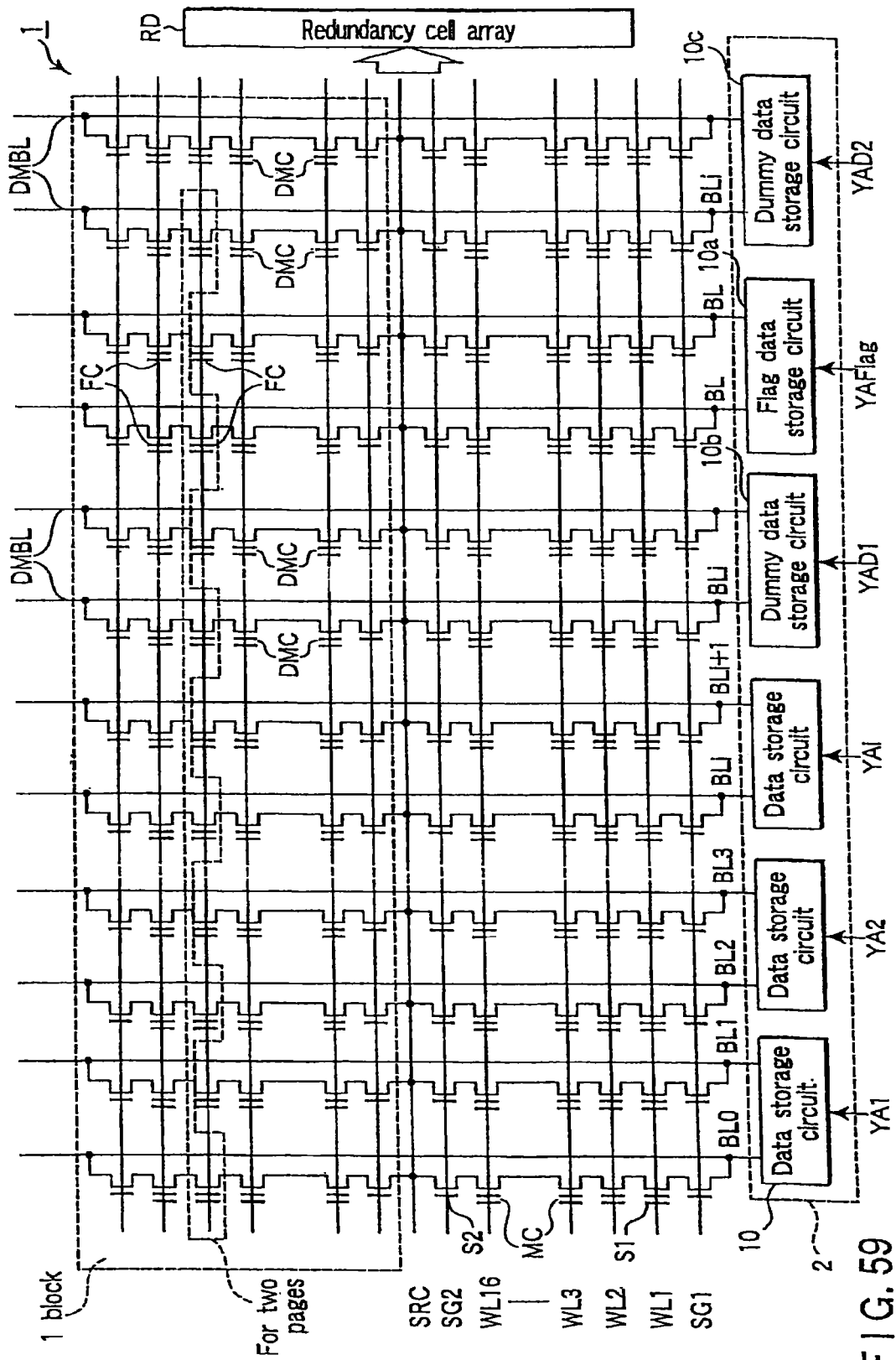
F I G. 59

After writing the second page
Threshold distribution of a memory cell

After writing the second page
Threshold distribution of a flag cell

After writing the second page
Threshold distribution of the first flag cell

After writing the second page
Threshold distribution of the second flag cell

SEMICONDUCTOR MEMORY DEVICE FOR STORING MULTIVALUED DATA

CROSS-REFERENCE TO RELATED APPLICATIONS

The present continuation application claims the benefit of priority under 35 U.S.C. §120 to application Ser. No. 14/266,275, filed on Apr. 30, 2014, which is a continuation of U.S. Ser. No. 14/079,279, filed Nov. 13, 2013, which is a continuation of Ser. No. 13/648,778, filed Oct. 10, 2012, now U.S. Pat. No. 8,619,468, which is a continuation of U.S. Ser. No. 13/158,508, filed Jun. 13, 2011, now U.S. Pat. No. 8,310,871, which is a continuation of U.S. Ser. No. 12/837,595, filed Jul. 16, 2010, now U.S. Pat. No. 7,978,514, which is a continuation of U.S. Ser. No. 12/365,039, filed Feb. 3, 2009, now U.S. Pat. No. 7,782,670, which is a continuation of U.S. Ser. No. 12/189,566, filed Aug. 11, 2008, now U.S. Pat. No. 7,593,260, which is a continuation of U.S. Ser. No. 11/949,649, filed Dec. 3, 2007, now U.S. Pat. No. 7,443,724, which is a continuation of U.S. Ser. No. 11/469,279, filed Aug. 31, 2006, now U.S. Pat. No. 7,315,471, which is a divisional of U.S. Ser. No. 11/325,917, filed Jan. 4, 2006, now U.S. Pat. No. 7,120,052, which is a divisional of U.S. Ser. No. 10/764,828, filed Jan. 26, 2004, now U.S. Pat. No. 7,016,226, which is a continuation-in-part of U.S. Ser. No. 10/689,868, filed Oct. 20, 2003, now U.S. Pat. No. 6,925,004, which is a continuation-in-part of U.S. Ser. No. 10/358,643, filed Feb. 4, 2003, now U.S. Pat. No. 6,657,891, the entire contents of each of which are incorporated herein by reference.

This application is based upon and claims the benefit of priority from the prior Japanese Patent Applications No. 2002-347797, filed Nov. 29, 2002; and No. 2003-402161, filed Dec. 1, 2003, the entire contents of both of which are incorporated herein by reference.

BACKGROUND OF THE INVENTION

1. Field of the Invention

This invention relates to a nonvolatile semiconductor memory device capable of storing, for example, 2 bits or more of data.

2. Description of the Related Art

A nonvolatile semiconductor memory device capable of storing multivalued data, such as a NAND flash memory using EEPROM, has been proposed (U.S. Pat. No. 6,178,115)

In a NAND flash memory where a plurality of cells are arranged in a matrix, all of or half of the cells arranged in the direction of row are selected simultaneously. Data is written into or read from the selected cells in unison. Specifically, the selected cells are connected to corresponding bit lines. A latch circuit for holding the write and read data is connected to each bit line. Data is written or read by using the latch circuit.

This type of nonvolatile semiconductor memory device has been miniaturized so significantly that the spacing between adjacent cells in the row direction and the column direction is very narrow. As the distance between adjacent cells becomes shorter, the capacitance between the floating gates of adjacent cells (FG-FG capacitance) becomes larger. This causes the following problem: the threshold voltage Vth of a cell written into previously varies according to the data in an adjacent cell written into later due to the FG-FG capacitance. In the case of a multivalued memory that stores a plurality of data (k bits) is a single cell, it has a plurality of threshold voltages. Therefore, it is necessary to control the distribution of a threshold voltage per data very narrowly, which causes the following significant problem: the threshold voltage varies according to the data in the adjacent cells. Therefore, a nonvolatile semiconductor memory device capable of preventing the threshold voltage from varying with the data in the adjacent cells has been demanded.

BRIEF SUMMARY OF THE INVENTION

According to a first aspect of the present invention, there is provided a semiconductor memory device comprising: a memory cell array configured by arranging a plurality of memory cells in a matrix, each of which is capable of having at least one of four threshold voltages and storing two bits of data; a plurality of bit lines connected to the plurality of memory cells arranged in the column direction; a plurality of word lines connected to the plurality of memory cells arranged in the row direction; a flag cell which is selected at the same time when the memory cells are selected by each of the word lines; a plurality of data storage circuits which are connected to the plurality of bit lines in a one-to-one correspondence and store data; a write circuit which writes data on a first page into a plurality of first memory cells selected simultaneously by one of the word lines, then writes data on a second page into the plurality of first memory cells and, when the data on the second page is written, writes data into the flag cell simultaneously selected by the word line, and thereafter writes the data on the first and second pages sequentially into a second memory cell adjacent to the first memory cells in the bit line direction.

According to a second aspect of the present invention, there is provided a semiconductor memory device comprising: a memory cell array configured by arranging a plurality of memory cells in a matrix, each of which is capable of having at least one of four threshold voltages and storing two bits of data; a plurality of bit lines connected to the plurality of memory cells arranged in the column direction; a plurality of word lines connected to the plurality of memory cells arranged in the row direction; a plurality of data storage circuits which are connected to the plurality of bit lines in a one-to-one correspondence and store data; a write circuit which writes data on a first page into a first and a second memory cell adjoining in the bit line, then writes data on a second page into the first memory cell, and thereafter writes the data on the first page into a third memory cell adjacent to the second memory cells in the bit line direction.

According to a third aspect of the present invention, there is provided a semiconductor memory device comprising: a memory cell array configured by arranging a plurality of memory cells in a matrix, each of which is capable of having one of an $2^n$ (n is a natural number equal to 2 or more) number of threshold voltages and storing an n number of bits of data; a plurality of bit lines connected to the plurality of memory cells arranged in the column direction; a plurality of word lines connected to the plurality of memory cells arranged in the row direction; a first and a second flag cell which are selected at the same time when the memory cells are selected by the word lines; a write circuit which divides an n number of pages composed of an n number of bits stored in a plurality of memory cells selected by one of the word lines into a first and a second area and, when writing data into the first area on a k-th page ($2<=k<=n$), writes the data into also the first flag cell and, when writing data into the second area on the k-th page, writes the data into also the second flag cell.

According to a fourth aspect of the present invention, there is provided a semiconductor memory device comprising: a memory cell array configured by arranging a plurality of memory cells in a matrix, each of which is capable of having one of an $2^n$ (n is a natural number equal to 2 or more) number of threshold voltages and storing an n number of bits of data; a plurality of bit lines connected to the plurality of memory cells arranged in the column direction; a plurality of word lines connected to the plurality of memory cells arranged in the row direction; an (n−1)×i number of flag cells which are selected at the same time when the memory cells are selected by the word lines; a write circuit which divides an n number of pages composed of an n number of bits stored in a plurality of memory cells selected by one of the word lines into an i number (i is a natural number) of areas and, when writing data into the first area on a k-th page (2<=k<=n), writes the data into also the ((k−2)×i+1)-th flag cell and, when writing data into the i-th area on the k-th page, writes the data into also the (k−1)×i)-th flag cell.

According to a fifth aspect of the present invention, there is provided a semiconductor memory device comprising: a memory cell array configured by arranging a plurality of memory cells in a matrix, each of which is capable of having one of an $2^n$ (n is a natural number equal to 2 or make) number of threshold voltages and storing an n number of bits of data; a plurality of bit lines connected to the plurality of memory cells arranged in the column direction; a plurality of word lines connected to the plurality of memory cells arranged in the row direction; an i number of flag cells which are selected at the same time when the memory cells are selected by the word lines; a write circuit which divides an n number of pages composed of an n number of bits stored in a plurality of memory cells selected by one of the word lines into an i number (i is a natural number) of areas and, when writing-data into the first area on a k-th page (2<=k<=n), writes the data into also the first flag cell and, when writing data into the i-th area on the k-th page, writes the data into also the i-th flag cell.

According to a sixth aspect of the present invention, there is provided a semiconductor memory device comprising: a memory cell array configured by arranging a plurality of memory cells in a matrix, each of which is capable of having one of an $2^n$ (n is a natural number equal to 2 or more) number of threshold voltages and storing an n number of bits of data; a plurality of bit lines connected to the plurality of memory cells arranged in the column direction; a plurality of word lines connected to the plurality of memory cells arranged in the row direction; first and second flag cells which are selected at the same time when the memory cells are selected by the word lines; a write circuit which writes data "k" into the first flag cell and writes data "k−1" into the second flag cell, when writing a k-th page data constituted by n bits into the memory cells selected by the word line.

BRIEF DESCRIPTION OF THE SEVERAL VIEWS OF THE DRAWING

FIG. 3 is a circuit diagram showing the configuration of the memory cell array and bit line control section shown in FIG. 2;

FIG. 6 is a circuit diagram of an example of the data storage circuit shown in FIG. 3;

FIGS. 10A and 10B show the relationship between each data cache and the data in the memory cell;

FIG. 11 is a diagram to help explain the procedure for setting the data caches;

FIG. 12 is a diagram to help explain the procedure for setting the data caches;

FIG. 25 shows the relationship between each data cache and the data in the memory cell in the fifth embodiment;

FIGS. 27A and 27B show the relationship between each data cache and the data in the memory cell in the sixth embodiment;

FIGS. 29A and 29B show the relationship between each data cache and the data in the memory cell in the seventh embodiment;

FIGS. 30A, 30B, and 30C show the relationship between each data cache and the data in the memory cell in the seventh embodiment;

FIGS. 31A and 31B show the relationship between each data cache and the data in the memory cell in the seventh embodiment;

FIGS. 32A and 32B show the relationship between each data cache and the data in the memory cell in the seventh embodiment;

FIGS. 33A and 33B show the relationship between each data cache and the data in the memory cell in the seventh embodiment;

FIGS. 39A and 39B show the relationship between each data cache and the data in the memory cell in the eighth embodiment;

FIGS. 40A and 40B show the relationship between each data cache and the data in the memory cell in the eighth embodiment;

FIG. 42 is a flowchart for the operation of reading a third page in the eighth embodiment;

FIGS. 43A, 43B, 44A, 44B, 45A, 45B and 46 show the relationship between each data cache and the data in the memory cell in the ninth embodiment;

FIG. 49 shows a diagram to help explain the order in which data is written into a NAND cell in the tenth embodiment;

FIG. 50 is a circuit diagram showing the configuration of the memory cell array and bit line control section in the eleventh embodiment;

FIG. 51 is a circuit diagram of the data storage circuit applied to the eleventh embodiment;

FIG. 52 is a diagram to explain the order in which data is written into a NAND cell in the eleventh embodiment;

FIG. 53 is a diagram which shows modification of FIG. 52;

FIG. 54 is a circuit diagram showing the modification of FIG. 50;

FIG. 59 is a circuit diagram showing the modification of the circuit diagram shown in FIG. 3;

DETAILED DESCRIPTION OF THE INVENTION

Hereinafter, referring to the accompanying drawings, embodiments of the present invention will be explained.

The principle of the present invention will be explained. In the present invention, before the next data is stored into a memory cell into which, for example, i bits of data have been stored, i or less bits of data are written into the adjacent memory cells beforehand. In writing the i or less bits of data, the threshold voltage is made lower than the original threshold voltage (or the actual threshold voltage in storing i bits of data). After the adjacent memory cells have been written into, writing is done to raise the threshold voltage of the memory cell. In the cells whose threshold voltage has risen due to the FG-FG capacitance, the threshold voltage does not change much in the writing. In the cells whose threshold voltage has not risen much due to the FG-FG capacitance, the threshold voltage rises in the writing, with the result that the threshold voltage reaches the original value. However, before and after the writing to raise the threshold voltage, it is unknown whether the i bits of data have the original threshold voltage or a lower voltage than that. To differentiate between them, a flag memory cell (or flag cell) is prepared. A read operation is carried out according to the data in the flag cell.

In a NAND flash memory, all of or half of the cells arranged in the row direction are written into simultaneously. Therefore, a flag cell is provided for each unit of writing.

First Embodiment

Figure 2:
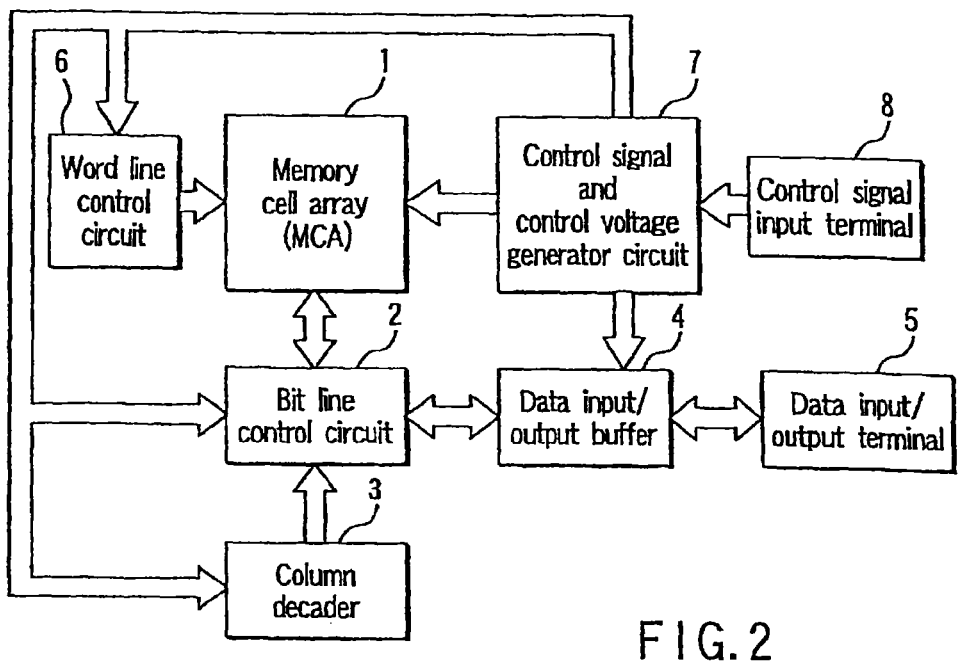
FIG. 2 shows a schematic configuration of a nonvolatile semiconductor memory device according to the present invention.

FIG. 2 shows a schematic configuration of a nonvolatile semiconductor memory device, such as a NAND flash memory for storing four values (or two bits), according to the present invention.

A memory cell array 1 includes a plurality of bit lines, a plurality of word lines, and a common source line. In the memory cell array 1, memory cells composed of, for example, EEPROM cells capable of electrically rewriting data are arranged in a matrix. A bit control circuit 2 for controlling the bit lines and a word line control circuit 6 are connected to the memory cell array 1.

The bit line control circuit 2 includes a plurality of data storage circuits and a flag data storage circuit as explained later. The bit line control circuit 2 reads the data from a memory cell in the memory cell array 1 via a bit line, senses the state of a memory cell in the memory cell array 1 via a bit line, or writes data into a memory cell in the memory cell array 1 by applying a write control voltage to the memory cell via a bit line. A column decoder 3 and a data input/output buffer 4 are connected to the bit line control circuit 2. A data storage circuit in the bit line control circuit 2 is selected by the column decoder 3. The data in the memory cell read into a data storage circuit is outputted from a data input/output terminal 5 to the outside world via the data input/output buffer 4.

The write data externally inputted to the data input/output terminal 5 is inputted via the data input/output buffer 4 to the data storage circuit selected by the column decoder 3.

The word line control circuit 6 is connected to the memory cell array 1. The word line control circuit 6 selects a word line in the memory cell array 1 and applies the necessary voltage for reading, writing, or erasing to the selected word line.

The memory cell array 1, bit line control circuit 2, column decoder 3, data input/output buffer 4, and word line control circuit 6, which are connected to a control signal and control voltage generator circuit 7, are controlled by the control signal and control voltage generator circuit 7. The control signal and control voltage generator circuit 7, which is connected to a control signal input terminal 8, is controlled by a control signal externally inputted via the control signal input terminal 8.

The bit line control circuit 2, column decoder 3, word line control circuit 6, and control signal and control voltage generator circuit 7 constitute a write circuit and a read circuit.

FIG. 3 shows the configuration of the memory cell array 1 and the bit line control circuit 2 shown in FIG. 2. In the memory cell array 1, a plurality of NAND cells is provided. A NAND is composed of a memory cell made up of, for example, 16 EEPROMs connected in series, and select gates S1, S2. The first select gate S1 is connected to bit line BL0 and the second select gate S2 is connected to source line SRC. The control gates of the memory cells arranged in each row are connected in common to word lines WL2, WL2, WL3, . . . , WL16. The first select gate S1 is connected in common to select line SG1 and the second select gate S2 is connected in common to select line SG2.

The memory cell array 1 includes a plurality of blocks as shown by a broken line. Each block is composed of a plurality of NAND cells. Data is erased in blocks. An erase operation is carried out simultaneously on two bit lines connected to a data storage circuit 10 and a flag data storage circuit 10a.

The bit line control circuit 2 has a plurality of data storage circuits 10 and a flag data storage circuit 10a. Pairs of bit lines (BL0, BL1), (BL2, BL3), . . . , (BLi, Bli+1), (BL, BL) are connected to the individual data storage circuits 10 and flag data storage circuit 10a in a one-to-one correspondence.

A plurality of memory cells (the memory cells enclosed by a broken line) provided for every other bit line and connected to a word line constitutes one sector. Data is written and read in sectors. In one sector, for example, two pages of data are stored. A flag cell FC for storing a flag is connected to each word line. That is, in the first embodiment, one sector includes one flag cell FC.

The number of flag cells FC is not limited to one for one sector. As shown by the broken line, a plurality of flag cells may be connected to one sector. In this case, as explained later, the data stored in the flag cells has only to be determined by a majority decision.

In a read operation, a program verity operation, and a program operation, of the two bit lines (BLi, BLi+1) connected to the data storage circuit 10, one bit line is selected according to the address signal (YA, YA2, . . . , YAi, YAFlag) externally specified. In addition, according to an external address, one word line is selected and one sector (for two pages) is selected. The switching between two pages is done according to an address.

Figure 4A:
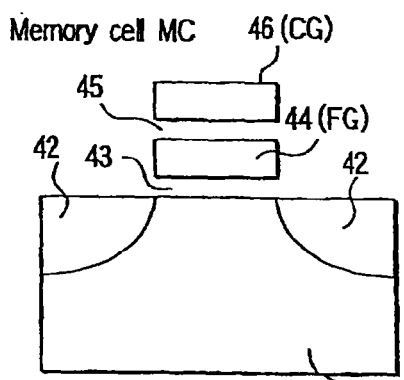
FIGS. 4A and 4B are sectional views of a memory cell and a select transistor, respectively.
Figure 4B:
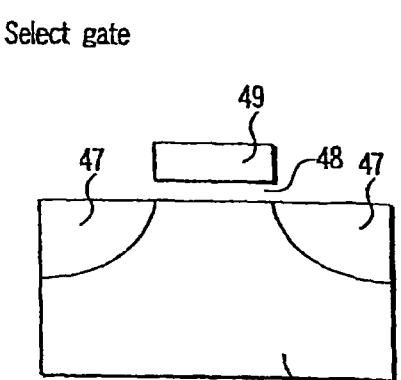

FIGS. 4A and 4B are sectional views of a memory cell and a select transistor. FIG. 4A shows a memory cell. In a substrate 41, n-type diffused layers 42 serving as the source and drain of a memory cell are formed. Above the substrate 41, a floating gate (FG) 44 is formed via a gate insulating film 43. Above the floating gate 44, a control gate (CG) 46 is formed via an insulating film 45. FIG. 4B shows a select gate. In a substrate 41, n-type diffused layers 47 acting as the source and drain are formed. Above the substrate 41, a control gate 49 is formed via a gate insulating film 48.

Figure 5:
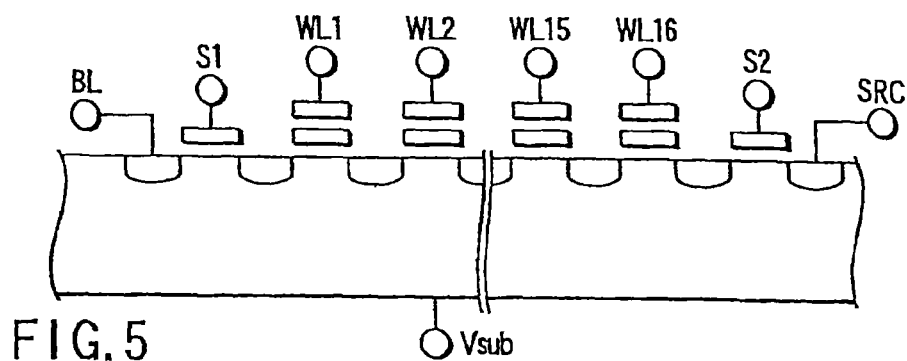
FIG. 5 is a sectional view of a NAND cell in the memory cell array.

FIG. 5 is a sectional view of a NAND cell in the memory cell array. In this example, a NAND cell is composed of 16 memory cells MC with the configuration of FIG. 4A connected in series. On the drain side and source side of the NAND cell, a first select gate S1 and a second select gate S2 with the configuration of FIG. 4B are provided.

FIG. 6 is a circuit diagram of the data storage circuit 10 shown in FIG. 3. The flag data storage circuit 10a has the same configuration as that of the data storage circuit 10.

The data storage circuit 10 includes a primary data cache (PDC), a secondary data cache (SDC), a dynamic data cache (DDC), and a temporary data cache (TDC). The SDC, PDC, DDC hold the input data in a write operation, the read data in a read operation, or the data temporarily in a verify operation, and are used to manipulate the internal data in storing multi-valued data. The TDC amplifies the data on the bit line and holds the data temporarily when reading the data and is used to manipulate the internal data when storing the manipulated data.

The SDC is composed of clocked inverter circuits $61a$, $61b$ constituting a latch circuit and transistors $61c$, $61d$. The transistor $61c$ is inserted between the input terminal of the clocked inverter circuit $61a$ and the input terminal of the clocked inverter circuit $61b$. Signal EQ2 is supplied to the gate of the transistor $61c$. The transistor $61d$ is connected between the output terminal of the clocked inverter circuit $61b$ and the ground. Signal PRST is supplied to the gate of the transistor $61d$. Node N2a of the SDC is connected to an input/output data line IOn via a column select transistor $61e$. Node N2b is connected to an input/output data line IO via a column select transistor $61f$. Column select signal CSLi is supplied to the gates of the transistors $61e$, $61f$. Node N2a of the SDC is connected to Node N1a of the PDC via transistors $61g$, $61h$. Signal BLC2 is supplied to the gate of the transistor $61g$ and signal BLC1 is supplied to the gate of the transistor $61h$.

The PDC is composed of clocked inverter circuits $61i$, $61j$ and a transistor $61k$. The transistor $61k$ is connected between the input terminal of the clocked inverter circuit $61i$ and the input terminal of the clocked inverter circuit $61j$. Signal EQ1 is supplied to the gate of the transistor $61k$. Node N1b of the PDC is connected to the gate of a transistor $61l$. One end of the current path of the transistor $61l$ is connected to the ground via a transistor $61m$. Signal CHK1 is supplied to the gate of the transistor $61m$. The other end of the current path of the transistor $61l$ is connected to one end of the current path of transistors $61n$, $61o$ constituting a transfer gate. Signal CHK2n is supplied to the gate of the transistor $61n$. The gate of the transistor $61o$ is connected to the junction node of the transistors $61g$ and $61h$. Signal COMi is supplied to the other end of the current path of the transistors $61n$, $61o$. The signal COMi, which is a signal common to all of the data storage circuits 10, indicates whether all of the data storage circuits 10 have been verified. That is, as described later, after they have been verified, node N1b of the PDC goes low. In this state, when signal CHK1 and signal CHK2 are made high, signal COMi goes high, if all of the data storage circuits 10 have been verified.

The TDC is composed of, for example, a MOS capacitor $61p$. The capacitor $61p$ is connected between junction node N3 of the transistors $61g$, $61h$ and the ground. The DDC is connected via a transistor $61q$ to junction node N3. Signal REG is supplied to the gate of the transistor $61q$.

The DDC is composed of transistors $61r$, $61s$. Signal VREG is supplied to one end of the current path of the transistor $61r$. The other end of the current path of the transistor $61r$ is connected to the current path of the transistor $61g$. The gate of the transistor $61r$ is connected via a transistor $61s$ to node N1a of the PDC. Signal DTG is supplied to the gate of the transistor $61s$.

One end of the current path of transistors 61t, 61u is connected to the junction node N3. Signal VPRE is supplied to the other end of the current path of the transistor 61u. Signal BLPRE is supplied to the gate of the transistor 61u. Signal BLCLAMP is supplied to the gate of the transistor 61t. The other end of the current path of the transistor 61t is connected via a transistor 61v to one end of a bit line BLo and also connected via a transistor 61w to one end of a bit line BLe. The other end of the bit line BLo is connected to one end of the current path of a transistor 61x. Signal BIASo is supplied to the gate of the transistor 61x. The other end of the bit line BLe is connected to one end of the current path of a transistor 61x. Signal Blase is supplied to the gate of the transistor 61y. Signal BLCRL is supplied to the other end of the current path of the transistors 61x, 61y. The transistors 61x, 61y, which are turned on complementarily with transistors 61v, 61w according to signals BIASo, BIASe, supply the potential of the signal BLCRL to the unselected bit lines.

The above signals and voltages are generated by the control signal end control voltage generator circuit 7 shown in FIG. 2. The following operations are controlled by the control signal and control voltage generator circuit 7.

The memory, which is a multivalued memory, is capable of storing 2 bits of data in a cell. The switching between the 2 bits is effected by an address (a first page, second page).

(Explanation of Operation)

The operation in the above configuration will be explained.

Figure 1A:
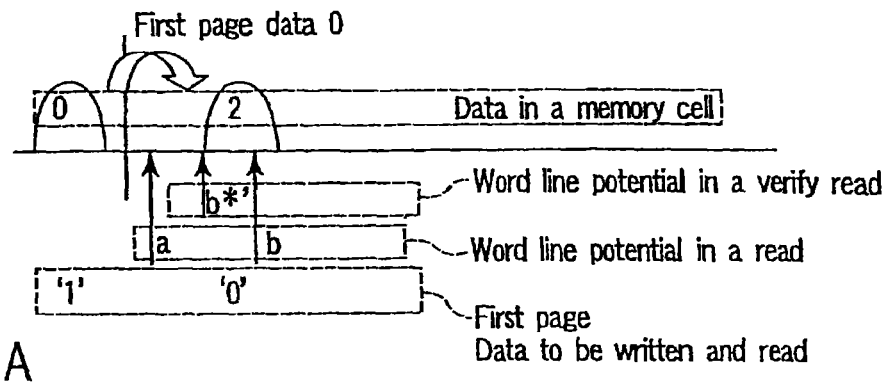
FIGS. 1A, 1B, and 1C show the relationship between the data in a memory cell according to a first embodiment of the present invention and the threshold voltages of the memory cell.
Figure 1B:
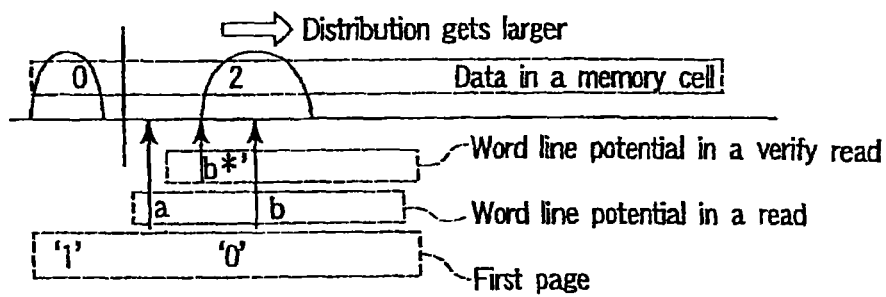
Figure 1C:
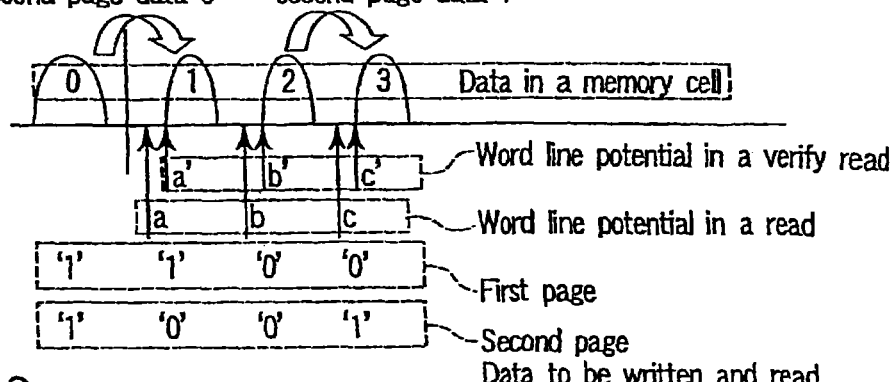

FIG. 1 shows the relationship between the data in a memory cell and the threshold voltages of the memory cell. After an erase operation is carried out, the data in a memory cell becomes "0". As shown in FIG. 1A, after a first page is written into, the data in the memory cell become data "0" and data "2". As shown in FIG. 1B, before a second page is written into, data equal to or lower than the threshold of the actual data is written into the adjacent cells. Then, the data written into the cells makes the distribution of the threshold voltage of data "2" larger. Thereafter, when data has been written into the second page, the data in the memory cell become data "0" to "3" with the original threshold voltage as shown in FIG. 1C. The data in the memory cell are defined in ascending order of threshold voltage.

Figure 7:
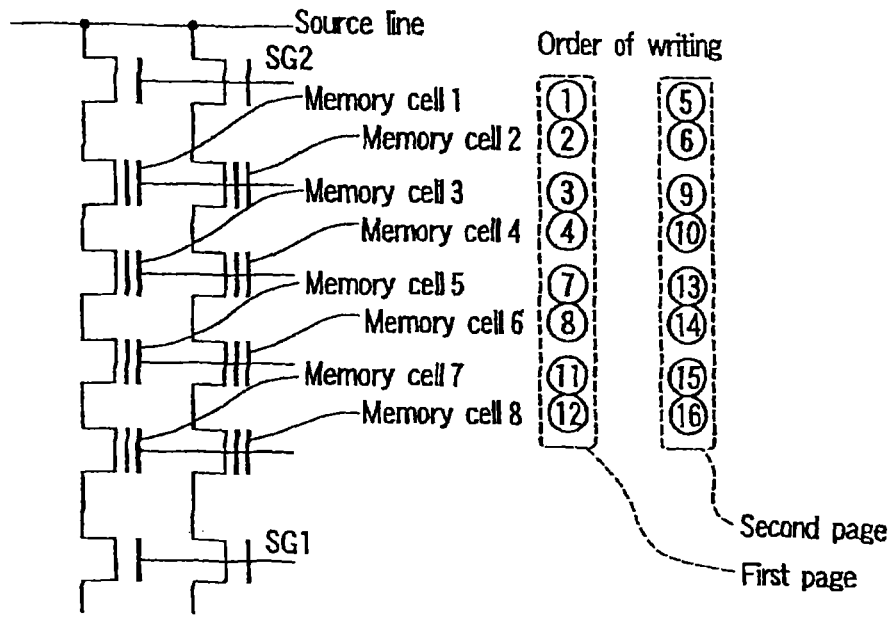
FIG. 7 is a diagram to help explain the order in which data is written into a NAND cell.

FIG. 7 shows the order in which NAND cells are written into. In a block, a write operation is carried out in pages, starting with the memory cell closest to the source line. In FIG. 7, for the sake of explanation, the number of word lines is assumed to be four.

In a first write operation, one bit of data is written into a first page of memory cell 1.

In a second write operation, one bit of data is written into the first page of memory cell 2 adjacent to memory cell 1 in the direction of word.

In a third write operation, one bit of data is written into the first page of memory cell 3 adjacent to memory cell 1 in the direction of bit.

In a fourth write operation, one bit of data is written into the first page of memory cell 4 adjacent to memory cell 1 in a diagonal direction.

In a fifth write operation, one bit of data is written into a second page of memory cell 1.

In a sixth write operation, one bit of data is written into the second page of memory cell 2 adjacent to memory cell 1 in the direction of word.

In a seventh write operation, one bit of data is written into the first page of memory cell 5 adjacent to memory cell 3 in the direction of bit.

In an eighth write operation, one bit of data is written into the first page of memory cell 6 adjacent to memory cell 3 in a diagonal direction.

In a ninth write operation, one bit of data is written into the second page of memory cell 3.

In a tenth write operation, one bit of data is written into the second page of memory cell 4 adjacent to memory cell 3 in the direction of word.

In an eleventh write operation, one bit of data is written into the first page of memory cell 7 adjacent to memory cell 5 in the direction of bit.

In a twelfth write operation, one bit of data is written into the first page of memory cell B adjacent to memory cell 5 in a diagonal direction.

In a thirteenth write operation, one bit of data is written into the second page of memory cell 5.

In a fourteenth write operation, one bit of data is written into the second page of memory cell 6 adjacent to memory cell 5 in the direction of word.

In a fifteenth write operation, one bit of data is written into the second page of memory cell 7.

In a sixteenth write operation, one bit of data is written into the second page of memory cell 8 adjacent to memory cell 7 in the direction of word.

(Program and Program Verify)
(First Page Program)

Figure 8:
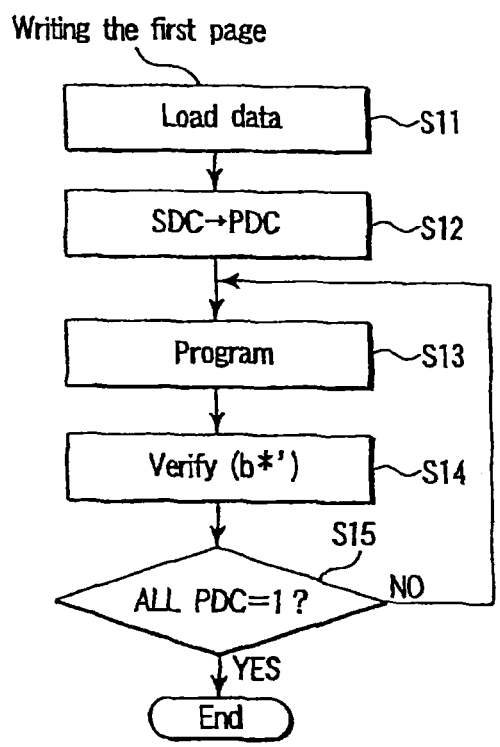
FIG. 8 is a flowchart for the operation of programming a first page.

FIG. 8 shows a flowchart for programming the first page. In a program operation, an address is first specified to select two pages (one sector) shown in FIG. 3. In the memory, of the two pages, a program operation can be carried out only in this order: the first page, the second page. Therefore, the first page is first selected by an address.

Next, the inputted write data is stored in the SDC (shown in FIG. 6) in each of the data storage circuits 10 (ST1). After a write command is inputted, the data in the SDCs in all of the data storage circuits 10 are transferred to the PDC (ST2). That is, signals BLC1, BLC2 are set to a specific voltage, for example, Vdd+Vth (Vdd: power supply voltage (e.g., 3V or 1.8V, to which they are not restricted, Vth: the threshold voltage of an n-channel MOS transistor), thereby turning on the transistors 61h, 61g. Then, the data on node N2a is transferred via the transistors 61g, 61h to the PDC. Therefore, when data "1" (to do no-writing) is inputted from the outside world, node N1a of the PDC goes high. When data "0" (to do writing) is inputted, node N1a of the PDC goes low. Hereinafter, let the data in the PDC be the potential of node N1a and the data in the SDC be the potential of node N2a.

In programming the first page, no data is written into the flag cell. As a result, the PDC in the flag data storage circuit 10a has data "1" (program operation) (ST13).

The potentials of signal BLC1, signal BLCLAMP, and signal BLSo or BLSe shown in FIG. 6 are set to Vd+Vth. Then, the transistors 61h, 61t, and 61v or 61w turn on, causing the data held in the PDC to be supplied to the bit line. When data "1" (to do no writing) has been stored in the PDC, the bit line is at Vdd. When data "0" (to do writing), the bit line is at Vss (the ground potential). The cells in the unselected page (with its bit line unselected) connected to the selected word line must not be written into. For this reason, Vdd is also supplied to the bit lines connected to these cells as when data "1" has been stored. Here, Vdd is applied to the select line SG1 of the selected block, potential VPGM (20V) is applied to the selected word line, and potential VPASS (10V) is applied to the unselected word lines. Then, when the bit line is at Vss, writing is effected because the channel of the cell is at Vss and the word line is at VPGM. On the other hand, when the bit line is at Vdd, the channel of the cell is not at Vss.

Raising the VPGM causes VPGM/2 to be produced by coupling. This prevents the cell from being programmed.

When data "0" is written, the data in the memory cell is made "2" as shown in FIG. 1. When data "1" is written, the data in the memory cell is kept at "0" (first page verify) (S14).

In a program verify operation, a potential a little higher than the potential in a read operation is applied to the selected word line. Hereinafter, a potential marked with "'" is assumed to indicate a verify potential a little higher than the read potential.

In the first page verify operation, verifying is done by applying a potential of "b*'" lower than the potential "b'" of the word line (shown in FIG. 1C) in an actual verify operation as shown in FIG. 1A. Hereinafter, "*" indicates a potential lower than the actual value and "*'" indicates a verify potential lower than the verify potential lower than the actual value.

First, a read potential Vread is applied to the unselected word lines and select line SG1 in the selected block. For example, Vdd+Vth is supplied as signal BLPRE to the data storage circuit 10, a specific voltage, for example, 1V+Vth, is supplied as BLCLAMP, and signal VPRE is set to Vdd. Under these condition, the bit line is precharged at 1V.

Next, select line SG2 on the source side of the cell is made high. The cells whose threshold voltage is higher than the potential "b*'" turn off. As a result, the bit line remains high. The cells whose threshold voltage is lower than the potential "b*'" turn on. As a result, the bit line is at Vss. While the bit line is being discharged, the TDC is set to VSS, with VPRE equal to VSS and BLPRE at the high level. Thereafter, signal REG is set to Vdd+Vth and VREG is set to Vdd, thereby turning on the transistor 61q, which causes the data in the DDC to the TDC.

Next, signal DTG is sat to Vdd+Vth, thereby turning on the transistor 61s temporarily, which causes the data in the PDC to the DDC. That is, the transferred data is held as the gate potential of the transistor 61r.

Thereafter, signal BLC1 is set to, for example, Vdd+Vth, thereby turning on the transistor 61h, which causes the data in the TDC to the PDC.

Next, signal BLPRE is set to a specific voltage, for example, Vdd+Vth, thereby meeting the equation VPRE=Vdd, which precharges node N3 of the TDC at Vdd. Thereafter, signal BLCLAMP is set to, for example, 0.9V+Vth, thereby turning on the transistor 61t. When the bit line is at the low level, node N3 of the TDC is at the low level. When the bit line is at the high level, node N3 of the TDC is at the high level.

Here, when writing is done, the low level is stored in the DDC of FIG. 6. When no writing is done, the high level is stored in the DDC. Therefore, with signal VREG at Vdd and signal REG at the high level, node N3 of the TDC is forced to be high only when no writing is done. After this operation, the data in the PDC is moved to the DDC and the potential of the TDC is transferred to the PDC. The high level signal is latched in the PDC only when the cell is not written into and when data "2" has been written into the cell and the threshold voltage of the cell has reached the verify potential "b*'". The low level signal is latched in the PDC only when the threshold voltage of the cell has not reached "b*'".

When the PDC is at the low level, the write operation is carried out again and the program operation and verify operation are repeated until the data in all of the data storage circuits 10 have become high (S15 to S13). The above operations are identical with those in the case of two-valued data.

(Adjacent Cell Program)

As shown in FIG. 7, after one bit of data has been written into the first page of memory cell 1, the first page of memory cell 2 adjacent to memory cell 1 in the direction of word is written into, the first page of memory cell 3 adjacent to memory cell 1 in the direction of bit is written into, and the first page of memory cell 4 adjacent to memory cell 1 in a diagonal direction is written into in that order. After these write operations have been carried out, the threshold voltage of memory cell 1 may rise due to the FG-FG capacitance, depending on the written data. As a result, the distribution of the threshold voltages of data "0" and data "2" in memory cell 1 expands toward higher potentials as shown in FIG. 1B.

Thereafter, in the fifth write operation, one bit of data is written into the second page of memory cell 1.

(Second Page Program)

Figure 9:
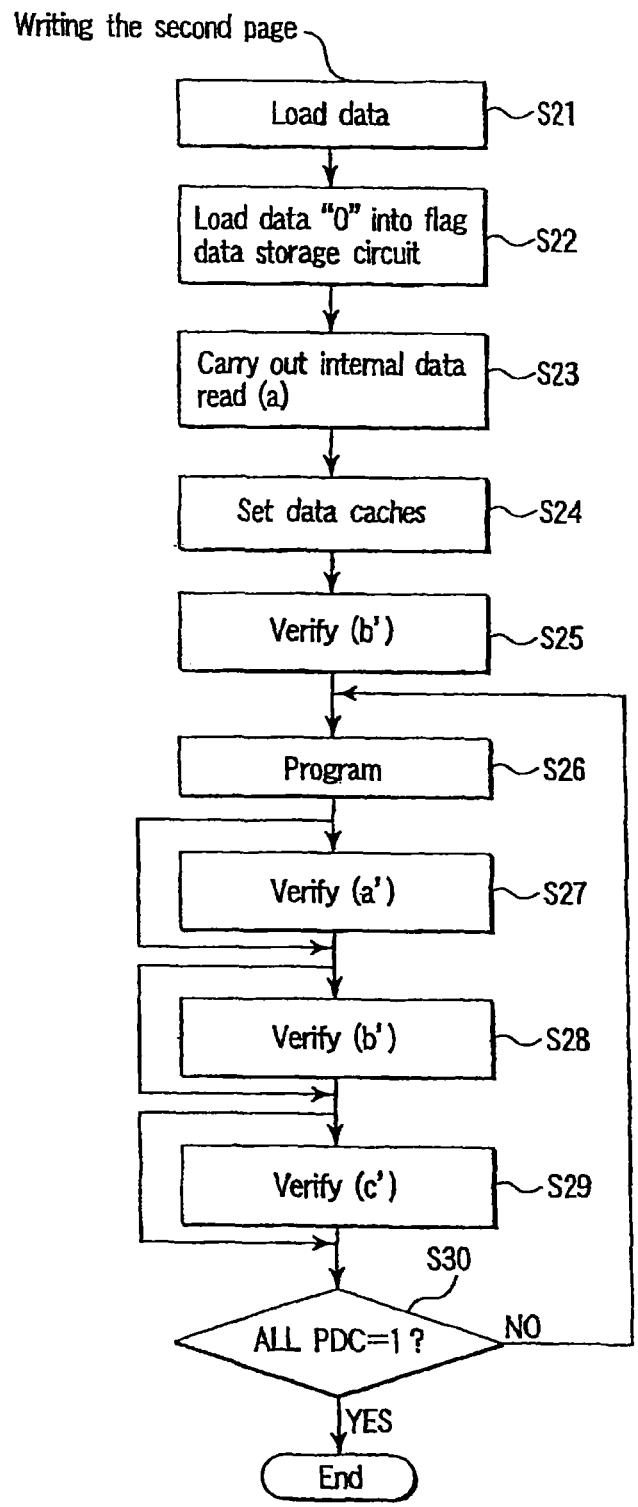
FIG. 9 is a flowchart for the operation of programming a second page.

FIG. 9 is a flowchart for the operation of programming (or writing data into) the second page. In the second page programming operation, too, two pages shown in FIG. 3 are selected.

Next, the inputted write data is stored in the SDC in each of all the data storage circuits (S21). When data "1" (to do no-writing) is inputted, node N2a of the SDC of the data storage circuit 10 goes high. When data "0" (to do writing) is inputted, node N2a of the SDC goes low.

Thereafter, when a write command is inputted, data "0" is inputted to the SDC in the flag cell data storage circuit 10a to write data into the flag cell, because the second page is to be programmed (S22). As described earlier, more than one flag cell may be provided to increase the reliability. In this case, data "0" is inputted to the flag cells of the second page.

In programming the second page, when the data in the memory cell is "0" and the input data is "1", the data in the memory cell is kept at "0". When the Input data is "0", the data in the memory cell is kept at "1".

When the data in the memory cell is "2" and the input data is "0", the detain the memory cell is kept at "2". However, after the first page is written into, the verify potential "b*'" lower than the usual value is used in verifying whether the data in the memory cell has reached "2". Therefore, the memory cell is written into until the original verify potential "b'" has been reached.

When the data in the memory cell is "2" and the input data is "1", the data in the memory cell is set to "3".

(Internal Data Read)

First, before the cell is written into, an internal read operation is carried out to determine whether the data in the memory cell of the first page is "0" or "2" (S23). An internal data read operation is identical with a read operation. In determining whether the data in an ordinary memory cell is "0" or "2", a read potential of "b" is applied to the selected word line. Since the verify potential is written only to "b*'" lower than the ordinary level in the first page programming operation, it may be lower than the potential "b". Therefore, in the internal data read, a read operation is carried out by supplying a potential of "a" to the word line.

Specifically, a potential Vread is applied to the unselected word lines and select line SG1 in the selected block. At the same time, signal VPRE is set to Vdd and signals BLPRE and signal BLCLAMP are set to a specific voltage, for example, 1V+Vth. Under these conditions, the bit line is precharged at Vdd. Thereafter, select line SG2 on the source side of the cell is made high. Since the cells whose threshold voltage is higher than the potential "a" turn off, the bit line remains high. In addition, since the cells whose threshold voltage is lower than the potential "a" turn on, the bit line is discharged and has the ground potential Vss.

Next, signal VPRE of the data storage circuit 10 is set to Vdd and signal BLPRE is set to Vdd+Vth, thereby precharging node N3 of the TDC at Vdd. Thereafter, signal BLCLAMP is set to, for example, 0.9V+Vth. When the bit line is at the low level, node N3 of the TDC is at the low level. When the bit line is at the high level, node N3 of the TDC is at the high level. Thereafter, the potential of the TDC is transferred to the PDC. As a result, when the data in the memory cell is "2", or when a high level signal is latched in the PDC and the data in the memory cell is "0", a low level signal is latched in the PDC. FIG. 10A shows the relationship between the data in the memory cells in the SDC and PDC after a data load operation and an internal read operation.

(Setting Data Caches) (S24)

Figure 12:
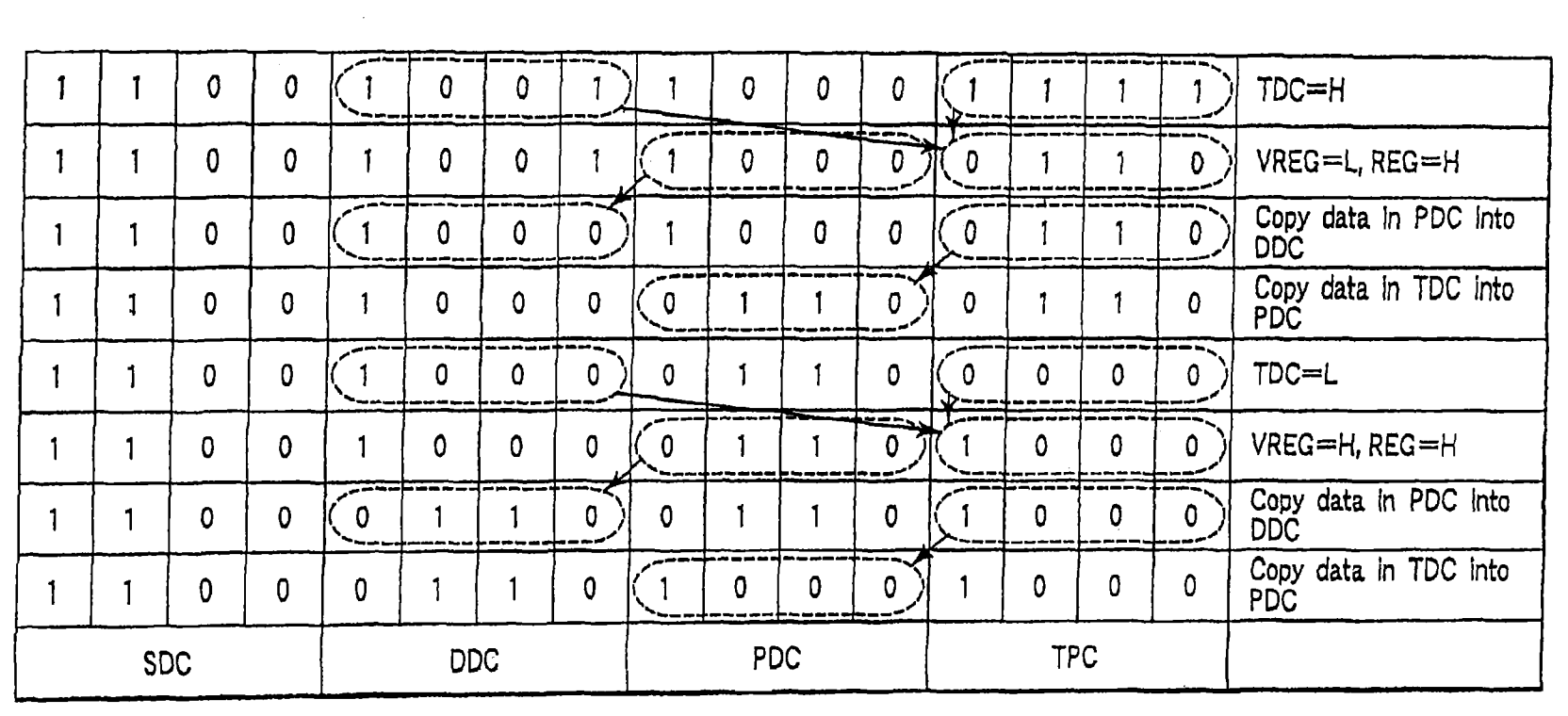

Thereafter, the data stored in each data cache is manipulated according to the procedure for data cache setting shown in FIGS. 11 and 12.

As a result of such manipulation, the data stored in each data cache is as shown in FIG. 10B.

Specifically, when the data in the memory cell is made "0" (data "1" in the first page and data "1" in the second page), the PDC is set to the high level, the DDC is set to the low level, and the SDC is set to the high level.

When the data in the memory cell is made "1" (data "1" in the first page and data "0" in the second page), the PDC is set to the low level, the DDC is set to the high level, and the SDC is set to the high level.

When the data in the memory cell is made "2" (data "0" in the first page and data "0" in the second page), the PDC is set to the low level, the DDC is set to the high level, and the SDC is set to the low level.

When the data in the memory cell is made "3" (data "0" in the first page and data "1" in the second page), the PDC is set to the low level, the DDC is set to the low level, and the SDC is set to the low level.

(Second Page Verify: Verifies Memory Cell Data "2") (S25)

A cell into which data "2" is to be written is written into with the verify potential "b*'" lower than the original verify potential "b'" of the first page. Thereafter, the threshold voltage may have risen as a result of the adjacent cells being written into and therefore some cells may have reached the original verify potential "b'". For this reason, data "2" is first verified. In the program verify operation, the potential "b'" a little higher than the read potential "b" is applied to the selected word line.

First, a potential Vread is applied to the unselected word lines and select line SG1 in the selected block. Then, signal BLCLAMP of the data storage circuit 10 of FIG. 6 is set to 1V+Vth and signal REG is set to Vdd+Vth. Under these conditions, the bit line is precharged. When date "0" and data "3" are written into the memory cell, the DDC has been set to the low level as shown in FIG. 10B. As a result, the bit line is prevented from being precharged. When date "1" and data "2" are written into the memory cell, the DDC has been set to the high level. As a result, the bit line is precharged.

Next, select line SG2 on the source side of the NAND cell is made high. The cells whose threshold voltage is higher than the potential "b'" turn off. As a result, the bit line remains high. The cells whose threshold voltage is lower than the potential "b'" turn on. As a result, the bit line is at Vss. While the bit line is being discharged, node N3 of the TDC is set to Vss temporarily. Thereafter, signal REG is made high, thereby turning on the transistor 61q, which causes the data in the DDC to be transferred to the TDC.

Next, signal DTG is set to Vdd+Vth, thereby turning-on the transistor 61s temporarily, which causes the data in the PDC to be transferred to the DDC. Thereafter, the data in the TDC is moved to the PDC.

Next, signal VPRE is set to Vdd and signal BLPRE is set to Vdd+Vth, thereby precharging node N3 of the TDC at Vdd. Thereafter, signal BLCLAMP is set to 0.9V+Vth, thereby turning on the transistor 61t. When the bit line is at the low level, node N3 of the TDC is at the low level. When the bit line is at the high level, node N3 of the TDC is at the high level.

Here, when writing is done, the low level signal is stored in the DDC. When writing is not done, the high level is stored in the DDC. Therefore, with signal VREG at Vdd and signal REG at Vdd+Vth, node N3 of the TDC is forced to be high only when no writing is done.

Thereafter, the data in the PDC is moved to the DDC and the potential of the TDC is read into the PDC. The high level signal is latched in the PDC only when no writing is done, and when data "2" has been written into the cell and the threshold voltage of the cell has reached the verify potential "b'". The low level signal is latched in the PDC only when the threshold voltage of the cell has not reached "b'" and when data "1" and data "3" have been written in the memory cell.

(Program Operation) (S26)

A program operation is identical with the first page program operation. When data "1" has been stored in the PDC, no writing is done. When data "0" has been stored in the PDC, writing is done.

(Second Page Verity: Verifies Memory Cell Data "1") (S27)

In the program verify operation, a potential of "a'" a little higher than the read potential "a" is applied to the selected word line.

First, a read potential Vread is applied to the unselected word lines and select line SG1 in the selected block. Signal BLCLAMP of the data storage circuit 10 is set to 1V+Vth and BLC2 is set to Vdd+Vth. Under these conditions, the bit line is precharged. When data "2" and data "3" are written into the memory cell, the data stored in the SDC is "0". As a result, the bit line is prevented from being precharged. Only when data "0" and data "1" are written into the memory cell, the bit line is precharged.

Next, select line SG2 on the source side of the cell is made high. Since the cells whose threshold voltage is higher than the potential "a'" turn off, the bit line remains high. In addition, since the cells whose threshold voltage is lower than the potential "a'" turn on, the bit line is at Vss. While the bit line is being discharged, node N3 of the TDC is set to Vss temporarily and signal REG is made high, thereby turning on the transistor 61q, which causes the data in the DDC to be transferred to the TDC.

Next, signal DTG is made high, thereby turning on the transistor 61s temporarily, which causes the data in the PDC to be transferred the DDC. Thereafter, the data in the TDC is transferred to the PDC. Next, signal BLPRE of the data storage circuit is set to the voltage Vdd+Vth, thereby turning on the transistor 61u, which precharges node N3 of the TEC at Vdd. Thereafter, signal BLCAMP is set to 0.9V+Vth, thereby turning on the transistor 61t. Then, when the bit line is at the low level, node N3 of the TDC is at the low level. When the bit line is at the high level, node N3 of the TEC is at the high level.

Here, when writing is done, the low level has been stored in the DDC. When writing is not done, the high level has been stored in the DDC. Therefore, with signal VREG at Vdd and signal REG at the high level, node N3 of the TDC is forced to be high only when no writing is done. After this operation, the data in the PDC is transferred to the DDC and the potential of the TDC is read into the PDC. The high level is latched in the PDC only when the cell is not written into and when data "1" has been written into the cell and the threshold voltage of the call has reached the verify potential "a'". The low level is latched in the PDC only when the threshold voltage of the cell has not reached "a'" and when data "2" and data "3" have been written into the memory cell.

(Second Page Verify: Verifies Memory Cell Data "2") (S28)

Like the verification of memory cell data "2" before programming, memory cell data "2" is verified.

(Second Page Verify: Verifies Memory Cell Data "3") (S29)

In this program verify operation, a potential of "c'" a little higher than the read potential "c" is applied to the selected word line as shown in FIG. 1C. In this state, a read potential Vread is first applied to the unselected word lines and select line SG1 in the selected block. Signal BLCLAMP is set to 1V+Vth and signal BLPRE is set to Vdd+Vth, thereby turning on transistors 61$t$, 61$u$, which precharges the bit line.

Next, select line SG2 on the source side of the cell is made high. Since the cells whose threshold voltage is higher than the potential "c'" turn off, the bit line remains high. In addition, since the cells whose threshold voltage is lower than the potential "c'" turn on, the bit line is at Vss. While the bit line is being discharged, node N3 of the TDC is set to Vss and signal REG is made high, thereby turning on the transistor 61$q$, which causes the data in the DDC to be transferred to the TDC.

Next, signal DTG is made high, thereby turning on the transistor 61$s$, which causes the data in the PDC to be transferred the DDC. Thereafter, the data in the TDC is transferred to the PDC. Next, signal BLPRE is set to the voltage Vdd+Vth, thereby turning on the transistor 61$u$, which precharges node N3 of the TDC at Vdd. Thereafter, signal BLCAMP is set to 0.9V+Vth, thereby turning on the transistor 61$t$. Then, when the bit line is at the low level, node N3 of the TDC is at the low level. When the bit line is at the high level, node N3 of the TDC is at the high level.

Here, when writing is done, the low level has been stored in the DOC. When writing is not done, the high level has been stored in the DDC. Therefore, signal VREG is set to Vdd and signal REG is set to the high level, thereby turning on the transistor 61$q$. Then, node N3 of the TDC is forced to be high only when no writing is done. After this operation, the data in the PDC is transferred to the DDC and the potential of the TDC is read into the PDC. The high level is latched in the PDC only when the cell is not written into and when data "3" has been written into the memory cell and the threshold voltage of the cell has reached the verify potential "c'". The low level is latched in the PDC only when the threshold voltage of the cell has not reached "c'" and when data "1" and data "2" have been written into the memory cell.

When the PDC is at the low level, the write operation is carried out again and the program operation and verify operation are repeated until the data in the PDC of all of the data storage circuits have become high (S30).

In the first embodiment, after the first programming, three verify operations have been carried out. In the initial program loop, the threshold voltage does not rise. Therefore, the verification of memory cell data "3" or the verification of memory cell data "3" and the verification of memory cell data "2" may be omitted. In a program loop close to the end, the writing of memory cell data "1" or the writing of memory cell data "2" and memory cell data "1" has been completed. Therefore, these verify operations may be omitted. If the verification of memory cell data "1" is not needed, it is not necessary for the SDC to store the data. Thus, the data for writing the next data may be read from the outside world.

Furthermore, no data has been written into the flag cell on the first page. Only on the second page, the data has been written into the flag cell. As a result, the data in the flag cell has been "1".

(First Page Read)

Figure 13:
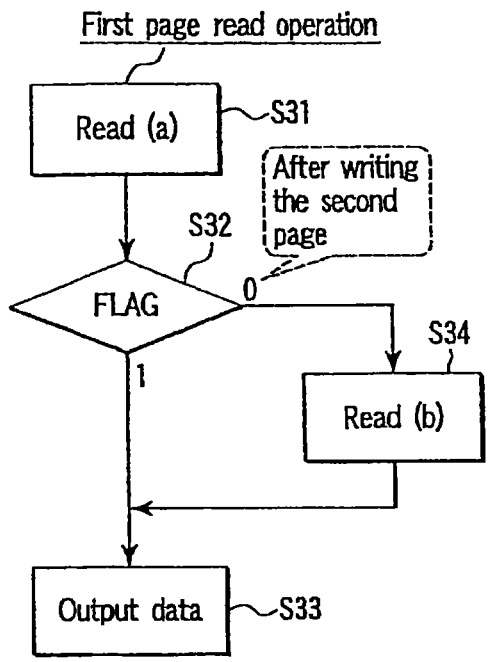
FIG. 13 is a flowchart for the operation of reading the first page.

FIG. 13 is a flowchart for the operation of reading the first page. First, an address is specified to select two pages shown in FIG. 3. As shown in FIGS. 1B and 1C, the distribution of the threshold voltage changes before and after the writing of the second page. Therefore, after the potential of the word line is set to "a", a read operation is carried out and it is determined whether the data in the flag cell is "0" or "1" (S31, S32). In this determination, if more than one flag cell is used, whether the data is "0" or "1" is determined by a majority decision.

When the data read from the flag cell is "1" (or the data in the memory cell is "0"), the writing of the second page has not been carried out. As a result, the distribution of the threshold voltage of the cell is as shown in FIG. 1A or 1B. To determine the data in such a cell, a read operation has to be carried out with the potential of the word line at "a". In step S31, however, the result of the read operation with the word line potential "a" has been already read into the data storage circuit. Therefore, the data stored in the data storage circuit is outputted (S33).

On the other hand, when the data read from the flag cell is "0" (or the data in the memory cell is "1"), the writing of the second page has been carried out. As a result, the distribution of the threshold voltage of the cell is as shown in FIG. 1C. To determine the data in such a cell, a read operation has to be carried out with the potential of the word line at "b". Thus, a read operation is carried out with the word line potential at "b" (S34). Thereafter, the data read into the data storage circuit is outputted (S33).

(Read Operation: First Page Read)

As described above, in the first page read operation, a read operation is carried out, with the read potential "a" or "b" being applied to the selected word line.

First, a read potential Vread is supplied to the unselected word lines and select line SG1 in the selected block. Signal BLPRE of the data storage circuit of FIG. 6 is set to 1V+Vth and signal BLCLAMP is set to Vdd+Vth. Under these conditions, the bit is precharged. Thereafter, select line SG2 on the source side of the cell is made high. Since the cells whose threshold voltage is higher than the potential "a" or "b" turn off, the bit line remains high. In addition, since the cells whose threshold voltage is lower than the potential "a" or "b" turn on, the bit line is at Vss.

Next, signal BLPRE of the data storage circuit is set to the voltage Vdd+Vth, thereby turning on the transistor 61$u$, which precharges node N3 of the TDC at Vdd. Thereafter, signal BLCLAMP is set to 0.9V+Vth, thereby turning on the transistor 61$t$. Then, when the bit line is at the low level, node N3 of the TDC is at the low level. When the bit line is at the high level, node N3 of the TDC is at the high level. Thereafter, the data in the PDC is transferred to the SDC.

(Second Page Read)

Figure 14:
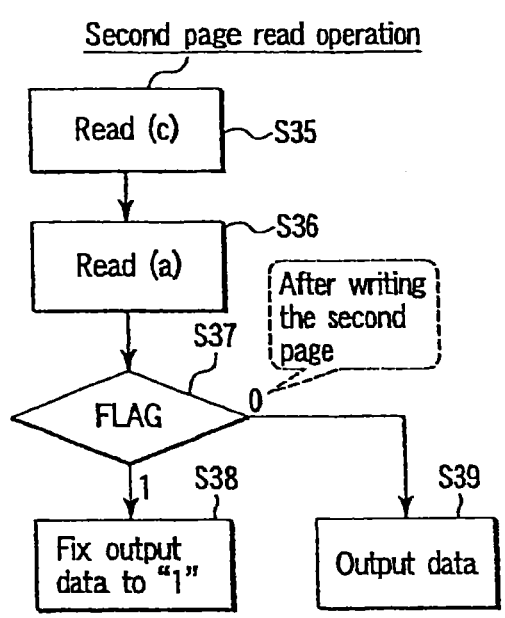
FIG. 14 is a flowchart for the operation of reading the second page.

FIG. 14 is a flowchart for the operation of reading the second page. In a second page read operation, an address is first specified to select two pages shown in FIG. 3. As shown in FIGS. 1B and 1C, the distribution of the threshold voltage changes before and after the writing of the second page. After the writing of the second page, the distribution is as shown in FIG. 1C. Therefore, a read operation is first carried out, with the potential of the word line set at "c" (S35). Thereafter, the word line potential is set to "a" and then a read operation is carried out (S36). When the threshold voltage of the cell is lower than "a" or higher than the word line potential "c", the data is determined to be "1". When the threshold voltage of the cell is higher than "a" or lower than the word line potential "c", the data is determined to be "0". Before the writing of the second page, the data on the second page should be outputted as "1". However, the threshold voltage distribution is as shown in FIG. 1A. As a result, when the same read operation as after the writing of the second page is carried out, the output data might be "0". Therefore, it is determined whether the data in the flag cell is "0" or "1" (S37). As a result, when the data in the flag cell is "1" and the writing of the second page has not been carried out, the output data is fixed to "1" (S38). To output "1", signal PRST of the data storage circuit is made high and "1" is set in the SDC. Alternatively, the data input/output buffer shown in FIG. 2 is caused to output only data "1". In addition, when the data in the flag cell is "0", the read-out data is outputted (S39).

Figure 15:
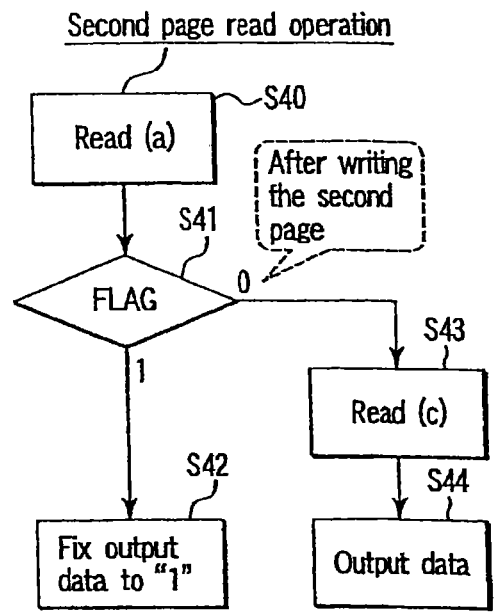
FIG. 15 is a flowchart for a modification of the operation of reading the second page.

FIG. 15 shows a modification of the second page read operation. In this case, the potential of the word line is set to "a" and the data in the flag cell is read. Then, the data in the flag cell is determined (S40, S41). When the data in the flag cell is "1", the writing of the second page has not been carried out. Thus, the output data is fixed to "1" (S42). When the data in the flag cell is "0", the writing of the second page has been carried out. Thus, the potential of the word line is set to "c" and a read operation is carried out. Then, the read-out data is outputted (S43, S44). With this configuration, too, the read operation of the second page can be carried out.

However, in the first embodiment, the potential of the word line is first set to "c" and a read operation carried out as shown in FIG. 14. Thereafter, the potential of the word line is set to "a" and a read operation is carried out. When the data in the flag cell is "0", the data read into the data storage circuit is outputted. When the data in the flag cell is "1", the writing of the second page has not been carried out. Thus, when the data is outputted to the outside world, the data in the data storage circuit is not outputted, but data "1" is always outputted.

Specifically, in reading the second page, the following operation will be carried out.

(Read Operation: A First Second Page Read)

In a first read operation of the second page, the read potential "c" is supplied to the selected word line and a read operation is carried out (S35). The read operation, which is identical with the above-described first page read, stores the read-out cell data into the PDC.

(Read Operation: A Second Page Read Operation).

In a second read operation of the second page, the read potential "a" is supplied to the selected word line and a read operation is carried out (S36).

First, a read potential Vread is supplied to the unselected word lines and select line SG1 in the selected block. In this state, signal BLPRE of the data storage circuit and signal BLCLAMP are set to 1V+Vth. Under these conditions, the bit line is precharged. Thereafter, select line SG2 on the source side of the cell is made high. Since the cells whose threshold voltage is higher than the potential "a" turn off, the bit line remains high. In addition, since the cells whose threshold voltage is lower than the potential "a" turn on, the bit line is at Vss.

Next, signal BLPRE of the data storage circuit is set to the voltage Vdd+Vth, thereby precharging node N3 of the TDC at Vdd. Thereafter, signal BLCAMP is set to Vdd+Vth, thereby turning on the transistor 61t. Then, when the bit line is at the low level, node N3 of the TDC is at the low level. When the bit line is at the high level, node N3 of the TDC is at the high level. Thereafter, the DTG is made high, the REG is made high, and the VREG is made low. Then, only when the PDC is high, node N3 of the TDC is at the low level. After this operation, the data in the PDC is transferred to the SDC. As a result, when the threshold voltage of the cell is lower than the potential "a" or higher than the potential "c", the output data becomes "1". When the threshold voltage of the cell is higher than the potential "a" or lower than the potential "c", the output data becomes "0".

(Erase)

In an erase operation, an address is first specified to select the block enclosed by a broken line in FIG. 3. After the erase operation, the data in the memory cell becomes "0". Even when a read operation is carried out on any one of the first, second, and third pages, data "1" is outputted.

In the first embodiment, the data on the first page is written into the memory cell with a potential lower than the original threshold voltage. Before the data on the second page is written, the data on the first page is written into the adjacent memory cells. After the adjacent cells are written into, the data on the second page is written into the memory cell, thereby setting the original threshold voltage corresponding to the stored data. Because the data on the first page is written into the memory cell, taking into the effect of the FG-FG capacitance of the adjacent memory cells, it is possible to set the threshold voltage corresponding to the multivalued data accurately.

Furthermore, when the data on the second page is written, or when the data is written into the flag cell and the data is read from each page, the output data is controlled according to the data stored in the flag cell. Therefore, it is possible to output the data on each page reliably.

Second Embodiment

Figure 16:
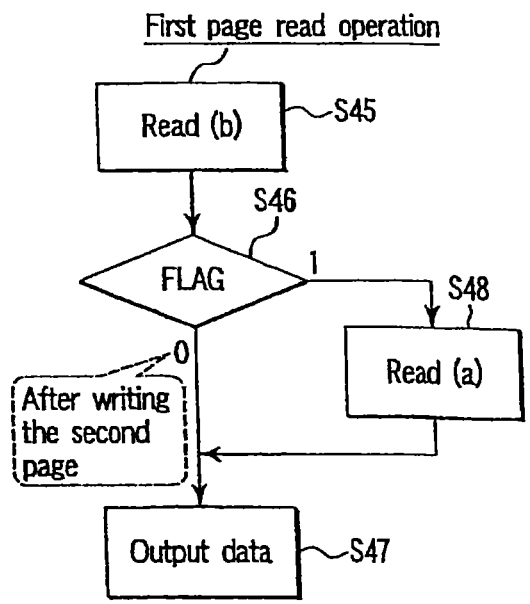
FIG. 16 is a flowchart for the operation of reading the first page according to a second embodiment of the present invention.

FIG. 16 shows a second embodiment of the present invention obtained by modifying the first embodiment. In the first embodiment, when the second page is written, the memory cell data in the flag cell is changed from "0" to "1". However, the memory cell data in the flag cell may be changed from "0" to "2". With this configuration, the operation of reading the first page can be modified as shown in FIG. 16.

First, the potential of the word line is set to "b" and a read operation is carried out to determine the data in the flag cell (S45, S46). When data has been written in the flag cell, the data stored in the data storage circuit is outputted as it is (S47). When no data has been written in the flag cell, the potential of the word line is set to "a" and a read operation is carried out (S48). This causes the read-out data to be outputted (S47).

With the second embodiment, when the second page is written, memory cell data "2" is written into the flag cell. This enables the data to be read out in one cycle in reading the data on the first page in the memory cell selected together with the flag cell into which memory cell data "2" has been written. Therefore, the number of reads can be decreased, which enables a high-speed reading.

When the second page is written into, the data in the memory cell changes only from data "0" to data "1," or from data "2" to data "3." However, when the second page is written into, the data in the flag cell is caused to change from data "0" to data "2," the distribution of the threshold voltages of the memory cells adjacent to the flag cell gets wider. To prevent this, for example, a dummy bit line and memory cell are provided between the flag cell and the memory cell.

In FIG. 59, a pair of dummy bit lines DSL and dummy cells DMC constituting a NAND cell are provided between a flag cell FC and bit line Li+1 and a plurality of memory cells connected to the bit line. The pair of dummy bit lines DMBL are connected to a dummy data storage circuit 10b. An address signal YAD1 is supplied to the dummy data storage circuit 10*b*. This configuration prevents the distribution of the threshold voltages of the memory cells from getting wider due to the influence of the flag cell being written into.

Furthermore, as shown in FIG. 59, the pair of dummy bit lines DMBL and the dummy cells DMC may be provided between the flag cell FC and a redundancy cell array RD. The pair of dummy bit lines DMBL are connected to a dummy data storage circuit 10*c*. An address signal YAD2 is supplied to the dummy data storage circuit 10*c*. This configuration prevents the distribution of the threshold voltages of the redundancy cells from getting wider due to the flag cell being written into.

Third Embodiment

Figure 17:
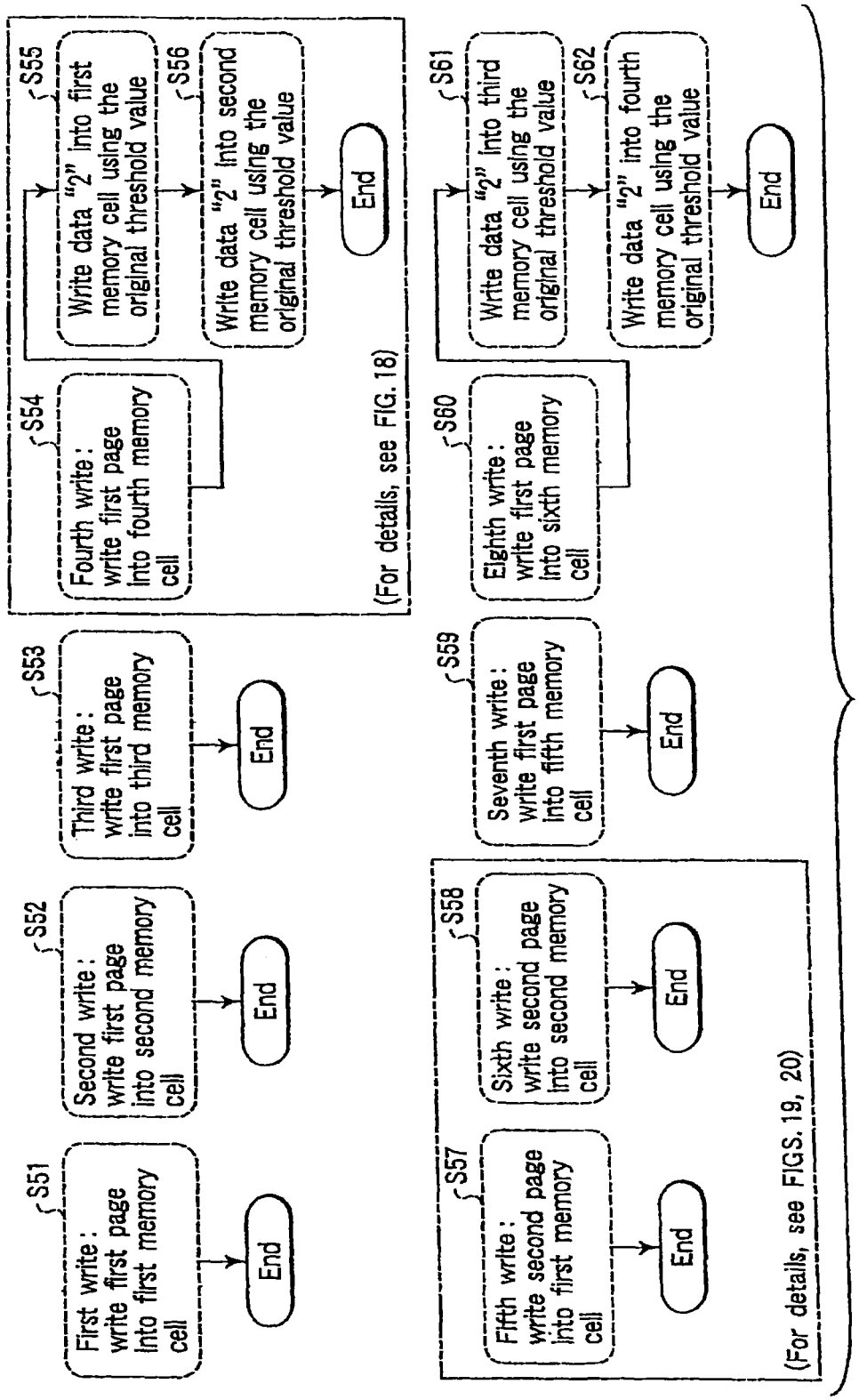
FIG. 17 is a diagram to help explain program operations according to a third embodiment of the present invention.

FIG. 17 is a diagram to help explain program operations according to a third embodiment of the present invention.

In the first and second embodiments, data "1", data "2", and data "3" are written simultaneously into a memory cell in writing the second page. In the third embodiment, however, only data "2" is written into the memory cell first. After the writing is completed, data "1" and data "3" are written simultaneously into the memory cell. A write operation in the third embodiment is executed as follows.

A first write: the first page is written into a first memory cell (S51).

A second write: the first page is written into a second memory cell (S52).

A third write: the first page is written into a third memory cell (S53).

A fourth write: the first page is written into a fourth memory cell (S54). Thereafter, before the data for a fifth write is loaded, data "2" is written into the first memory cell and second memory cell with the original threshold voltage in that order (S55, S56).

A fifth write: the second page is written into the first memory cell (S57).

A sixth write: the second page is written into the second memory cell (S58).

A seventh write: the first page is written into a fifth memory cell (S59).

An eighth write: the first page is written into a sixth memory cell (S60). Thereafter, before the data for a ninth write is loaded, data "2" is written into the third memory cell and fourth memory cell with the original threshold voltage in that order (S61, S62).

Figure 18:
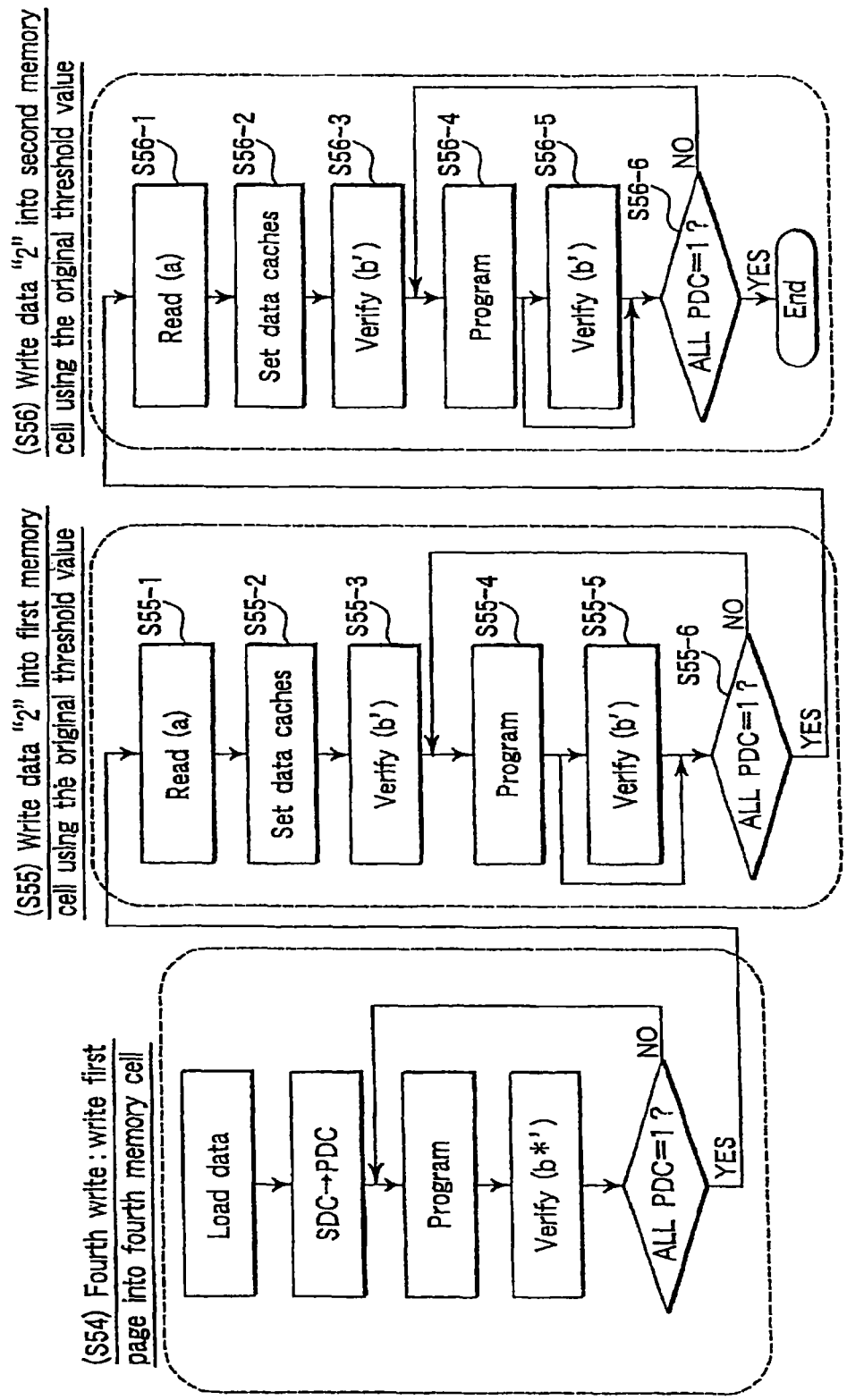
FIG. 18 is a concrete flowchart for a fourth write operation in FIG. 17.
Figures 19, 20:
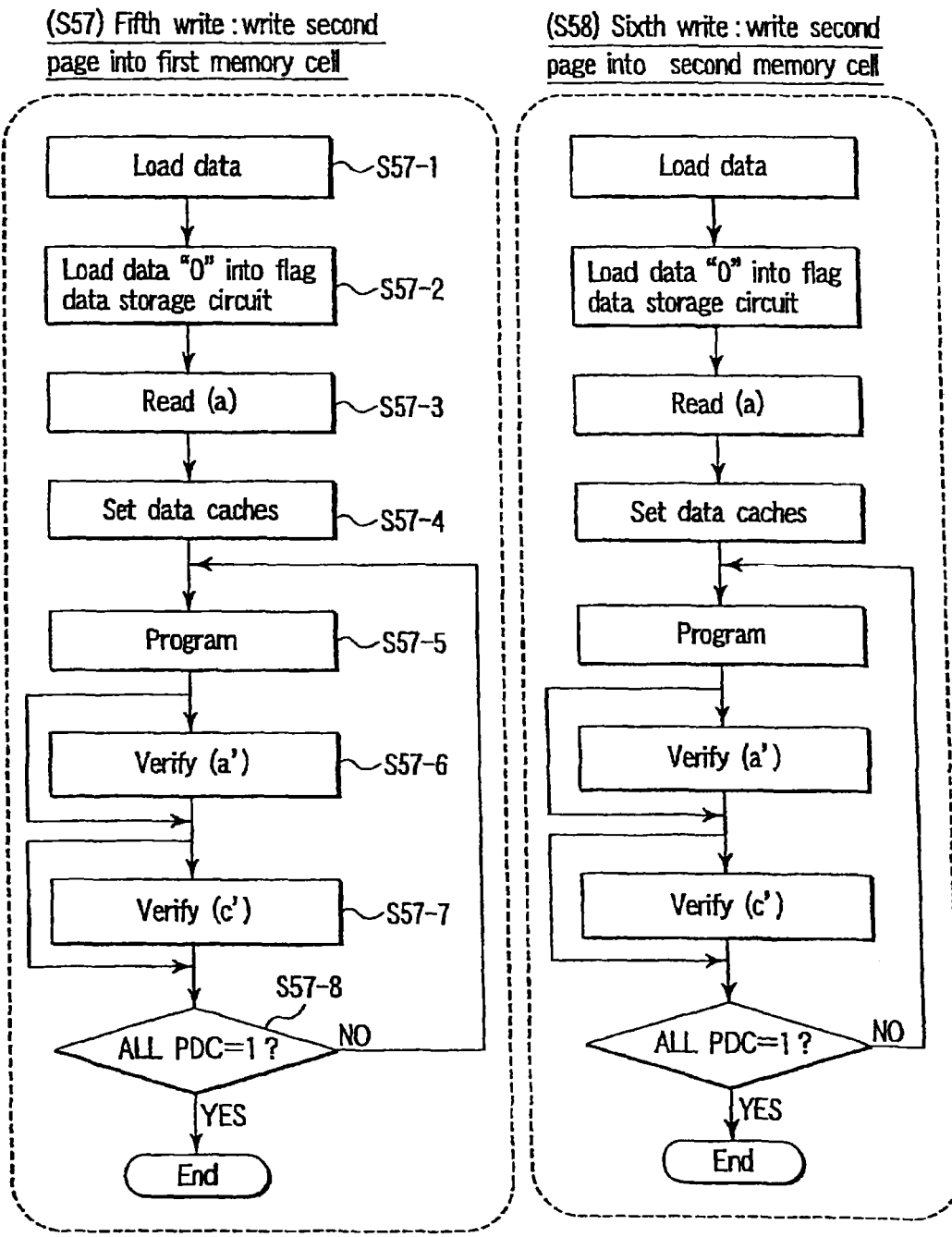
FIG. 19 is a concrete flowchart for a fifth write operation in FIG. 17.
FIG. 20 is a concrete flowchart for a sixth write operation in FIG. 17.

FIG. 18 is a concrete flowchart for the fourth write operation. FIG. 19 is a concrete flowchart for the fifth write operation. FIG. 20 is a concrete flowchart for the sixth write operation.

In FIG. 18, the operation of writing the first page into the fourth memory cell is the same as the operation shown in FIG. 8. Thereafter, data "2" is written into the first memory cell with the original threshold voltage. Specifically, the voltage of the word line is set to "a" and the data is read from the memory cell (S55-1). According to the read-out data, the TDC, DDC, and PDC are set (S55-2). Thereafter, the original threshold voltage "b" of data "2" is supplied to the word line for verification (S55-3). Then, a program operation is carried out, thereby changing the threshold voltage of the memory cell (S55-4). Then, the threshold voltage of the memory cell is verified with the threshold voltage "b'" (S55-5). The program operation and verify operation are repeated until all of the PDCs have taken the value of "1" (S55-6 to S55-4).

Thereafter, data "2" is written into the second memory cell with the original threshold voltage in the same manner as writing the data into the first memory (S56-1 to S56-6).

The operation of writing the second page into the first memory cell in FIG. 19 (S57-1 to S57-8) differs from the operation of writing the second page in the first embodiment of FIG. 9 in the following point. In FIG. 9, after the data cache setting, the data in the memory cell is verified with the threshold voltage "b'". In contrast, in a write operation shown in FIG. 19, since data "2" has been already written, a verify operation with the threshold voltage "b" is omitted. Therefore, after the data cache setting, the second page is programmed into the first memory (S57-4, S57-5). Even in a verify operation after the program operation, a verify operation with threshold voltage "b'" is omitted. Therefore, only verify operations with the threshold voltages "a'" and "c'" are carried out (S57-6, S57-7).

Because the operation of writing the second page into the second memory cell shown in FIG. 20 is the same as writing the second page into the first memory cell shown in FIG. 19, its explanation is omitted.

In the third embodiment, after the first page is written, data "2" is written with original threshold voltage before the second page is written. Consequently, although the programming time for the second page is longer than that for the first page in the first embodiment, the programming time for the first page can be made almost equal to that for the second page in the third embodiment.

Fourth Embodiment

Figure 21:
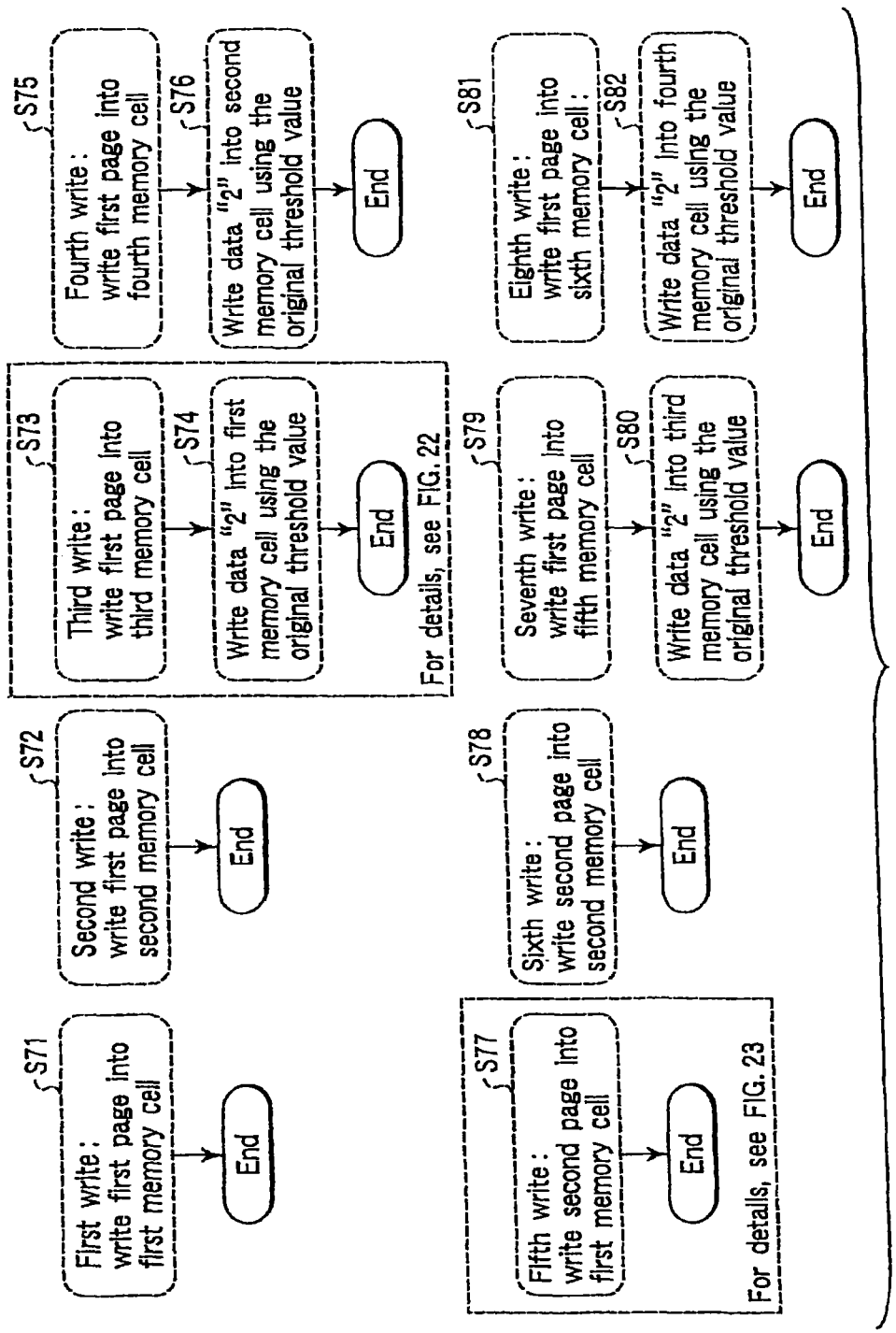
FIG. 21 is a diagram to help explain write operations in a fourth embodiment of the present invention.
Figure 22:
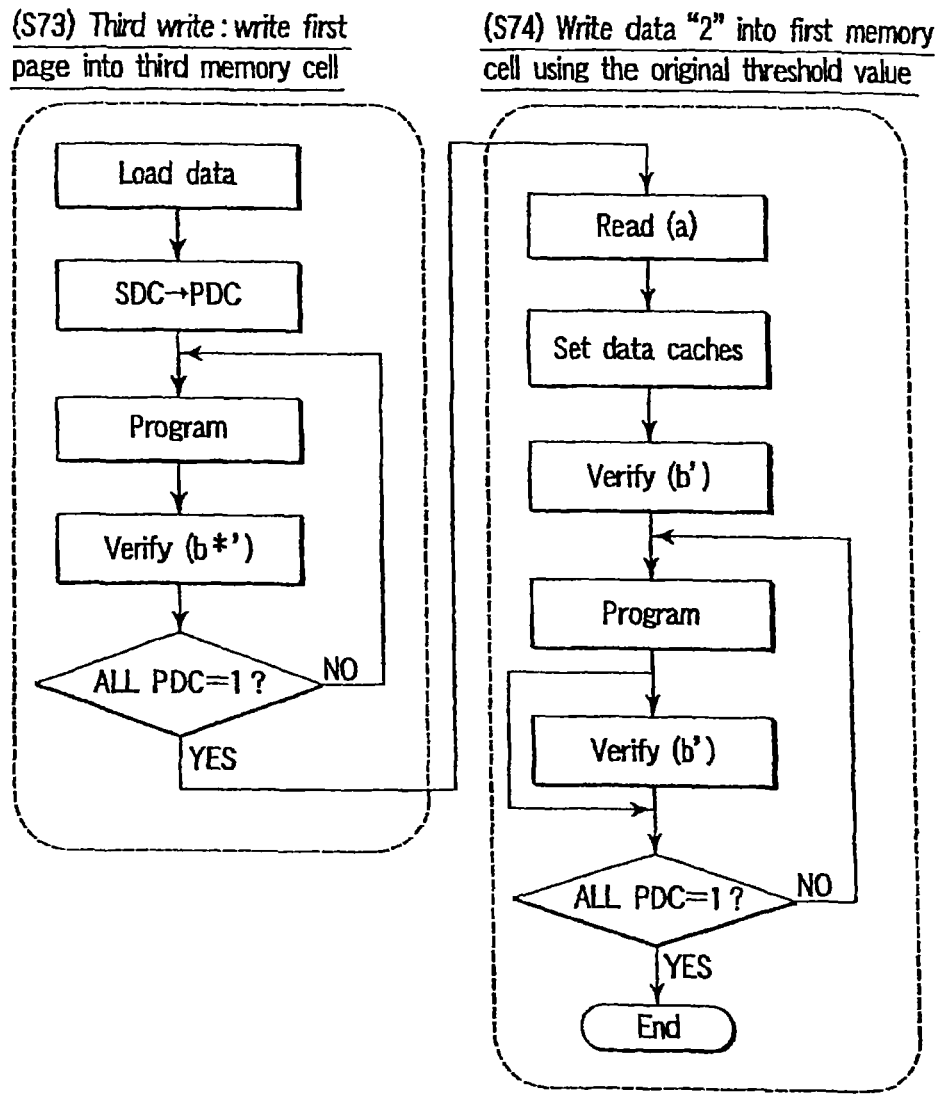
FIG. 22 is a flowchart for part of the operations in FIG. 21.

FIGS. 21 and 22 show a fourth embodiment of the present invention obtained by modifying the third embodiment. Write operations in the fourth embodiment are executed as shown in FIG. 21.

A first write: the first page is written into a first memory cell (S71).

A second write: the first page is written into a second memory cell (S72).

A third write: the first page is written into a third memory cell (S73). Thereafter, data "2" is written into the first memory with the original threshold voltage (S74).

A fourth write: the first page is written into a fourth memory cell (S75). Thereafter, data "2" is written into the second memory with the original threshold voltage (S76).

A fifth write: the second page is written into the first memory cell (S77).

A sixth write: the second page is written into the second memory cell (S78).

A seventh write: the first page is written into a fifth memory cell (S79). Thereafter, data "2" is written into the third memory with the original threshold voltage (S80).

An eighth write: the first page is written into a sixth memory cell (S81). Thereafter, data "2" is written into the fourth memory with the original threshold voltage (S82).

FIG. 22 is a flowchart to help explain the third write operation concretely.

Because the operation of writing the first page into the third memory cell (S73) and the operation of writing data "2" into the first memory cell with the original threshold voltage (S74) shown in FIG. 22 are the same as the operation of writing the first page into the fourth memory cell (S54) and the operation of writing data "2" into the first memory cell with the original threshold voltage (S55) shown in FIG. 18, explanation of them is omitted.

Furthermore, the operation of writing the second page into the first memory cell (S77) is the same as the writing operation shown in FIG. 19.

In the fourth embodiment, after the first page is written, data "2" is written with the original threshold voltage before the second page is written. Therefore, like the third embodiment, the fourth embodiment enables the programming time for the first page to be almost equal to that for the second page.

Fifth Embodiment

In recent years, a pass write method has been proposed to narrow the distribution of the threshold voltage in a write operation of a multivalued flash memory that store a plurality of bits.

Figure 23A:
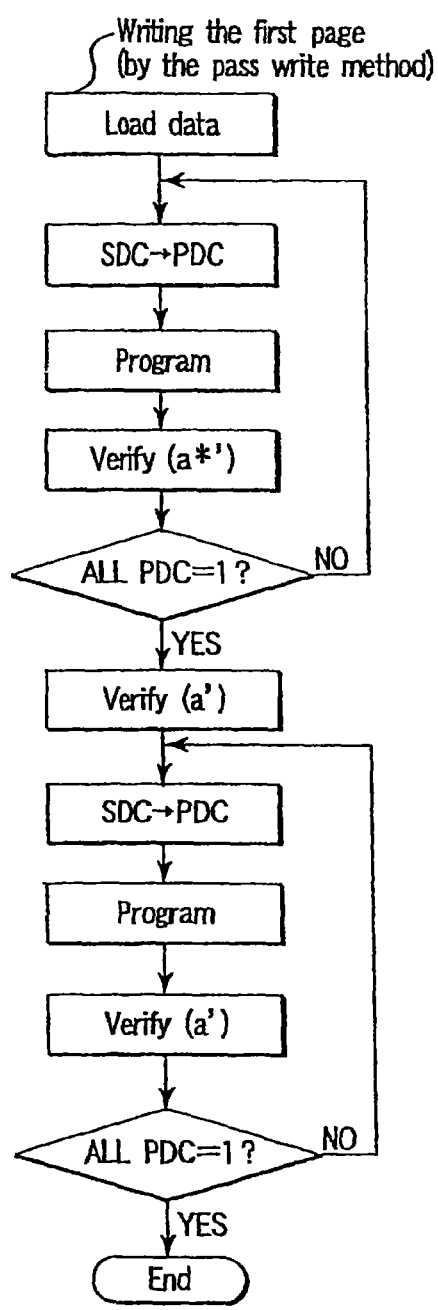
FIGS. 23A and 23B are flowcharts for the sequence of writing data by a conventional pass write method.
Figure 23B:
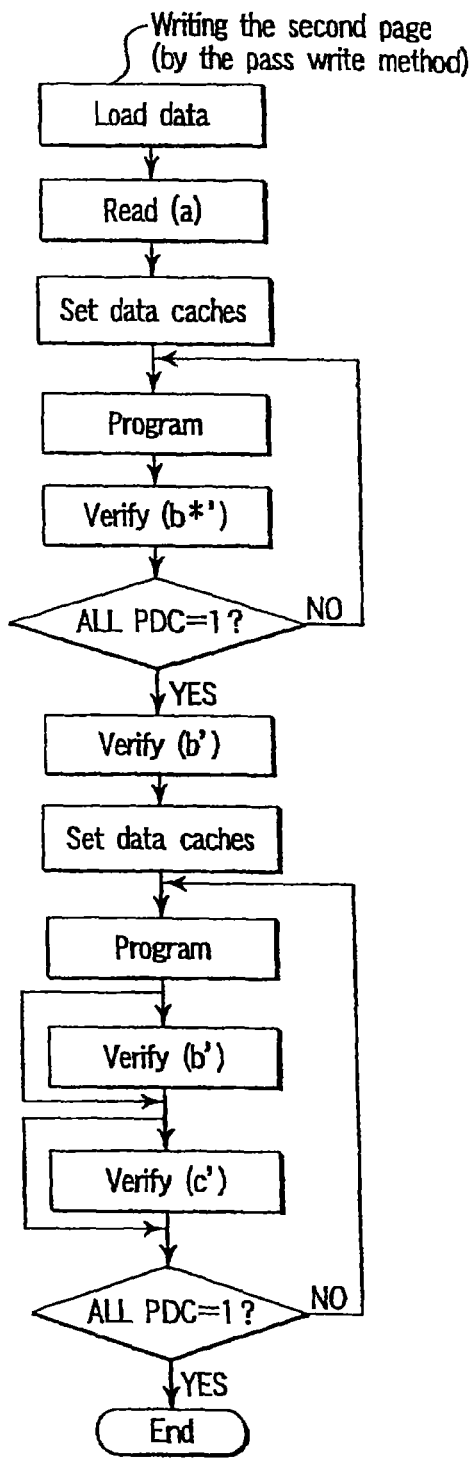

FIG. 23 shows a write sequence in a conventional pass write method.

In a first program sequence of the first page write (see FIG. 23A) and the second page write (see FIG. 23B) by the pass write method, the threshold voltage of the memory cell is set to the verify potentials "a*'" and "b*'" lower than the original threshold voltage and a write and a verify operation for the first page are carried out. After the program verify has passed, the verify potential is set to the original voltages "a'", "b'", and "c'" and a write and a verify operation for the first page are carried out in the second page program sequence of the first page write and the second page write. In the pass write method, a cell once written into is written into again until its threshold voltage has risen a little. The degree of variability of the threshold voltage in rewriting becomes smaller. As a result, the threshold voltage distribution becomes smaller.

Generally, in a NAND flash memory, half of the cells connected to the same word line are written into simultaneously. For this reason, in the first verification of a write verify loop, there are many cells whose threshold voltage is lower and therefore a lot of current flows into the source line, which brings the source line into a floating state. As a result, the threshold voltage of the cell first written into is determined in this state. Thereafter, when another cell has been written into, the potential of the source line returns from the floating state. Consequently, the threshold voltage of the cell first written into apparently gets lower, causing the problem of spreading the threshold voltage distribution. In the pass write method, however, the threshold voltage can be prevented from spreading.

Generally, a write voltage of Vpgm is increased by ΔVpgm each time a program verify operation is carried out. In the pass write method, the write voltage ΔVpgm in a first write is increased in, for example, 0.4V steps. After the first write sequence is completed, the write voltage Vpgm is returned to the initial voltage value. In a second write, too, the write voltage Vpgm is increased by ΔVpgm each time a program verify operation is carried out. The second write voltage, however, is increased by a lower voltage than the first write voltage ΔVpgm, for example, in 0.2V steps. Under these conditions, a write operation is carried out. By setting the write voltage this way, high-speed writing can be done.

In the first to fourth embodiments, when data "2" and data "3" are written into a memory cell, data "2" is written into the memory cell in writing the first page with the threshold voltage "b*'" lower than the original threshold voltage "b'". Thereafter, the second page is written with the threshold voltage "b'" and threshold voltage "c'". Therefore, the pass write is also carried out.

In the conventional pass write method of FIG. 23, there are two sequences in writing the first page: a first write verify for the threshold voltage "a*'" and a second write verify for the threshold voltage "a'". In addition, there are two sequences in writing the second page: a first write verify for the threshold voltage "b*'" and a second write verify for the threshold voltages "a*'" and "c*'".

In the first to fourth embodiments, however, there are only a write verify for the threshold voltage "b*'" in writing the first page and a write verify for the threshold voltages "b'" and "c'" in writing the second page. Therefore, when data "1" is written into a memory cell, the pass write is not carried out. Thus, in the fifth embodiment, the second page is written into using the following algorithm.

Figure 24:
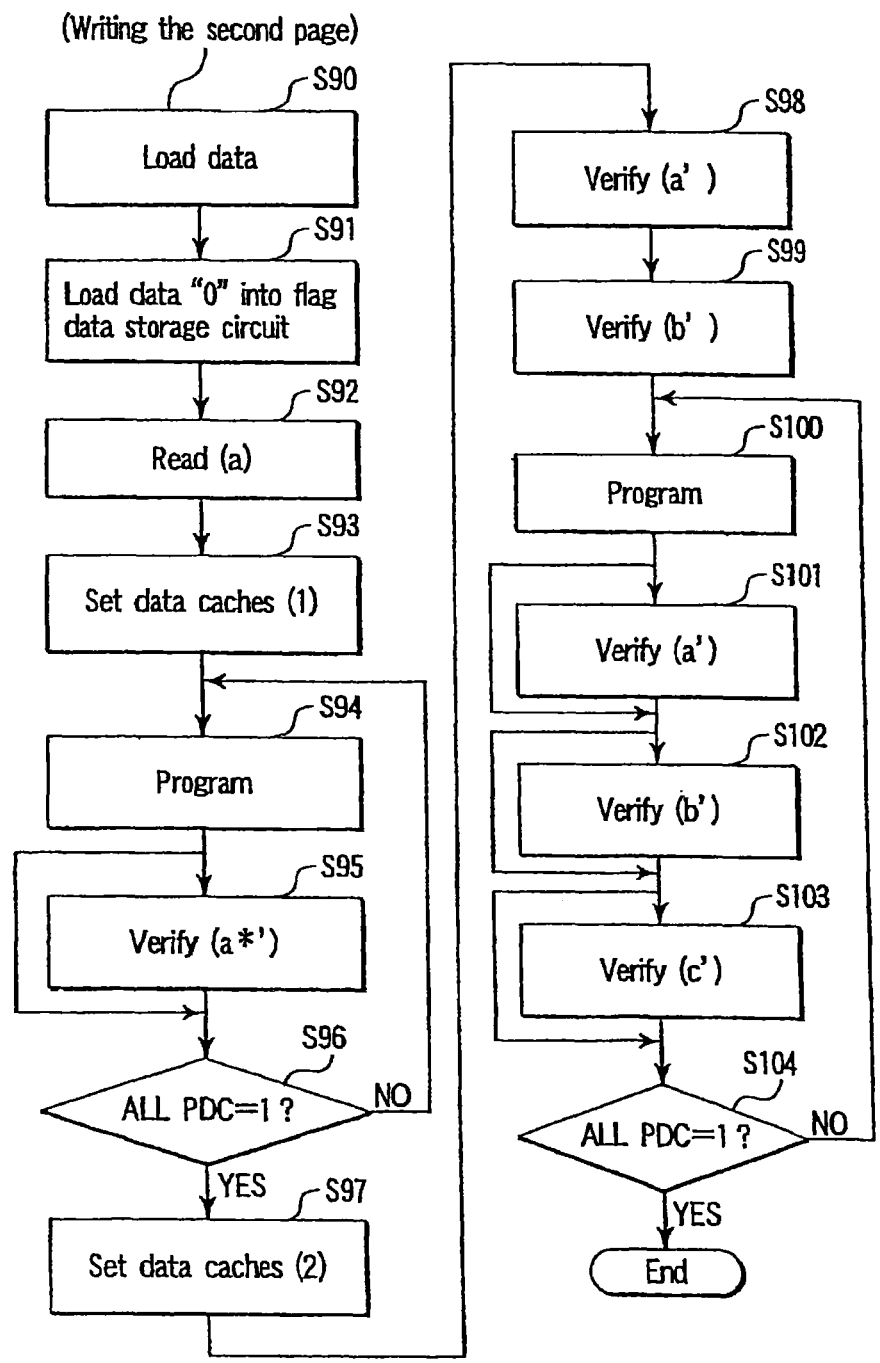
FIG. 24 shows an algorithm for the operation of writing data "1" applied to a fifth embodiment of the present invention.

FIG. 24 shows an algorithm for writing data "1" applied to the fifth embodiment.

First, data caches SDC, DDC, and TDC are set as shown in FIG. 25. In this state, a verify potential of "a*'" lower than the original threshold voltage is set and a write operation is carried out on the basis of the data in the PDC (S90 to S95). The program is verified repeatedly until all of the PDCs have become high (S94 to S96). Thereafter, as shown in FIG. 10B, the data caches are set (S97) and a write operation is carried out to set the verify potential to the original threshold voltage "a'". The second write operation is carried out at the same time writing is done with the threshold voltage "b'" and the threshold voltage "c'". The program is verified repeatedly until all of the PDCs have become high (S98 to S104).

In the fifth embodiment, since the pass write method can be applied even to the writing of memory cell data "1", all of the data can be written by the pass write method.

Sixth Embodiment

Figure 26:
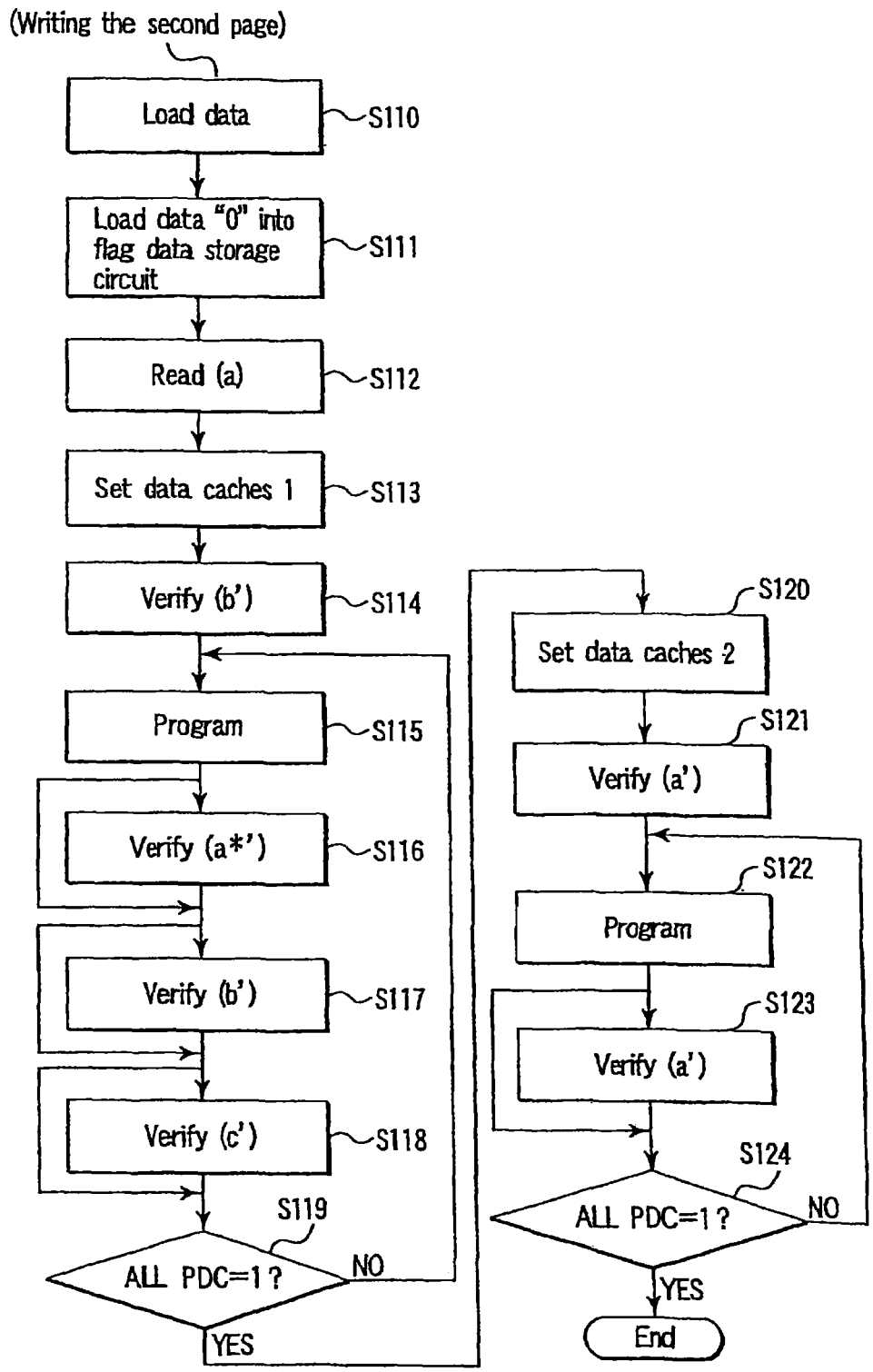
FIG. 26 is a flowchart to help explain the order in which a second page is written into in a sixth embodiment of the present invention.

FIG. 26 shows a sixth embodiment of the present invention obtained by modifying the fifth embodiment. Specifically, In the sixth embodiment, the sequence of writing the second page is changed. As shown in FIG. 27A, after the data caches are set, a write operation is carried out to reach the verify potential "a*'" lower than the original voltage, the threshold voltage "b'", and the threshold voltage "c'". The program and verify operations are repeated until all of the PDCs have become high (S110 to S119). Thereafter, the data in the SDC is inverted as shown in FIG. 27B. Then, the resulting data is transferred to the PDC (S120). Thereafter, the verify potential for the cell with data "1" is set to the original threshold voltage "a'" and writing is done. The program and verify operations are repeated until all of the PDCs have become high (S121 to S124).

Therefore, the sixth embodiment also produces the same effect as that of the fifth embodiment.

Seventh Embodiment

Figure 28:
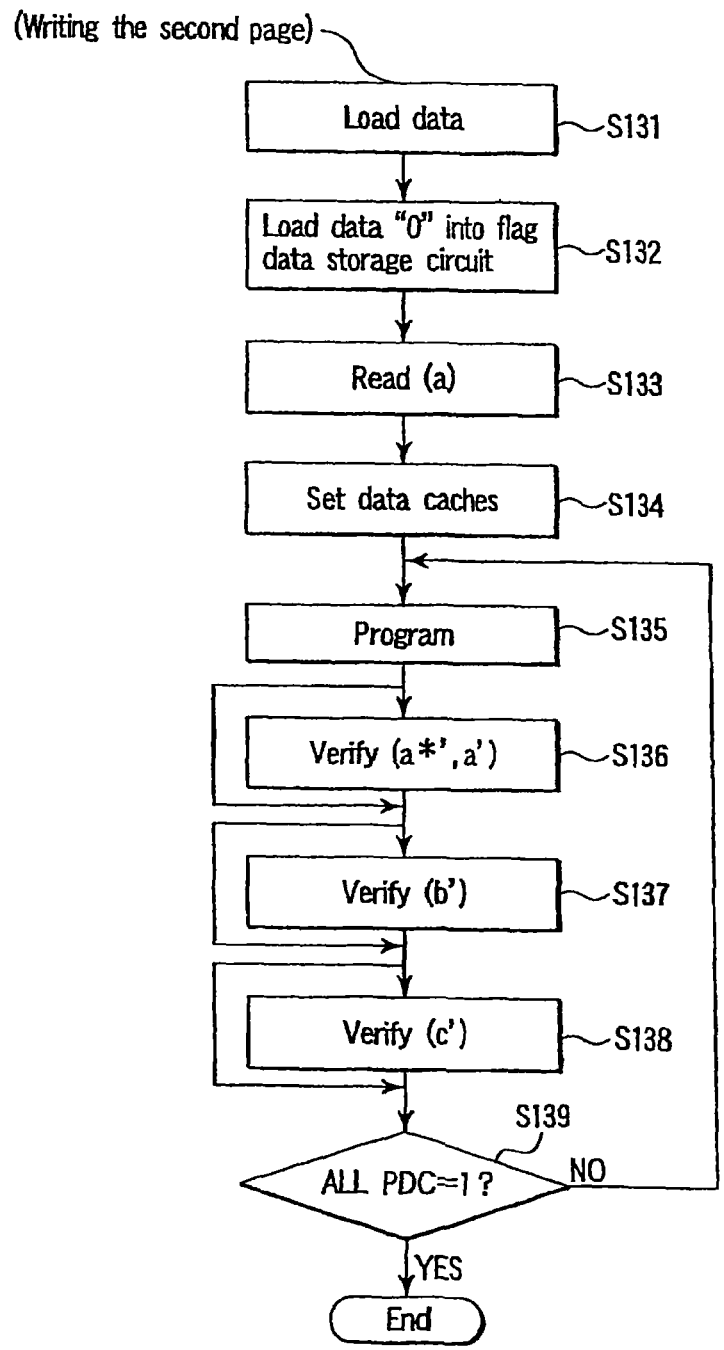
FIG. 28 is a flowchart to help explain the order in which a second page is written into in a seventh embodiment of the present invention.

FIGS. 28 and 29 show a seventh embodiment of the present invention obtained by modifying the fifth embodiment. In the fifth embodiment, writing is done to reach the verify potential "a*'" in writing the second page. Thereafter, a write operation with the verify potential "a'" and write operations with the threshold voltage "b'" and the threshold voltage "c'" are carried out simultaneously.

In the seventh embodiment, however, an intermediate potential is supplied to the bit line in a write operation and data is written into the cells whose threshold voltage has exceeded the verify potential "a*'". By doing this, the degree of variability of the threshold voltage in writing is made smaller, thereby making the threshold voltage distribution smaller.

FIG. 28 shows the sequence of writing in the seventh embodiment. FIGS. 29A to 33B show the workings of the data caches.

(a) The data inputted from the outside world is stored in the SDC and the data read by an internal data read is stored in the PDC (S131 to S134, FIG. 29). (b). The data caches are set as shown in FIG. 29B.

(c) With VREG=Vdd and REG=Vsg, when DDC=1, the bit line is precharged at Vdd. When DDC is at "0", the bit line is not precharged (FIG. 30A).

(d) With BLC1=intermediate potential+Vth (=2V+Vth) (Vclamp), when the PDC is at "0", the bit line is at Vss. When the PDC has "1" and precharging has been done, the bit line remains unchanged. If it is has not been precharged, the bit line is at an intermediate potential (2V) (FIG. 30B).

Here, with the selected word line at Vpgm and the unselected word line at Vpass, when the bit line is at Vdd, no writing is done. When the bit line is at Vss, writing is done. When the bit line is at an intermediate potential (2V), writing is done a little (S135).

(e) After the write operation is completed, while the word line is setting up, the data in the PDC is transferred to the DDC. Then, the data in the DDC is inverted and the resulting data is transferred to the PDC (see FIG. 30C).

(f) As shown in FIG. 31A, in an operation with the verify potential "a'" (S136), with BLC1 being high (e.g., Vdd+Vth) and BLCLAMP being at a specific potential, for example, 1V+Vth, only when the PDC is a "1" (that is, when data "1" has been written into the memory cell), the bit line is precharged. When the PDC is at "0", the bit line is not precharged (or remains at Vss). Next, the potential of the word line is set to the verify potential "a*'", thereby discharging the bit line. While the bit line is being discharged, the data in the PDC is inverted.

(g) With VPRE=Vdd and BLPRE=Vsg, the TDC is charged at Vdd. Thereafter, signal BLCLAMP is set to 0.9V+Vth, thereby turning on transistor 61*t*. When the bit line is at Vss, the TDC is at Vss. When the precharge potential is left on the bit line, the TDC is at Vdd. It is when data "1" has been written into the memory cell and the threshold voltage has reached the verify potential "a*'" that the TDC is at Vdd. When data "1" has not been written into the memory cell, the bit line has not been precharged, with the result that the TDC is at Vss. The TDC is also at Vss when data "1" has been written into the memory cell and the threshold voltage has not reached the verify potential "a*'".

Here, with VREG being high and REG being high, when the data in the DDC is at "1", the TDC is forced to be high. Therefore, it is when data "1" has been written into the memory cell and the threshold voltage has reached the verify potential "a*'" or when a write operation has not been selected that the TDC is at Vdd. Thereafter, with DTG=Vsg, the data in the PDC is copied into the DDC. Thereafter, with BLC1=Vsg, the PDC takes in the potential of the TDC (see FIG. 31B).

(h) Next, the potential of the word line is lowered a little to produce the verify potential "a'", thereby discharging the bit line (see FIG. 32A).

Thereafter, with VPRE=Vdd and BLPRE=Vsg, the TDC is charged again at Vdd. Then, signal BLCLAMP is set to 0.9V Vth, thereby turning on the transistor 61*t*. When the bit line is at Vss, the TDC is at Vss. When the precharge potential is left on the bit line, the TDC is at Vdd. It is when data "1" has been written into the memory cell and the verify potential "a'" has been reached that the TDC is at Vdd. When data "1" has not been written into the memory cell, the bit line has not been precharged. Thus, the TDC is at Vss. The TDC is also at Vss when data "1" has been written into the memory cell and the threshold voltage has not reached the verify potential "a'".

Here, with VREG being high and REG being high, when the data in the DDC is "1" (or when data "1" has not been written into the memory cell), the TDC is forced to be high. Thus, it is when data "1" has not been written into the Memory cell or when data "1" has been written into the memory cell and the threshold voltage has reached the verify potential "a'" that the TDC is at Vdd.

Thereafter, with DTG=Vsg, the data in the PDC is copied into the DDC. Then, with BLC1=Vsg, the PDC takes in the potential of the TDC.

(i) The data in the DDC is transferred to the PDC. Then, the data in the PDC is transferred to the DDC (see FIG. 32B).

(j) In a memory cell into which data "1" has been written, after all of the writing with the verify potential "a*'" is completed, the data in the PDC becomes "1" (see FIG. 33A).

(k) In a memory cell into which data "1" has been written, after all of the writing with the verify potential "a'" is completed, all of the data in the DDCs become "1" (see FIG. 33B).

(l) In an operation with the verify potential "b'" (see FIG. 2B, S137), BLC2 is made high (e.g., Vdd+Vth) and a specific potential, for example, 1V+Vth, is supplied as BLCLAMP. Then, only when the SDC is at "1" (that is, when data "1" or data "2" has been written into the memory cell), the bit line is precharged. When the SDC is at "0", the bit line is not precharged (or remains at Vss).

Next, the verify potential "b'" is supplied to the word line and the bit line is discharged. While the bit line is being discharged, the data in the DDC is transferred to the TDC. Then, the data in the PDC is transferred to the DDC. The data in the TDC is then transferred to the PDC. Thereafter, the TDC is charged at Vdd. Then, a specific potential, for example, 0.9V+Vth, is supplied as BLCLAMP. It is only when data "2" has been written into the memory cell and the threshold voltage has reached the verify potential "b'" that the TDC becomes high. With VREG being high and REG being at Vsg, when the data in the DDC is at the high level, the TDC is forced to be high. Therefore, it is when data "2" has been written into the memory cell and the threshold voltage has reached the verify potential "b'" or when a write operation has not been selected that the TDC is at Vdd. Thereafter, with DTG=Vsg, the data in the PDC is copied into the DDC. Then, with BLC1=Vsg, the PDC takes in the potential of the TDC.

(m) In an operation with the verify potential "c'" (see FIG. 28, S138), BLPRE is made high (e.g., Vdd+Vth) and a specific potential, for example, 1V+Vth, is supplied as BLCLAMP. Under these conditions, the bit line is precharged. Next, the verify potential "c'" is supplied to the word line and the bit line is discharged. While the bit line is being discharged, the data in the DDC is transferred to the TDC. Then, the data in the PDC is transferred to the DDC. The data in the TDC is then transferred to the PDC. Thereafter, the TDC is charged at Vdd. Then, a specific potential, for example, 0.9V+Vth, is supplied as BLCLAMP. It is only when the threshold voltage of the memory cell has reached the verify potential "c'" that the TDC becomes high. With VREG being high and REG being at Vsg, when the data in the DDC is at the high level, the TDC is forced to be high. Therefore, it is when data "3" has been written into the memory cell and the threshold voltage has reached the verify potential "c'" or when a write operation has not been selected that the TDC is at Vdd. Thereafter, with DTG=Vsg, the data in the PDC is copied into the DDC. Then, with BLC1=Vsg, the PDC takes in the potential of the TDC.

In this way, the program and verify operations are repeated until all of the data in the PDC and the DDC have become "1" (S139).

In the seventh embodiment, a cell whose threshold voltage has exceeded the verify potential "a*'" is written into in a write operation by supplying an intermediate potential to the bit line. Therefore, the degree of variability in a write operation can be made smaller and therefore the threshold voltage distribution can be made smaller. As a result, a high-speed write operation can be carried out.

Eighth Embodiment

Figure 34:
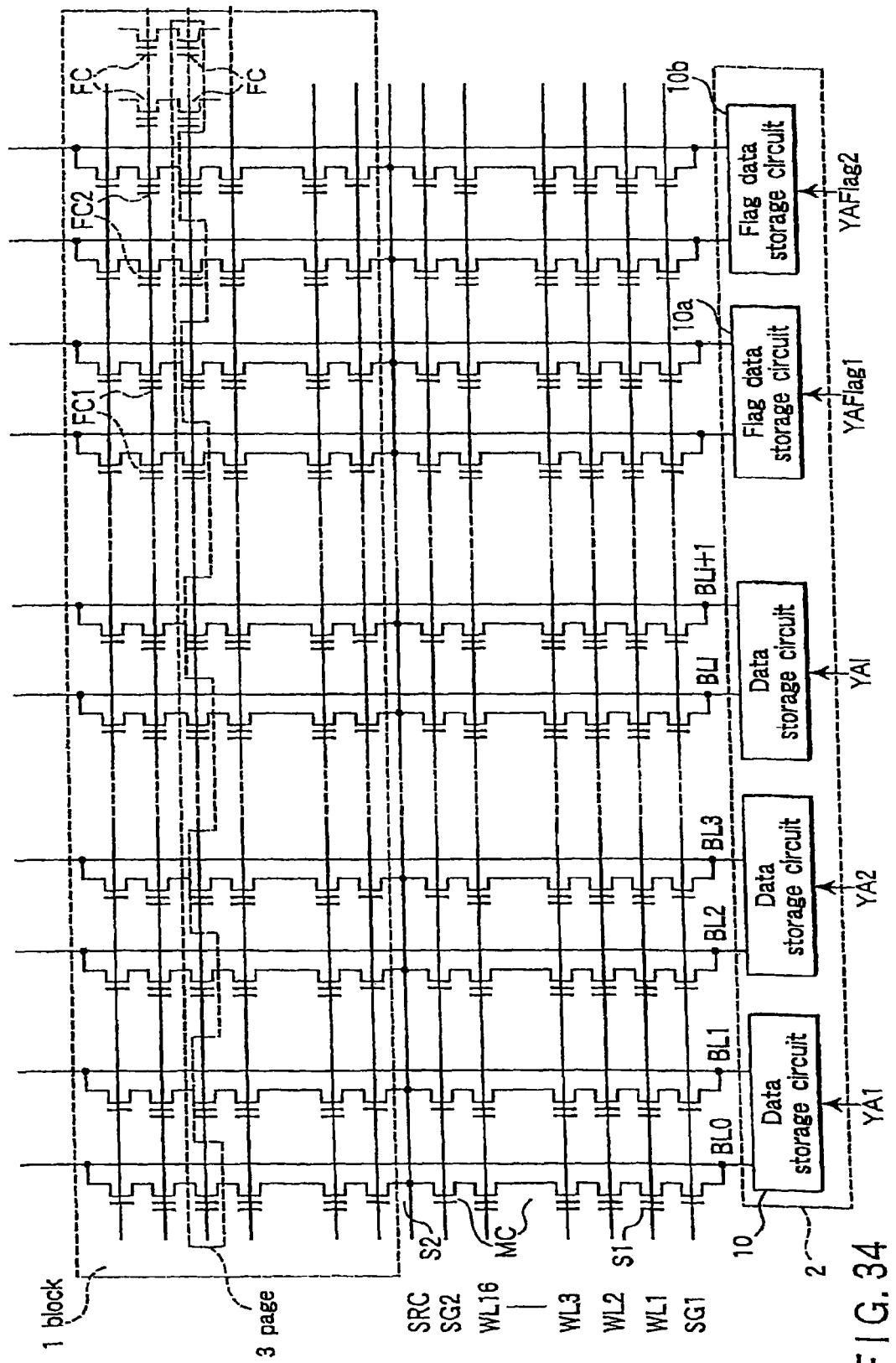
FIG. 34 is a circuit diagram of a memory cell array and a bit line control circuit according to an eighth embodiment of the present invention.

FIG. 34 shows a memory cell array 1 and a bit line control circuit 2 in a NAND flash memory for storing eight-valued (3-bit) data according to an eighth embodiment of the present invention. Because the configuration of FIG. 34 is almost the same as the four-valued (2-bit) configuration of FIG. 3, what differs from the latter will be explained.

In FIG. 34, when one word line is selected according to an external address, one sector shown by a broken line is selected. One sector is composed of three pages. The three pages are switched according to an address. That is, since 3-bit data can be stored in a memory cell, three bits are switched according to an address (a first page, a second, page, or a third page). One sector has two flag cells FC1, FC2. Therefore, when one word line is selected, two flag cells FC1, FC2 are selected simultaneously. The flag cells FC1, FC2 are connected via bit lines to flag data storage circuits 10$a$, 10$b$, respectively. The flag cell FC1 stores the fact that the second page has been written. The flag cell FC2 stores the fact that the third page has been written.

However, since one cell can store 3-bit data, one flag cell may store the fact that the second page and third page have been written, instead of using the two flag cells.

Furthermore, to increase the reliability, a plurality of flag cells FC1 and FC2 may be provided. In this case, the same data is stored in these flag cells, and the data read from the flag cells is determined by a majority decision in a read operation.

The operation of the eighth embodiment will be explained.

The erase operation is the same as in the case of four-valued data.

Figure 35A:
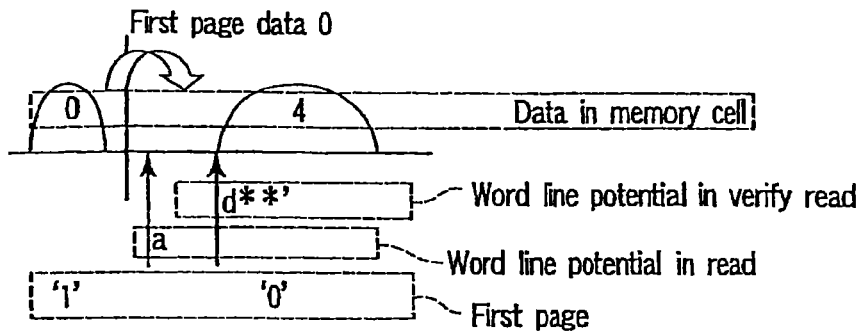
FIGS. 35A, 35B, and 35C show the relationship between the data in a memory cell and the threshold voltages of the memory cell in the eighth embodiment.
Figure 35B:
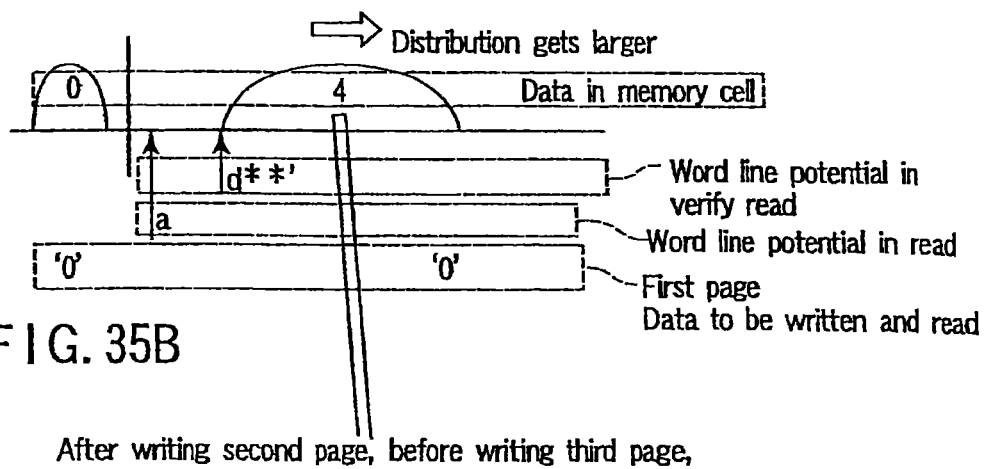
Figure 35C:
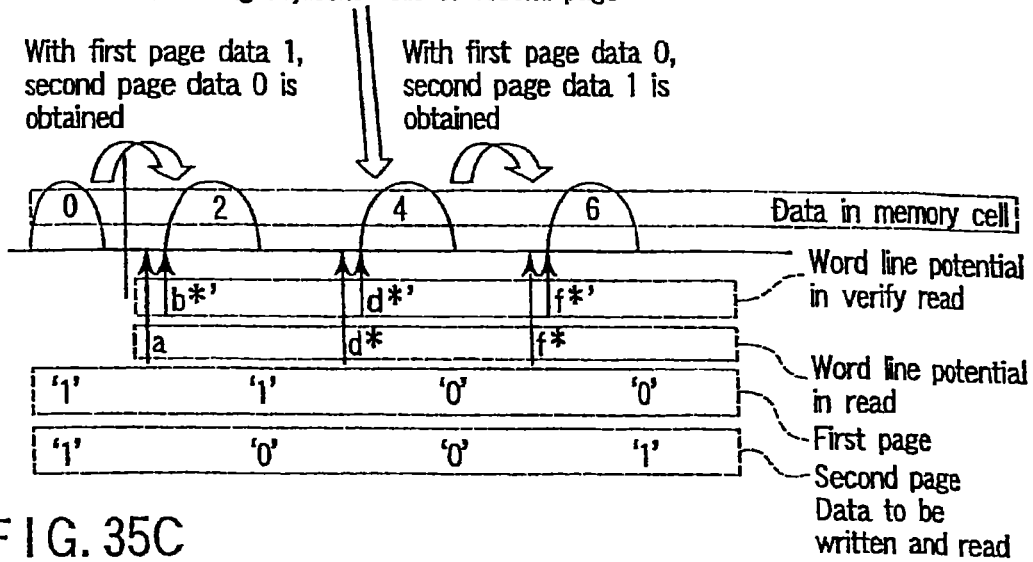
Figure 36A:
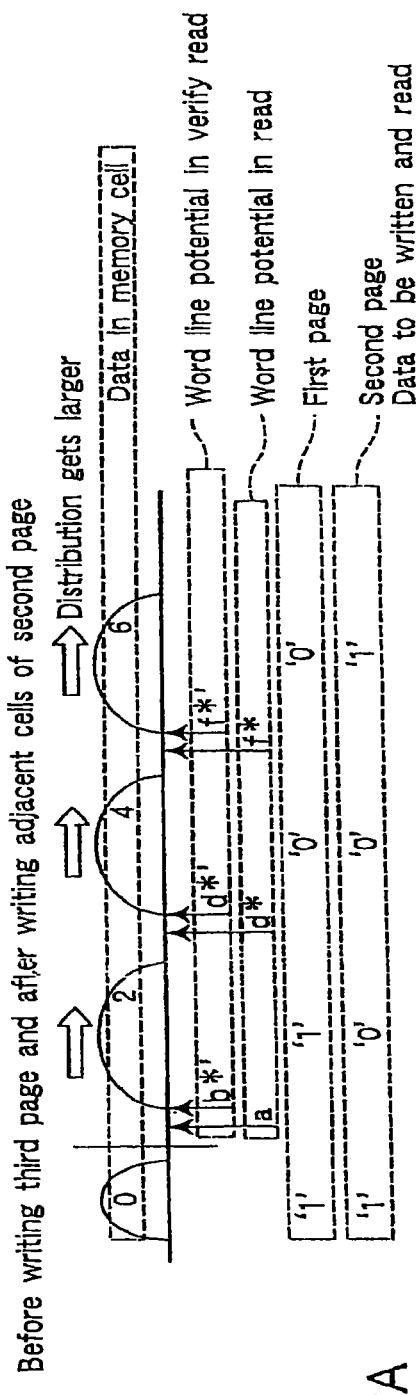
FIGS. 36A and 36B show the relationship between the data in a memory cell and the threshold voltages of the memory cell in the eighth embodiment.
Figure 36B:
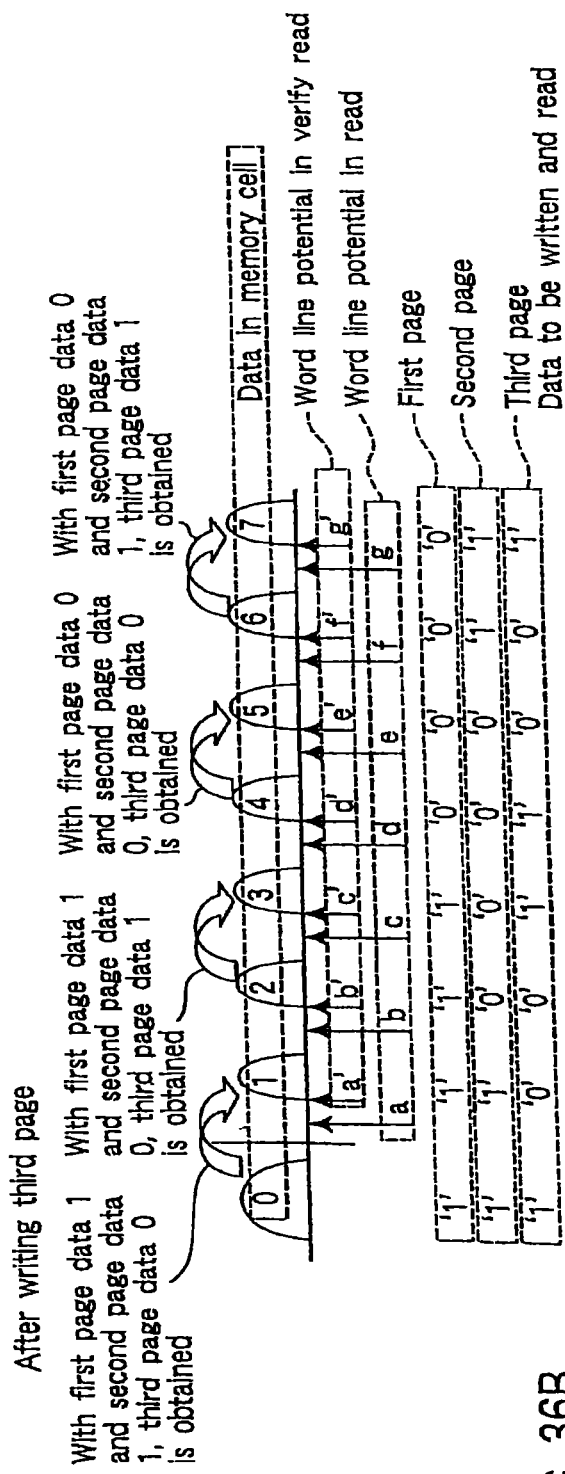

FIGS. 35 and 36 show the relationship between the data in a memory cell and the threshold voltages of the memory cell. After an erase operation is carried out, the data in the memory cell becomes "0" as shown in FIG. 35A. After a first page is written, the data in the memory cell become data "0" and data "4" (FIG. 35B). After a second page is written, the data in the memory cell become "0", "2", "4", and "6" (FIGS. 35C and 36A). After a third page is written, the data in the memory cell become data "0" to data "7" (FIG. 36B). In the eighth embodiment, the data in the memory cell are defined in ascending order of threshold voltage.

Figure 37A:
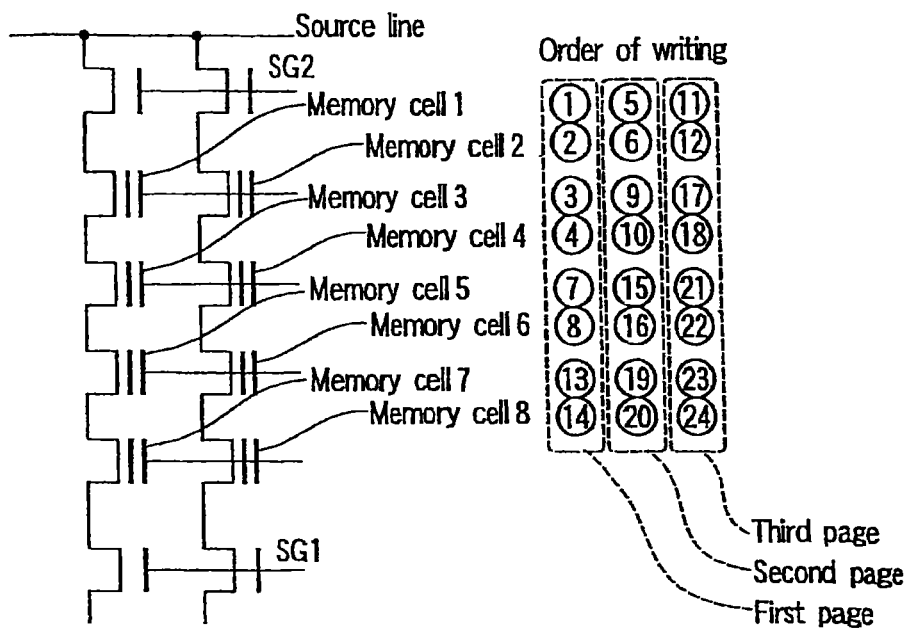
FIGS. 37A and 37B are diagrams to help explain the order in which data is written into a memory cell in the eighth embodiment.
Figure 37B:
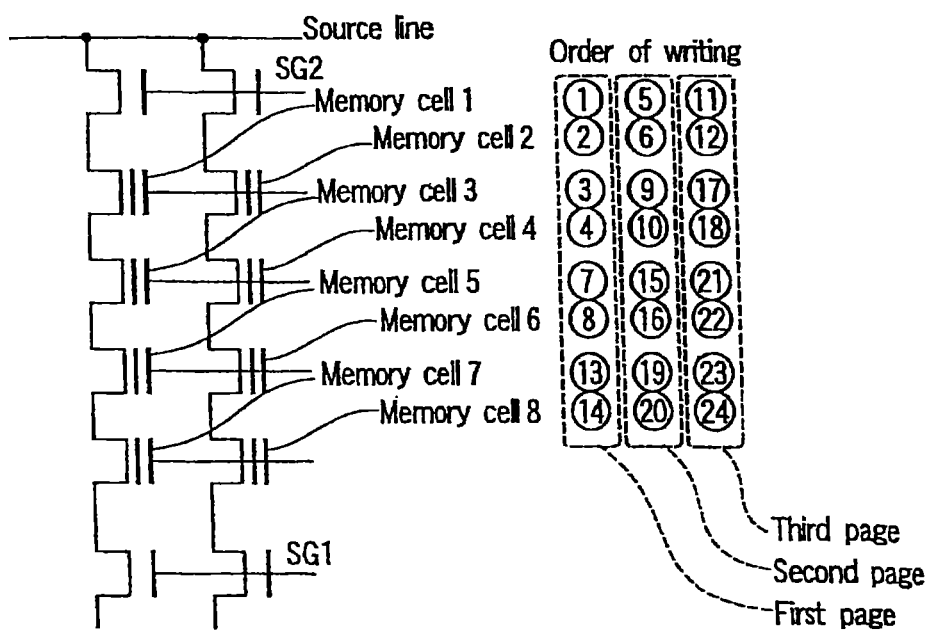

FIGS. 37A and 37B show two write sequences in the eighth embodiment. In a block, a write operation is carried out in pages, starting with the memory cell closest to the source line. In FIGS. 37A and 37B, for the sake of explanation, the number of word lines is assumed to be four. The Write sequence shown in FIG. 37A is similar to that shown in FIG. 7. In contrast, the write sequence shown in FIG. 37B differs a little from that shown in FIG. 37A. Specifically, after the first page is written, up to the second page is written into the same cells, instead of writing the second page into the adjacent cells. Thereafter, before the third page is written, up to the second page is written into the adjacent cells. Then, the third page is written. In this way, writing may be done, taking into account the effect of the adjacent cells on the third page.

It is assumed that the original read potentials of word lines of the third page are "a", "b", "c", "d", "e", "f", and "g" and the verify potentials are "a'", "b'", "c'", "d'", "e'", "f'", and "g'". It is assumed that the read potentials of the second page are "b*'" (="a"), "d*", and "f*'" lower than the original read potentials and the verify potentials of the second page are "b*'", "d*'", and "f*'" a little lower than these potentials. The verify potential of the first page is a potential of "d*'" (="a") lower than the original read potential and the verify potential of the first page is a potential of "d**'" a little higher than the verify potential of the first page.

(Program and Program Verify)

In a program operation, an address is first specified to select three pages shown in FIG. 34. In the memory, of the three pages, a program operation can be carried out only in this order: the first page, the second page, the third page. Therefore, the first page and second page programs are the same as in the case of four-valued data.

The data in a four-valued memory cell and the threshold voltages of the memory cell shown in FIGS. 35A to 35C correspond to FIGS. 1A to 1C. The program and program verify flowcharts are the same as those in FIGS. 8 and 9, so they are omitted. Here, the data in the memory cell are defined as "0", "1", "2", and "3" and the potentials of the word line are "a", "b", and "c" in the case of four-valued data, whereas the data in the memory cell are defined as "0", "2", "4", and "6" and the potentials of the word line are "b", "d", and "f" in the case of eight-valued data.

(First Page Program)

The flowchart diagram for the first page program is the same as in FIG. 8 except that the definition of the word line potentials are changed as described above.

(Adjacent Cell Program)

As shown in FIG. 37A, after one bit of data is written into the first page of memory cell 1, the first page of memory cell 2 adjacent to memory cell 1 in the direction of word is written into. Then, the first page of memory cell 3 adjacent to memory cell 1 in the direction of bit is written into and the first page of memory cell 4 adjacent to memory cell 1 in a diagonal direction is written into. After these write operations have been carried out, the threshold voltage of memory cell 1 rises due to the FG-FG capacitance, depending on the written data. As a result, the distribution of the threshold voltages of data "0" and data "4" in memory cell 1 expands toward higher threshold voltages as shown in FIG. 35B.

Thereafter, one bit of data is written into the second page of memory cell 1.

(Second Page Program)

The flowchart for the second page program is the same as the flowchart for writing by the pass write method in FIG. 9 expect that the definition of the word line potentials is changed. The data in the data caches after a data load and an internal read and the data in the data caches after the data caches are set are the same as those in FIGS. 10A and 10B. Data is written into the first flag cell FC1.

(Adjacent Cell Program)

As shown in FIG. 37A, after data is written into the first and second pages of memory cell 1, data is written into the second page of memory cell 2, the first paged of memory cells 5 and 6, and the second page of memory cells 3 and 4. After these write operations have been carried out, the threshold voltage of memory cell 1 rises due to the FG-FG capacitance, depending on the written data. As a result, the distribution of the threshold voltages of data "2", data "4", and data "6" in memory cell 1 expands as shown in FIG. 36A.

Thereafter, one bit of data is written into the third page of memory cell 1.

(Third Page Program)

Figure 38:
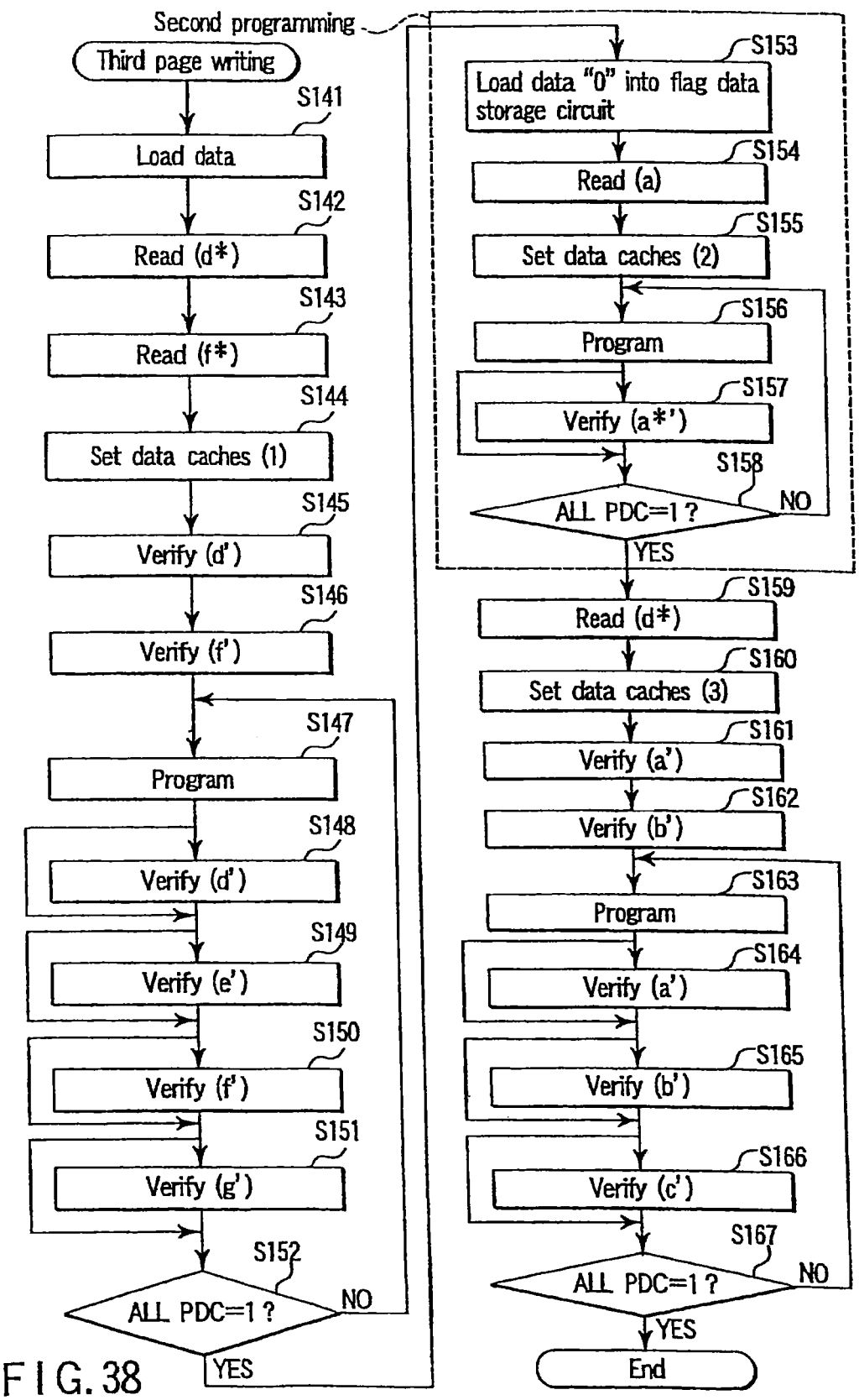
FIG. 38 is a flowchart for the operation of programming a third page in the eighth embodiment.

FIG. 38 is a flowchart for programming the third page. In the operation of programming the third page, an address is first specified to select three pages shown in FIG. 34.

Next, the write data is inputted from the outside world and stored in the SDCs of all the data storage circuits (S141). When data "1" (to do no writing) is inputted, the SDC of the data storage circuit 10 shown in FIG. 6 goes high. When data "0" (to do writing) is inputted, the SDC goes low. Thereafter, when a write command is inputted, because the third page is to be programmed, data "0" is inputted to the SDCs in the flag cell data storage circuits 10a, 10b to write data into the flag cell FC2.

In programming the third page, as shown in FIG. 36B, with the data in the memory cell being "0", the data in the memory cell is kept at "0" when the input data is "1", whereas the data in the memory cell is made "1" when the input data is "0".

With the data in the memory cell being "2", when the input data is "0", the data in the memory cell is kept at "2". However, in writing the second page, the verify potential "b*'" lower than the original value is used when it is verified whether the data in the memory cell has reached "2". For this reason, a memory cell in which data "2" has been stored is written into until a potential of "b'", the original verify potential, has been reached. With the data in the memory cell being "2", when the data inputted from the outside world is "1", the data in the memory cell is made "3".

With the data in the memory cell being "4", when the input data is "1", the data in the memory cell is kept at "4". However, in writing the second page, the verify potential "d*'" lower than the original value is used when it is verified whether the data in the memory cell has reached "4". For this reason, a memory cell in which data "4" has been stored is written into until a potential of "d'", the original verify potential, has been reached. With the data in the memory cell being "4", when the input data is "0", the data in the memory cell is made "5".

With the data in the memory cell being "6", when the input data is "0", the data in the memory cell is kept at "6". However, in writing the second page, the verify potential "f*'" lower than the original value is used when it is verified whether the data in the memory cell has reached "6". For this reason, a memory cell in which data "6" has been stored is written into until a potential of "f'", the original verify potential, has been reached. With the data in the memory cell being "6", when the input data is "1", the data in the memory cell is made "7".

(First Third Page Programming)

In programming the third page, data "1" to data "7" are written into the memory cell.

Although these data items can be programmed simultaneously, four data items, data "4" to data "7" are first written into the memory cell in the eighth embodiment. In programming by the pass write method, a memory cell into which data "1" is to be written has not been written at all. For this reason, a memory cell into which data "1" is to be written is written into roughly. Thereafter, memory cell data "1" to memory cell data "3" are written. Hereinafter, a concrete explanation will be given.

(Internal Data Read 1 and Data Cache Setting 1) (S142 to S144)

Before the cells are written into, it is determined whether the data in the memory cell of the second page is "4" or "6" or is "0" or "2", or whether the data in the memory cell is "6" or not or the data is any one of "0", "2", and "4". To do this, the potential of the word line is set to "d*'" and "f*'" in that order, thereby carrying out an internal read operation (S142, S143).

FIG. 39A shows the state of the data caches after an internal read. Thereafter, by manipulating the data caches, the data caches are set as shown in FIG. 39B (S144).

In FIG. 39B, when the data in the memory cell is made "0" to "3", the PDC is set high. When the data in the memory cell is made "4", the PDC is set low, the DDC is set low, and the SDC is set high. When the data in the memory cell is made "5", the PDC is set low, the DDC is set high, and the SDC is set high. When the data in the memory cell is made "6", the PDC is set low, the DDC is set high, and the SDC is set low. When the data in the memory cell is made "7", each of the PDC, DDC, and SDC is set low.

(Third Page Verify: Verifies Data "4") (S145)

In a memory cell into which data "4" is to be written, writing is done on the second page until the verify potential "d*'" lower than the original verify potential "d'" has been reached. Thereafter, the threshold voltage of the cell into which data "4" has been written may have risen as a result of writing the adjacent cells. In addition, there may be cells whose verify potential has reached the original verify potential "d'". For this reason, data "4" is first verified.

In a program verify operation to determine whether the threshold voltage of the memory cell has reached data "4", a potential of "d'" a little higher than the read potential "d" is supplied to the selected word line.

First, a read potential Vread is supplied to the unselected word lines and select line SG1 in the selected block. In this state, signal BLCLAMP of the data storage circuit 10 shown in FIG. 6 is set to, for example, 1V+Vth and signal BLC2 is set to a specific voltage, for example, Vdd+Vth. Under these conditions, the bit line is precharged. As a result, the bit line is prevented from being precharged, when data "7" and data "6" are written into the memory cell. Only when data "0" to data "5" are written into the memory cell, the bit line is precharged.

Next, with signal VREG being at Vss and signal REG being high, when data "6" and data "5" are written into the memory cell, the precharged potential becomes Vss. That is, it is only when data "0", data "3", and data "4" are written into the memory cell that the bit line is precharged. Next, select line SG2 on the source side of the cell is made high. Since the cells whose threshold voltage is higher than "d'" turn off, the bit line remains high. In addition, since the cells whose threshold voltage is lower than "d'" turn on, the bit line is at Vss. While the bit line is being discharged, node N3 of the TDC is set to Vss temporarily and signal REG is made high, thereby turning on the transistor 61q, which causes the data in the DDC to be transferred to the TDC. Then, the DTG is turned on temporarily, causing the data in the PDC to be transferred to the DDC. Thereafter, the data in the TDC is transferred to the PDC.

Next, signal BLPRE is set to a specific voltage, for example, Vdd+Vth, thereby precharging node N3 of the TDC at Vdd. Thereafter, signal BLCLAMP is set to 0.9V+Vth, thereby turning on the transistor 61t. When the bit line is at the low level, node N3 of the TDC is at the low level. When the bit line is at the high level, node N3 of the TDC is at the high level. Here, when writing is done, the low level has been stored in the DDC. When no writing is done, the high level has been stored in the DDC. Therefore, when signal VREG is set to Vdd and signal REG is made high, the node of the TDC is forced to be high only when no writing is done. After this operation, the data in the PDC is transferred to the DDC and the potential of the TDC is read into the PDC. It is only when no writing is done or when data "4" has been written into the memory cell and the threshold voltage of the cell has reached the threshold voltage "d" that the high level is latched in the PDC. It is when the threshold voltage of the cell has not reached "d'" or when data "7", "6", and "5" have been written into the memory cell that the low level is latched in the PDC.

(Third Page Verify: Verifies Memory Data "6") (S146)

In a memory cell into which data "6" is to be written, writing is done on the second page until the verify potential "f*'" lower than the original verify potential "f'" has been reached. Thereafter, the threshold voltage may have risen as a result of writing the adjacent cells. In addition, there may be cells whose verify potential has reached the original verify potential "f'". For this reason, data "6" is first verified.

The operation of verifying data "6" is identical with the operation of verifying data "4" in writing the second page (data "2" in writing the second page in the first to seventh embodiments). Here, the verify potential is "f'".

(Program Operation) (S147)

The program operation is identical with the program operations for the first and second pages. Specifically, when data "1" has been stored in the PDC, no writing is done. When data "0" has been stored in the PDC, writing is done. Thereafter, data "4" to data "7" are verified. Since the operations of verifying data "4" and data "6" (S148, S150) are the same as those in S145 and S146, explanation of them is omitted.

(Third Page Verify: Verifies Memory Cell Data "5") (149)

The operation of verifying data "5" is identical with the operation of verifying data "2" in writing the second page (data "1" in writing the second page in the first to seventh embodiments). Here, the verify potential is "e'".

(Third Page Verify: Verifies Memory Cell Data "7") (151)

The operation of verifying data "7" is identical with the operation of verifying data "6" in writing the second page (data "3" in writing the second page in the first to seventh embodiments). Here, the verify potential is "g'".

When the PDC is low, the write operation is carried out again and the program operation and the verify operation are repeated until the data in the PDCs of all of the data storage circuits have become high (S152).

In the above explanation, after one programming is completed, four verify operations are carried out. In the initial loop of the programming, the threshold voltage of the memory cell does not rise. Therefore, the operations of verifying data "7", of verifying data "7" and data "6", and of verifying data "7", data "6", and data "5" may be omitted.

Furthermore, in a loop close to the end of the programming, the operations of verifying data "4", of verifying data "4" and data "5", and of verifying data "4", data "5", and data "6" may be omitted.

(Second Programming) (S153 to S158)

In programming by the pass write method, a memory cell into which data "1" is to be written has hot been written into at all. For this reason, the memory cell is written into roughly as described above. When programming is not done by the pass write method, the second programming may be omitted.

In the second programming, data "0" is stored into the flag data storage circuit 10b (S153).

(Internal Data Read 2 and Data Cache Setting 2) (S154, S155)

Before the memory cells are written into, the potential of the word line is set to "a" and an internal read operation is carried out to determine whether the data in the memory cell of the second page is "0" or is "2", "4", or "6" (S154). Thereafter, by manipulating the data caches, the data caches are set as shown in FIG. 40A (S155).

Specifically, when the data in the memory cell is made "1", the PDC is set low. When the data in the memory cell is set to a value other than "1", the PDC is set high.

In this state, a program operation is carried out (S156).

(Third Page Verify: Verifies Data "1") (S157)

The operation of verifying data "1" is identical with the operation of verifying data "5" in writing the third page and data "2" in writing the second page (data "1" in writing the second page in the first to seventh embodiments). Here, the verify potential is "a*'" (S157).

When the PDC is low, the write operation is carried out again and the program operation and the verify operation are repeated until the data in the PACs of all of the data storage circuits have become high (S158).

(Third Programming)

Finally, data "1", "2", and "3" are written into the memory cell as follows.

(Internal Data Read 3 and Data Cache Setting 3) (S159, S160)

First, before the memory cells are written into, the potential of the word line is set to "d*'" and an internal read operation is carried out to determine whether the data in the memory cell of the second page is "0" or "2" or is "4" or "6" (S159).

Thereafter, by manipulating the data caches, the data caches are set as shown in FIG. 40B (S160). Specifically, when the data in the memory cell is made "0", the PDC is set high, the DDC is set low, and the SDC is set high. When the data in the memory cell is made "1", the PDC is set low, the DDC is set high, the SDC is set high. When data in the memory cell is made "2", the PDC is set low, the DDC is set high, and the SDC is set low. When the data in the memory cell is made "3", the PDC is set low, the DDC is set low, and the SDC is set low. When the data in the memory cell is set to "4" to "7", all of the PDCs are set high.

(Third Page Verify: Verifies Memory Cell Data "1") (S161)

In programming by the pass write method, a memory cell into which data "1" is to be written has been written into in the second programming until the verify potential "a*'" lower than the original verify potential "a'" has been reached. Therefore, there may be cells whose verify potential has reached the original verify potential "a'". For this reason, data "1" is first verified. The operation of verifying data "1" is identical with the operation of verifying data "5" in writing the third page and data "2" in writing the second page (data "1" in writing the second page in the first to seventh embodiments). Here, the verify potential is "a'".

(Third Page Verify: Verifies Memory Cell Data "2") (S162)

In a memory cell into which data "2" is to be written, the second page is written until the verify potential "b*'" lower than the original verify potential "b'" has been reached. Thereafter, the threshold voltage may have risen as a result of writing the adjacent cells. In addition, there may be cells whose verify potential has reached the original verify potential "b'". For this reason, data "2" is first verified.

The operation of verifying data "2" is identical with the operation of verifying data "6" in writing the third page and the operation of verifying data "2" in writing the second page (data "1" in writing the second page in the first to seventh embodiments). Here, the verify potential is "b'".

(Program Operation) (S163)

The program operation is identical with the first and second program operations for the first, second, and third pages. When data "1" has been stored in the PDC, the memory cell is not written into. When data "0" has been stored in the PDC, the memory cell is written into.

Thereafter, the verify potentials "a'" and "b'" are set in that order and data "1" and data "2" are verified (S164, S165). At the same time, data "3" is verified as described below.

(Third Page Verify: Verifies Data "3") (166)

The operation of verifying data "3" is identical with the operation of verifying data "7" in writing the third page and the operation of verifying data "6" in writing the second page (data "3" in writing the second page in the first to seventh embodiments). Here, the verify potential is "c'".

When the PDC is low, the write operation is carried out again and the program operation and verify operations are repeated until the data in the PDCs of all the data storage circuits have become high (S167).

In the above explanation, after one programming is completed, four verify operations are carried out. In the initial loop of the programming, since the threshold voltage does not rise, the operations of verifying data "3" and of verifying data "3" and data "2" may be omitted.

Furthermore, in a loop close to the end of the programming, data "1" has been written or data "2" and data "1" have been written. Therefore, the verify operations for them may be omitted. If the operation of verifying data "1" is not needed, it is not necessary for the SDC to store the data. Therefore, the data for next writing may be read from the outside world and stored in the SDC. This configuration enables a much higher-speed operation.

Furthermore, on the second pages, data is written into the flag cell FC1. Only on the third page, data is written into the flag cell FC2.

(First Page Read)

Figure 41B:
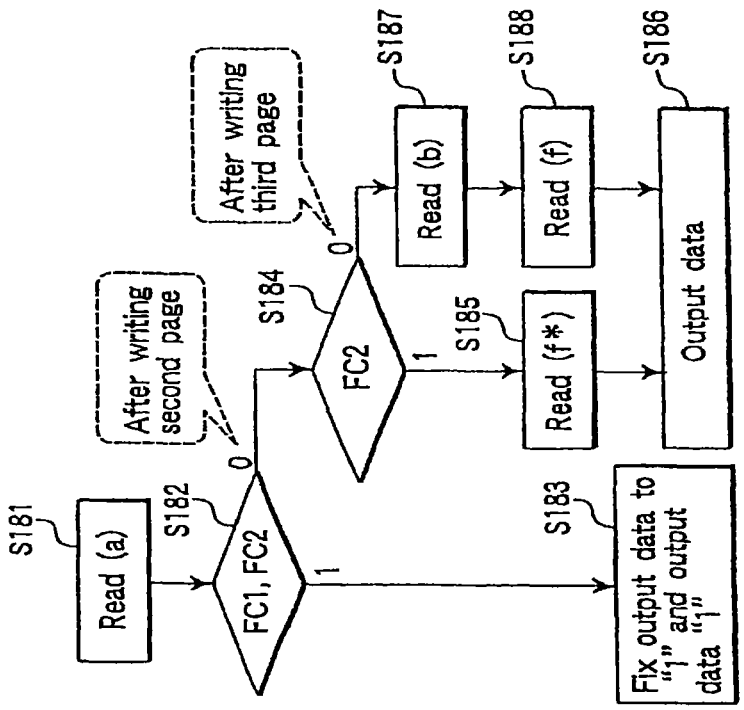
FIG. 41A is a flowchart for the operation of reading a first page in the eighth embodiment and FIG. 41B is a flowchart for the operation of reading a second page.
Figure 41A:
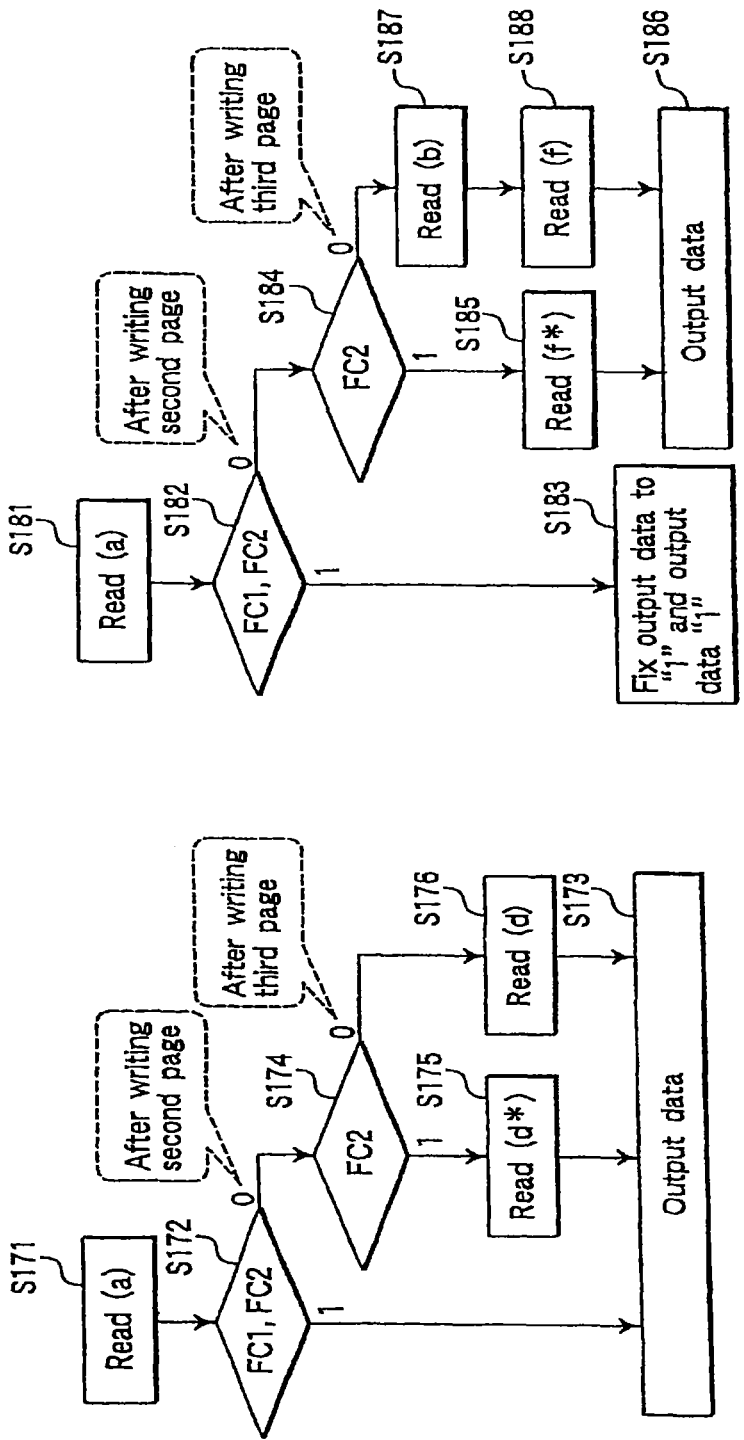

FIG. 41A is a flowchart for the operation of reading the first page.

First, an address is specified to select three pages shown in FIG. 34. As shown in FIGS. 35A to 35C and FIGS. 36A and 36B, the distribution of the threshold voltage has changed before and after the writing of the second page and before and after the writing of the third page. Therefore, after the potential of the word line is set to "a", a read operation is carried out and it is determined whether the flag cell has been written into (S171, S172). In this determination, if more than one flag cell is used, the determination is made by a majority decision.

When both of the data items read from the flag cells FC1, FC2 are "1" (or none of the flag cells FC1, FC2 have been written into), the writing of the second and third pages has not been carried out. As a result, the distribution of the threshold voltage of the cell is as shown in FIG. 35A or 35B. To determine the data in such cells, a read operation has to be carried out with the potential of the word line at "a". The result of the read operation with the word line potential "a" has been already read into the data storage circuit. Therefore, the data stored in the data storage circuit is outputted (S173).

When the data in the flag cell FC1 is "0" and the data in the flag cell FC2 is "1" (or when the flag cell FC1 has been written into and the flag cell FC2 has not been written into), the data has been written into the second page and the data has not been written into the third page. As a result, the cell threshold voltage distribution is as shown in FIG. 35C or FIG. 36A. To determine the data on the first page of such cells, a read operation has only to be carried out with the potential of the word line at "d*". After the read operation is carried out with the word line potential "d*", the data is outputted (S174, S175, S173).

When both of the data items in the flag cells FC1, FC2 are "0" (or both of the flag cells FC1, FC2 have been written into), the data has been written into the second and third pages. Therefore, the cell threshold voltage distribution is as shown in FIG. 36B. To determine the data on the first page of such cells, the potential of the word line is set to "d" and a read operation is carried out. Then, the data read in the read operation is outputted (S172, S174, S176, S173).

(Second Page Read)

FIG. 41B is a flowchart for the operation of reading the second page. In reading the second page, an address is first specified to select three pages shown in FIG. 34. Thereafter, the potential of the word line is set to "a" and a read operation is carried out (S181). Then, it is determined whether data has been written into the flag cells FC1, FC2 (S182). In the determination, if more than one flag cell is used, the determination is made by a majority decision.

When both of the data items read from the flag cells FC1, FC2 are "1" (or none of the flag cells FC1, FC2 have been written into), the data has not been written into the second and third pages. Therefore, the output data is fixed to "1" (S183).

When the data in the flag cell FC1 is "0" and the data in the flag cell FC2 is "1" (or when the flag cell FC1 has been written into and the flag cell FC2 has not been written into), the data has been written into the second page and the data has not been written into the third page. As a result, the cell threshold voltage distribution is as shown in FIG. 35C or FIG. 36A. To determine the data on the first page of such cells, a read operation is carried out with the potential of the word line at "a" and at "f*". The result of reading with the word line potential "a" has been already loaded into the data storage circuit. Therefore, after a read operation is carried out with the word line potential set to "f*", the read-out data is outputted (S185, S186).

When both of the data items in the flag cells FC1, FC2 are "0" (or both of the flag cells FC1, FC2 have been written into), the data has been written into the second and third pages. Therefore, the memory cell threshold voltage distribution is as shown in FIG. 36B. To determine the data on the first page of such cells, the potential of the word-line is set to "b" and "f" and a read operation is carried out. That is, after a read operation is carried out, with the potential of the word line being set to "b", a read operation is carried out, with the potential of the word line being set to "f". Then, the read-out data is outputted (S187, S188, S186).

(Third Page Read)

FIG. 42 is a flowchart for the operation of reading the third page. In this case, too, an address is first specified to select three pages shown in FIG. 34. The distribution of the threshold voltage has changed before and after the writing of the third page. Therefore, after the potential of the word line is set to "a", a read operation is carried out and it is determined whether data has been written into the flag cells FC1 and FC2 (S191, S192).

When both of the data items in the flag cells FC1, FC2 are "1" (or data has been written into none of the flag cells FC1, FC2), the third page has not been written into. Therefore, the output data is fixed to "1" (S193).

When the data in the flag cell FC1 is "0" and the data in the flag cell FC2 is "1" (or when data has been written into the flag cell FC1 and no data has been written into the flag cell FC2), the data has not been written into the third page. Therefore, the output data is fixed to "1" (S194, S193).

When both of the data items in the flag cells FC1, FC2 are "0" (or data has been written into both of the flag cells FC1, FC2), the data has been written into the second and third pages. Therefore, the memory cell threshold voltage distribution is as shown in FIG. 36B. To determine the data on the first page of such memory cells, the potential of the word line is set to "a", "c", "e", and "g" and a read operation is carried out. The result of reading with the word line potential "a" has been already loaded into the data storage circuit. Therefore, the potential of the word line is set to "c", "e", and "g" in that order and a read operation is carried out. Then, the read-out data is outputted (S195, S196, S197, S198).

(Erase)

Since an erase operation is the same as in the first to seventh embodiments, its explanation will be omitted.

According to the eighth embodiment, it is possible to write and read eight-valued (3-bit) data reliably at a high speed.

With the eight-valued (3-bit) NAND flash memory of the eighth embodiment, in writing the third page, data "4" to data "7" are written in the first writing, data "1" is written roughly in the second writing, and data "1" to data "3" are written in the third writing. However, the present invention is not limited to this. For instance, data "2", "4", and "6" may be written first and then data "1", "3", "5", and "7" be written.

This way of writing also produces the same effect as that of the eighth embodiment.

Ninth Embodiment

In the sixth embodiment, when the DDC has data "1" in it in FIG. 27A, an intermediate potential is supplied to the bit line. When the PDC has data "0" in it, the bit line is discharged to Vss. In contrast, a ninth embodiment of the present invention eliminates that operation in writing a second page. The write sequence in the ninth embodiment is the same as that in the flowchart shown in FIG. 28. The operation of the data cache is as shown in FIG. 43A to FIG. 46.

(a) First, externally inputted data is loaded into the SDC and the data read in an internal data read is stored into the PDC. FIG. 43A shows the relationship between the data in the SDC and PDC and the data in the memory cell after a data load and an internal read. The PDC represents the data in a lower page (a first page) and the SDC represents the data in an upper page (a second page).

(b) Thereafter, operations as shown in FIGS. 11 and 12 are carried out, thereby setting the data cache (FIG. 43B). In the case of the data cache setting as shown in FIG. 27A, to write data "1" into a memory cell, data "1" has been set in the DDC. In contrast, to write data "1" into a memory cell in the ninth embodiment, data "0" is set in the DDC.

Then, the data is written into the memory cell. First, if BLC1=Vsg, when the PDC has data in it, the bit line is at Vss, whereas when the PDC has data "1" in it, the bit line is at Vdd. Next, let BLC1=VSS, and then let VREG=Vdd and REG=intermediate potential Vth(1V+Vth). Then, when the DDC has data "1" in it, the bit line is at Vdd. When the DDC has data "0" in it, the bit line is not precharged. As a result, only when data "1" or "3" has been written into the memory cell, the bit line is at Vss. When data "2" has been written into the memory cell), the bit line is at the intermediate potential (1 V). When the data in the memory cell is "0" (or when no data has been written into the memory cell), the bit line is at Vdd. Here, if the selected word line is Vpgm and the unselected word line is Vpass, when the bit line is at Vdd, no writing is done. When the bit line is at Vss, writing is done. When the bit line is at the intermediate potential (1 V), writing is done a little. Accordingly, a memory cell into which data has been written may not be written into heavily.

Figure 47A:
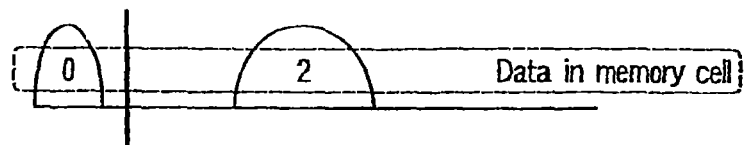
FIGS. 47A and 47B show the relationship between data of the memory cell and the threshold voltages of the memory cell in ninth embodiment.
Figure 47B:
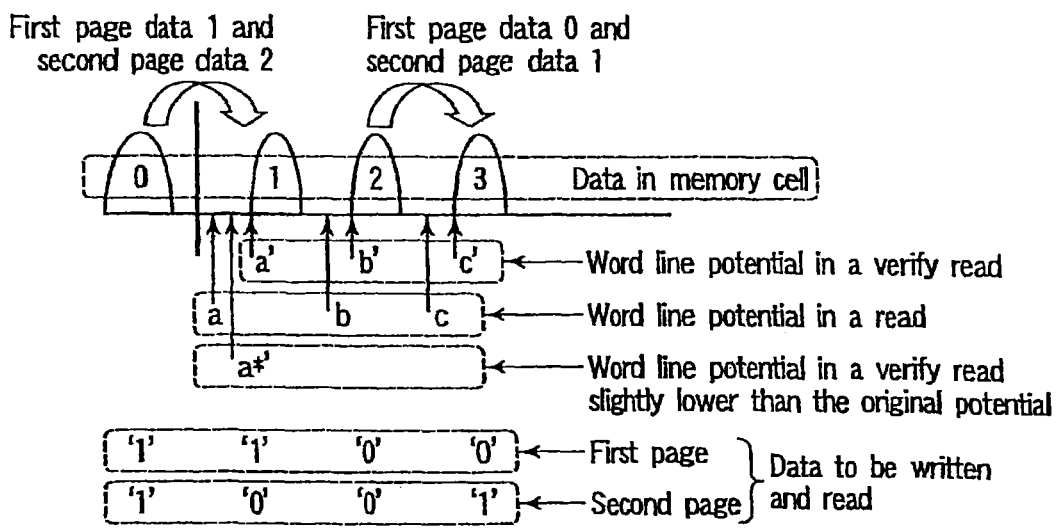

However, as shown in FIG. 47A, before the second page is written, a memory cell into which data "2" is to be written has been written into up to a rather high threshold level before being written into. For this reason, writing may be done slowly. In addition, as the Vpgm rises, the memory cell is written into.

(c) Thereafter, a verify voltage "a*'" is set and a write verify operation is carried out. In the verify operation, with BLC2 being set to the high level and a specific potential being applied to BLCLAMP, only when the SDC has data "1" in it (that is, data "1" has been written into the memory cell), the bit line is precharged. When the SDC has data "0" in it, the bit line is not precharged and remains at Vss.

FIG. 44A shows the data cache after a verify operation is carried out at the verify voltage "a*'".

Next, the potential of the word line is set to the verify potential "a*'" and the bit line is discharged. Let VPRE=Vdd and BLPRE=Vsg. Then, after the TDC is charged to Vdd, a specific voltage is applied to BLCLAMP. If the bit line is at Vss, the TDC is at Vss. If the precharge potential is left on the bit line, the TDC is at Vdd. It is when the memory cell into which data "1" has been written reaches the verify potential "a*'" that the TDC goes to Vdd. When data "1" has not been written into the memory cell, the bit line has not been precharged, with the result that the TDC is at Vss. In addition, when the memory cell into which data "1" has been written does not reach the verify potential "a*'", the TDC is at Vss.

Here, if VREG=high level and REG=high level, when the DDC has data "1" in it, the TDC is forced to go to the high level. Therefore, it is when the memory cell into which data "1" has been written reaches the verify potential "a*'" or when the data in the DDC is "1" or data "2" has been written into the memory cell that the TDC goes to Vdd. Let DTG=Vsg and the data in PDC is copied into the DDC. Thereafter, let BLC1=Vsg and the potential of the TDC is loaded into the PDC.

In FIG. 44B, it is when the memory cell into which data "1" has been written exceeds the verify potential "2*'" or data "2" has been written in the memory cell that the PDC has data "1" in it.

(d) Next, the potential of the word line is dropped a little to produce a verify potential "a'" and the bit line is discharged. Let VPRE=Vdd and BLPRE=Vsg. Then, after the TDC is charged to Vdd again, a specific voltage is applied to BLCLAMP. If the bit line is at Vss, the TDC is at Vss. When the precharge potential is left on the bit line, the TDC is at Vdd. It is when the memory cell into which data "1" has been written reaches the verify potential "a'" that the TDC goes to Vdd. When data "1" has not been written into the memory cell, the bit line has not been precharged, with the result that the TDC is at Vss. In addition, when the memory cell into which data "1" has been written does not reach the verify potential "a'", the TDC is also at Vss.

Here, let VREG=high level and REG=high level. In this state, when the data in the DDC is "1" that is, when no data has been written into the memory cell, the TDC is forced to be set at the high level. Therefore, it is when writing is not selected or when the memory cell into which data "1" has been written reaches the verify potential "a'" that the TDC goes to Vdd.

Next, let DTG=Vsg. Then, after the data in the PDC is copied into the DDC, let BLC1=Vsg. Then, the potential in the TDC is loaded into the PDC (FIG. 45A).

In a memory cell into which data "1" has been written, when the threshold voltage rises above the verify potential "a*'", the data in the DDC becomes "1". In addition, in a memory cell into which data "1" has been written, all of the write operation using the verify potential "a'" has been completed, the data in the PDC becomes "1".

(e) A verify operation using a verify potential "b" (FIG. 45B). As in the first embodiment, in the verify operation, let REG=high level. Then, a specific potential is supplied to BLCLAMP. In this state, in a case where the DDC has data "1" in it, that is, in a case where data "2" has been written into the memory cell, or only in a case where data "1" has been written-into the memory cell and the threshold voltage is higher than the verify potential "a*'", the bit line is precharged. Moreover, in a case where the DDC has data "0" in it, the bit line is not precharged and remains at Vss.

Next, a verify potential "b" is supplied to the word line and the bit line is discharged. While the bit line is being discharged, the data in the DDC is transferred to the TDC. Thereafter, the data in the PDC is transferred to the DDC and the data in TDC is transferred to the PDC. Next, after the TDC is charged to Vdd, a specific potential is supplied to BLCLAMP. Then, it is only when data "2" has been written into the memory cell and the threshold voltage reaches the verify potential "b'" that the TDC goes high.

Here, let VREG=high level and REG=Vsg. In this state, when the data in the DOC is at the high level, the TDC is forced to go high. Therefore, it is when data "2" has been written into the memory cell and the verify potential "b'" is reached or when writing is not selected that the TDC goes to Vdd. Let DTG=Vsg. Then, after the data in the PDC is copied into the DDC, let BLC1=Vsg. Then, the potential in the TDC is loaded into the PDC.

(f) A verify operation using a verify potential "c" (FIG. 46). As in the first embodiment, in this verify operation, too, let BLPRE=high level. Then, a specific potential is supplied to BLCLAMP and the bit line is precharged.

Next, the verify potential "c'" is supplied to the word line and the bit line is discharged. While the bit line is being discharged, the data in the DDC is transferred to the TDC. Thereafter, the data in the PDC is transferred to the DDC and the data in the TDC is transferred to the PDC.

Then, after the TDC is charged to Vdd, a specific potential is supplied to BLCLAMP. It is only when the threshold voltage reaches the verify potential "c'" that the TDC goes high. Then, let VREG=high level and REG=Vsg. In this state, when the data in the DDC is at the high level, the TDC is forced to go high. Therefore, it is when data "3" has been written into the memory cell and the verify potential "c'" is reached or when writing is not selected that the TDC goes to Vdd.

Next, let DTG=Vsg. Then, the data in the PDC is copied into the DDC. Thereafter, let BLC1=Vsg. Then, the potential in the TDC is loaded into the PDC.

In this way, the program and verify operations are repeated until the data in all of PDCs become "1". However, in a write operation, when the data in the DDC is "1", that is, when data "2" has been written into the memory cell, or when data "1" has been written into the memory cell and the verify potential "a*'" has been exceeded, the bit line is set to the intermediate potential and writing is done. Each time the program and verify operations are repeated, Vpgm is raised little by little.

With the ninth embodiment, in the second page write operation, when the DDC has data "1" in it after the data cache is set, or when the bit line is precharged to Vdd in verifying data "2" in the memory cell and the DDC has data "0" in it, the bit line is not precharged. As a result, the bit line goes to Vss only when data "1" has been written into the memory cell and the verify level "a*'" is not exceeded, or when data "3" has been written into the memory cell. The bit line goes to the intermediate potential (1 V) when data "1" has been written into the memory cell and the verify level "a*'" is exceeded, or when data "2" has been written into the memory cell. The bit line goes to Vdd when the data in the memory cell is "0". Thus, if the selected word line is Vpgm and the unselected word line is Vpass, when the bit line is Vdd, no writing is done. Furthermore, the bit line is at Vss, writing is done. Moreover, when the bit line is at the intermediate potential (1 V), writing is done a little, which raises the threshold voltage of the memory cell a little. Accordingly, when the DDC has data "1" in it, the bit line goes to the intermediate potential during programming, which decreases the write speed. This makes it possible to set the distribution of threshold voltages accurately.

In the ninth embodiment, when the data in the first page (lower page) is written into the memory cells and then the data in the second page (upper page) is written into the memory cell, the data in the first page is read and three levels of threshold voltages are written. However, the data in the first page and the data in the second page may be written into the memory cells at the same time.

Figure 48:
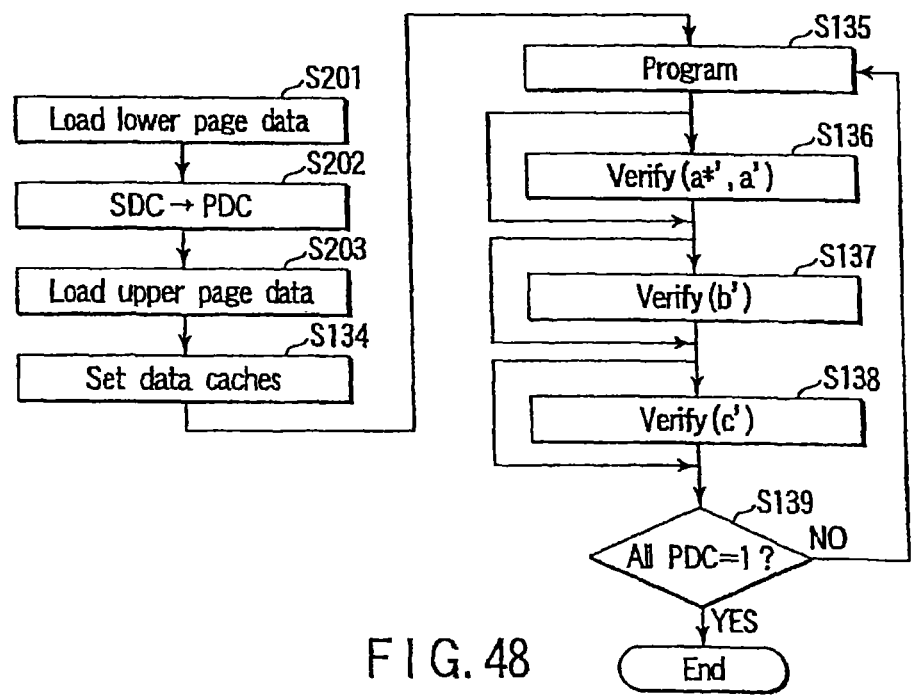
FIG. 48 shows a flowchart of the modification of the ninth embodiment.

Specifically, as shown in FIG. 48, the data in the first page is loaded into the SDC (S201). Then, the data in the first page is transferred from the SDC to the PDC (S202). Next, the data in the second page is loaded into the SDC (S203). Thereafter, the data cache is set as shown in FIG. 43B (S134). According to the data in the data cache, the program is executed (S135). In FIG. 48, since the operations subsequent to the program are the same as those in FIG. 28, the same parts are indicated by the same reference numerals and explanation of them will be omitted.

With the above method, since the data in the first page and the data in the second page are written into the memory cells at the same time, the data in the first page need not be read by the write operation and internal data read operation only for the first page. As a result, high-speed writing can be done.

Tenth Embodiment

FIG. 49, which shows a modification of FIG. 7, shows the order in which a plurality of adjacent memory cells are written into.

In a tenth embodiment of the present invention, a plurality of memory cells in a block are written into in pages, starting with the memory cells closer to a source line. In FIG. 49, only four word lines are shown to simplify the explanation.

In a first write operation, one bit of data is written into a first page of memory cell 1.

In a second write operation, one bit of data is written into a first page of memory cell 2 adjacent to memory cell 1 in the word direction.

In a third write operation, one bit of data is written into a second page of memory cell 1.

In a fourth write operation, one bit of data is written into a second page of memory cell 2 adjacent to memory cell 1 in the word direction.

In a fifth write operation, one bit of data is written into a first page of memory cell 3 adjacent to memory cell 1 in the bit direction.

In a sixth write operation, one bit of data is written into a first page of memory cell 4 diagonally adjacent to memory cell 1.

In a seventh write operation, one bit of data is written into a second page of memory cell 3.

In an eighth write operation, one bit of data is written into a second page of memory cell 4 adjacent to memory cell 3 in the word direction.

In a ninth write operation, one bit of data is written into a first page of memory cell 5 adjacent to memory cell 3 in the bit direction.

In a tenth write operation, one bit of data is written into a first page of memory cell 6 diagonally adjacent to memory cell 3.

In an eleventh write operation, one bit of data is written into a second page of memory cell 5.

In a twelfth write operation, one bit of data is written into a second page of memory cell 6 adjacent to memory cell 5 in the word direction.

In a thirteenth write operation, one bit of data is written into a first page of memory cell 7 adjacent to memory cell 5 in the bit direction.

In a fourteenth write operation, one bit of data is written into a first page of memory cell 8 diagonally adjacent to memory cell 5.

In a fifteenth write operation, one bit of data is written into a second page of memory cell 7.

In a sixteenth write operation, one bit of data is written into a second page of memory cell 8 adjacent to memory cell 7 in the word direction.

Even in the above write sequence, the same effect as shown in the example of FIG. 7 can be obtained.

Eleventh Embodiment

FIG. 50 shows the relationship between a memory cell array 1 and a bit line control circuit 2, which are applied to an eleventh embodiment of the present invention. FIG. 51 shows a data storage circuit 10 applied to the eleventh embodiment.

In each of the above embodiments, one data storage circuit 10 has been connected to a pair of bit lines BLe, BLo as shown in FIGS. 3 and 6. In the eleventh embodiment, however, one data storage circuit 10 is connected to each bit line as shown in FIGS. 50 and 51. In addition, a plurality of memory cells is selected simultaneously with, for example, one flag cell FC. The bit line BLF1 to which the flag cell is connected is connected to a flag data storage circuit 10a.

Furthermore, in each of the above embodiments, of the memory cells connected to a single word line, half of the memory cells have been capable of being written into or read from simultaneously as shown in FIG. 3. In the eleventh embodiment, however, data storage circuits 10, 10a are connected to the bit lines in a one-to-one correspondence. This enables all of the memory cells and flag cell connected to a single word line to be written into or read from simultaneously. Specifically, in FIG. 3, the second page has been composed of half of the memory cells selected simultaneously by the word line. In the eleventh embodiment, however, the second page is composed of all of the memory cells selected simultaneously by the word line.

In FIG. 51, the transistors 61m, 61n to which signals CHK1, CHK2 shown in FIG. 6 are supplied are omitted.

FIG. 52 shows the write sequence in the eleventh embodiment. In a block, a NAND cell is written into in such a manner that the memory cells closer to the source line are written into page by page. To simplify the explanation, only four word lines are shown in FIG. 52.

In a first write operation, one bit of data is written into a first page of memory cell 1.

In a second write operation, one bit of data is written into a second page of memory cell 1. At this time, data is written into also the flag cell.

In a third write operation, one bit of data is written into a first page of memory cell 2 adjacent to memory cell 1 in the bit line direction.

In a fourth write operation, one bit of data is written into a second page of memory cell 2. At this time, data is written into also the flag cell.

In a fifth write operation, one bit of data is written into a first page of memory cell 3 adjacent to memory cell 2 in the bit direction.

In a sixth write operation, one bit of data is written into a second page of memory cell 3. At this time, data is written into also the flag cell.

In a seventh write operation, one bit of data is written into a first page of memory cell 4 adjacent to memory cell 3 in the bit line direction.

In an eighth write operation, one bit of data is written into a second page of memory cell 4. At this time, data is written into also the flag cell.

In the eleventh embodiment, the data storage circuits 10 are connected to the bit lines in a one-to-one correspondence. As a result, it is possible to write or read data into or from all of the memory cells selected simultaneously by the word line.

In addition, after the data on the first page and second page are written into all of the memory cells simultaneously selected by the word line, the data is written sequentially into the memory cells separate from the source line. Therefore, as compared with a case where data is written into the memory cells connected to a word line in units of half of the memory cells as in each of the above embodiments, the eleventh embodiment has the advantage of being less influenced by variations in the threshold voltages of the memory cells adjoining in the word line direction.

Furthermore, when one data storage circuit 10 is connected to a pair of bit lines as shown in FIG. 6, transistors 61x, 61y for supplying a specific potential BLCRL to the unselected bit lines are needed. Moreover, transistors 61v, 61w are connected to the individual bit lines. These transistors 61x, 61y, 61v, 61w are high breakdown-voltage transistors and have larger sizes than the transistors constituting the data storage circuit. As described above, in the case of the circuit configuration of FIG. 6, two large-sized transistors are connected to one bit line. In contrast, in the case of the circuit configuration of FIG. 51, the data storage circuit has no unselected bit line. As a result, only one high breakdown-voltage transistor 61v is connected to each bit line. Therefore, the circuit size can be reduced.

(Modification)

The write sequence shown in FIG. 53 is a modification of the write sequence shown in FIG. 52. In the write sequence of FIG. 52, after the data on the first and second pages are written into the memory cells selected simultaneously by the word line, the data is written sequentially into the memory cells separate from the source line. In contrast, in the case of the example of FIG. 53, after the data on the first page is written into two memory cells adjoining in the bit line direction, the data on the second page is written into the memory cells close to the source line. Specifically, the data is written into the memory cells as follows.

In a first write operation, one bit of data is written into a first page of memory cell 1.

In a second write operation, one bit of data is written into a first page of memory cell 2 adjacent to memory cell 1 in the bit line direction.

In a third write operation, one bit of data is written into a second page of memory cell 1.

In a fourth write operation, one bit of data is written into a first page of memory cell 3 adjacent to memory cell 2 in the bit line direction.

In a fifth write operation, one bit of data is written into a second page of memory cell 2.

In a sixth write operation, one bit of data is written into a first page of memory cell 4 adjacent to memory cell 3 in the bit line direction.

In a seventh write operation, one bit of data is written into a second page of memory cell 3.

In an eighth write operation, one bit of data is written into a second page of memory cell 4.

In the above writing method, after the data on the first page is written into the memory cells adjoining in the bit line direction, the data on the second page is written into the memory cells close to the source line and then the data on the first page is written into the memory cells opposite and adjacent to the source line. As a result, the effect of the coupling of the word line can be reduced, which enables the distribution of the threshold voltages of the memory cells to be narrowed.

FIG. 54 shows a modification of the circuit shown in FIG. 50. In the circuit of FIG. 50, a data storage circuit 10 is provided at one end of each bit line. On the other hand, a data storage circuit 10 is provided alternately at one end or the other end of an adjacent bit line. In this case, the write operation is the same as in the eleventh embodiment. As described above, since a data storage circuit 10 is provided alternately at one end or the other end of an adjacent bit line, this makes the layout of the data storage circuits 10 easier.

Figure 55:
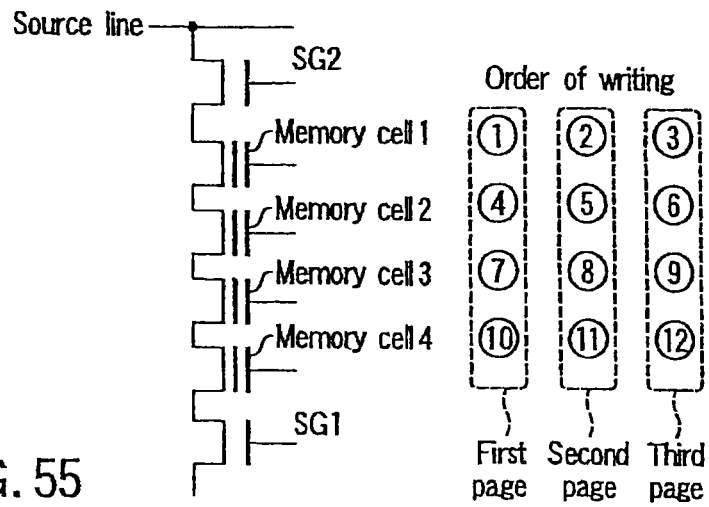
FIGS. 55 and 56 are diagrams to explain the order in which 3 bits data are written into a NAND cell.
Figure 56:
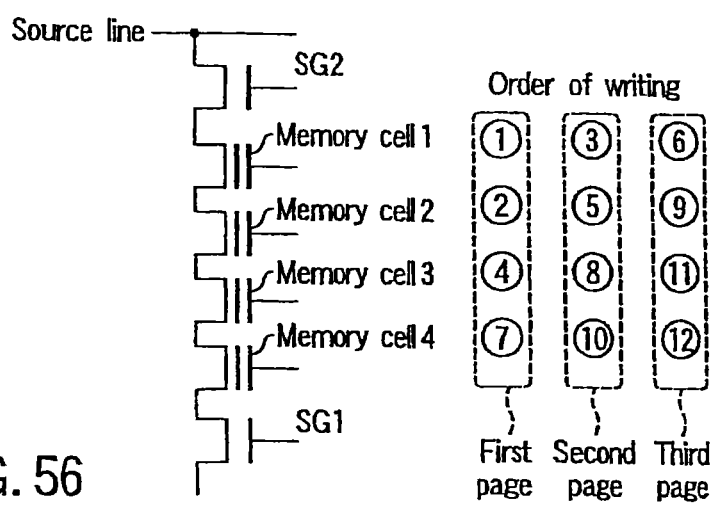

FIGS. 55 and 56 show the write sequence in setting an octal threshold value in a cell and storing 3 bits.

The write sequence shown in FIG. 55 is as follows.

In a first write operation, one bit of data is written into a first page of memory cell 1.

In a second write operation, one bit of data is written into a second page of memory cell 1.

In a third write operation, one bit of data is written into a third page of memory cell 1.

In a fourth write operation, one bit of data is written into a first page of memory cell 2 adjacent to memory cell 1 in the bit line direction.

In a fifth write operation, one bit of data is written into a second page of memory cell 2.

In a sixth write operation, one bit of data is written into a third page of memory cell 2.

In a seventh write operation, one bit of data is written into a first page of memory cell 3 adjacent to memory cell 2 in the bit line direction.

In an eighth write operation, one bit of data is written into a second page of memory cell 3.

In a ninth write operation, one bit data is written into a third page of memory cell 3.

In a tenth write operation, one bit of data is written into a first page of memory cell 4 adjacent to memory cell 3 in the bit line.

In an eleventh write operation, one bit of data is written into a second page of memory cell 4.

In a twelfth write operation, one bit of data is written into a third page of memory cell 4.

The write sequence shown in FIG. 56 is as follows.

In a first write operation, one bit of data is written into a first page of memory cell 1.

In a second write operation, one bit of data is written into a first page of memory cell 2 adjacent to memory cell 1 in the bit line direction.

In a third write operation, one bit of data is written into a second page of memory cell 1.

In a fourth write operation, one bit of data is written into a first page of memory cell 3 adjacent to memory cell 2 in the bit line direction.

In a fifth write operation, one bit of data is written into a second page of memory cell 2.

In a sixth write operation, one bit of data is written into a third page of memory cell 1.

In a seventh write operation, one bit of data is written into a first page of memory cell 4 adjacent to memory cell 3 in the bit line direction.

In an eighth write operation, one bit of data is written into a second page of memory cell 3.

In a ninth write operation, one bit data is written into a third page of memory cell 2.

In a tenth write operation, one bit of data is written into a second page of memory cell 4.

In an eleventh write operation, one bit of data is written into a third page of memory cell 3.

In a twelfth write operation, one bit of data is written into a third page of memory cell 4.

Twelfth Embodiment

A twelfth embodiment of the present invention is such that, in a divided write operation of dividing one page into areas and writing the data into the areas, a flag cell is provided so as to correspond to each of the divided areas.

In the first to tenth embodiments, in a NAND flash memory, one page of data, for example, 2 kilobytes+64 bytes of data, is written in one write operation. Depending on an application using a NAND flash memory, one page may be required to be divided into areas and written into in areas. The way of dividing one page includes, for example, 2 kilobytes and 64 kilobytes and 1 kilobytes+32 bytes, 1 kilobytes+32 bytes and 1 kilobytes and 1 kilobytes and 64 bytes.

Figure 57:
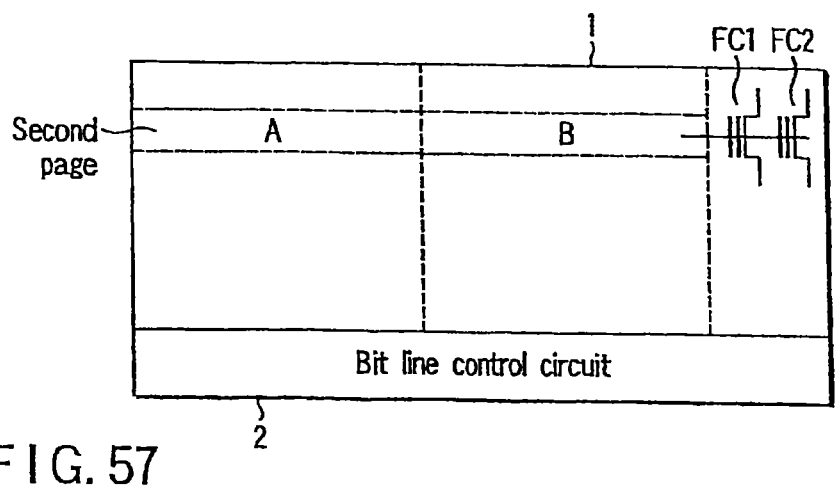
FIG. 57 shows a diagram showing the configuration of the memory cell array and bit line control section applied to the twelfth embodiment.

FIG. 57 schematically shows the relationship between the memory cell array 1 and the flag cell FC. As shown in FIG. 57, when one page is divided into, for example, area A and area B, a first flag cell FC1 is provided so as to correspond to area A and a second flag cell FC2 is provided so as to correspond to area B.

With the above configuration, when the data is written into area A on the second page, the data is written into also the first flag cell FC1. When the data is written into area B on the second page, the data is written into also the second flag cell FC2.

Furthermore, with the above configuration, when divided writing is not done, that is, when the data is written into area A and area B on the second page at the same time, the data is written into both of the first and second flag cells FC1, FC2.

Figure 58A:
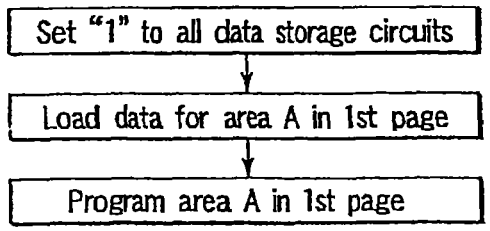
FIGS. 58A to 58D are flowcharts to explain an operation of the twelfth embodiment.
Figure 58C:
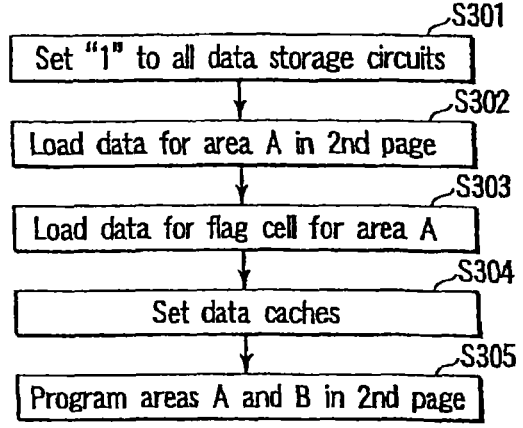
Figure 58B:
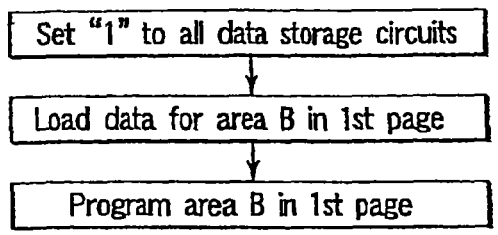
Figure 58D:
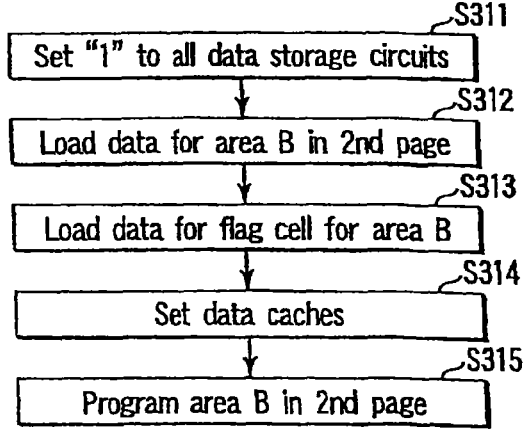

FIGS. 58A to 58D show concrete write sequences for area A and area B. A first page write operation shown in FIGS. 58A and 58B are the same as in a case where no divided writing is done. In the write operation, no data is written into the flag cells FC1 and FC2.

FIG. 58C shows the operation of writing data into area A on the second page. First, data "1" is set in all of the data storage circuits 10 (S301). Thereafter, data for area A is supplied to the data storage circuit corresponding to area A (S302). Then, data for the flag cell FC1, corresponding to area A is supplied to the data storage circuit (S303). Thereafter, the data cache is set (S304) and data is written into area A and area B (S305).

At this time, writing data in area B is set to "1." Therefore, when the first page has been written into and the data in the memory call is "2," the data in the memory cell in area B is "3" as shown in FIG. 1C, with the result that no data can be written into area B. For this reason, when the data in the memory cell is "2" (the threshold voltage is equal to or higher than "b*'"), the data in the memory cell is set to "2" (the threshold voltage is equal to or higher than "b"). Specifically, for example, in a case where data is set in each data cache as shown in FIG. 43B, when the data caches are not operated at all, data "3" is written into the memory cells. To overcome this problem, for example, the signal PRST supplied to the gate of the transistor 61d shown in FIG. 6 or FIG. 51 is divided into signal PRST for area A and signal PRST for area B. Then, when data has been set in the data cache, the signal PRST is made high, thereby resetting the data in area B. This sets the data in the DDC to "1," thereby writing data "2" into the memory cell. As a result, the data in the memory cell in area B is "0" or "2." In addition, no data is written into the flag cell FC2.

In the state where area A has been written into, a first page read operation is the same as the read operation in FIG. 13 or 16. At this time, the data in area A and the data in area B are both read according to the data in the flag cell corresponding to area A. A second page read operation is the same as the read operation in FIG. 14 or 15. The data in area A is read after a second page write operation. However, when the data in area B is read, no data has not been written into the flag cell FC2 used to recognize that the data in the second page has been written into area B. Thus, the data in area B is forcibly read as "1."

Next, the operation of writing data into area B on the second page will be explained by reference to FIG. 59D. First, data "1" is set in all of the data storage circuits 10 (S311). Thereafter, data for area B is supplied to the data storage circuit corresponding to area B (S312). Then, data for the flag cell FC2 corresponding to area B is supplied to the data storage circuit (S313). After this, the data cache is set (S314) and data is written into area B (S315). At this time, when the memory cells in area A have been written into, the memory cells in area A might have been written into. For this reason, the memory cells in area A are prevented from being written into. Specifically, for example, when data is set in the cache, the PDC might take the value of "0" shown in FIG. 43B.

To overcome this problem, the signal PRST supplied to the gate of the transistor 61d in FIG. 6 or 51 is divided into signal PRST for area A and signal PRST for area B. Then, when data is set in the data cache, the signal PRST is made high, thereby resetting the data in area A. This sets the data in the PDC to "1," preventing the data from being written into the memory cells. As a result, the data in the memory cells in area A does not change.

In the twelfth embodiment, area A and area B can be controlled independently according to the data in the first and second flag cells FC1, FC2. Therefore, even during a divided write operation, a read operation can be performed on the area into which the data on, for example, the second page has been written.

In FIG. 57, both of the flag cells FC1 and FC2 are provided at the right end of the cell array. However, the flag cell FC1 may be provided next to area A and the flag cell FC2 may be provided next to area B.

In addition, each page may be divided into two or more areas. In this case, two or more flag cells are provided so as to correspond to the divided areas.

The twelfth embodiment can be applied to the configuration of each of FIGS. 50 and 51. In addition, the pages set in the memory cell are not limited to two pages and may be set according to the number of bits stored in the memory cell. Specifically, when a $2^n$ (n is a natural number equal to 2 or more) number of threshold voltages are set in the memory cell, an n number of pages are set. At this time, at the same time when the n-th page is written into, the data is written into the flag cells.

For example, when $2^3$ threshold voltages are set in memory cells, three pages are used. At this time, data is written into the first flag cell at the same time when the second page in area A is written into. Data is written into the second flag cell at the same time when the second page in area B is written into. Data is written into the third flag cell at the same time when the third page in area A is written into. Data is written into the fourth flag cell at the same time when the third page in area B is written into.

Furthermore, a plurality of threshold voltages may be set also in the flag cells. In this case, data is written into the first flag cell at the same time when the second page in area A is written into. Data is written into the second flag cell at the same time when the second page in area B is written into. Data is written into the first flag cell at the same time when the third page in area A is written into. Data is written into the second flag cell at the same time when the second page in area B is written into. As described above, setting a plurality of threshold voltages also in the flag cells enables an increase in the number of flag cells to be suppressed even when the number of pages increases.

Thirteenth Embodiment

Figure 60A:
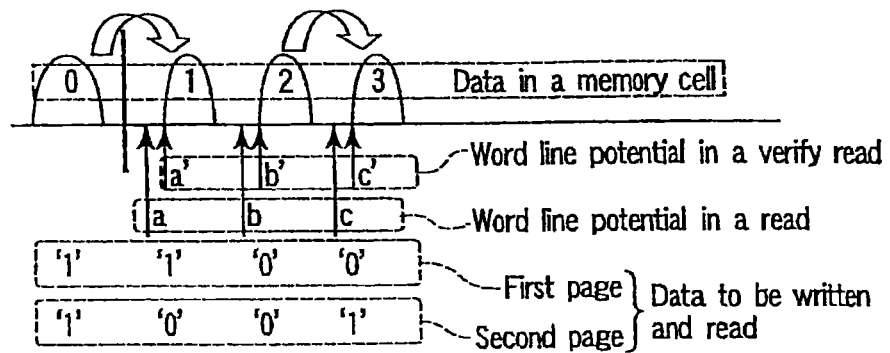
FIGS. 60A and 60B show the threshold voltages of the memory cell and the flag cell according to a thirteenth embodiment of the present invention.
Figure 60B:
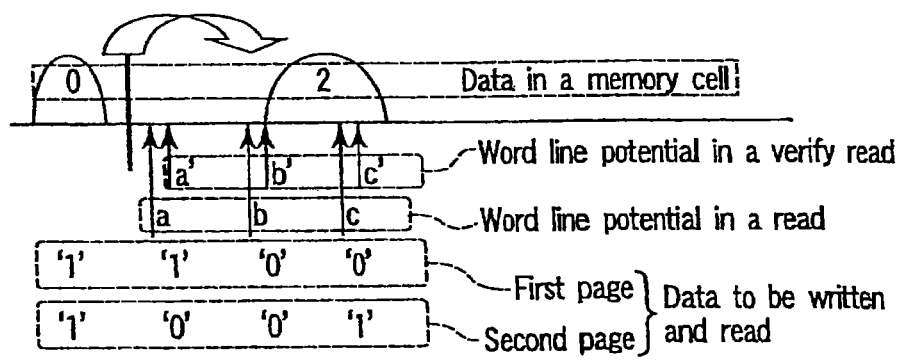

A thirteenth embodiment of the present invention is modified from the second embodiment. As shown in FIG. 60A, in the second embodiment, when a second page is written into, the data in a memory cell is changed from "0" to "1" or from "2" to "3." At the same time, the data in the flag cell is changed from "0" to "2" as shown in FIG. 60B. When writing is done in this way, the threshold voltage distribution in the flag cell might widen as shown in FIG. 60B. The threshold voltage is higher than the word line potential in a read operation. In this state, when the second page is read from as shown in FIG. 14, the data read from the flag cell is "1," which means that the second page has not been written into.

To overcome this problem, in the thirteenth embodiment, a first flag cell FC1 and a second flag cell FC2 are provided as shown in FIG. 34. In this configuration, when the second page is written into, the data in the first flag cell FC1 is changed from "0" to and the data in the second flag cell is changed from "0" to "1" as in the second embodiment.

Figure 61A:
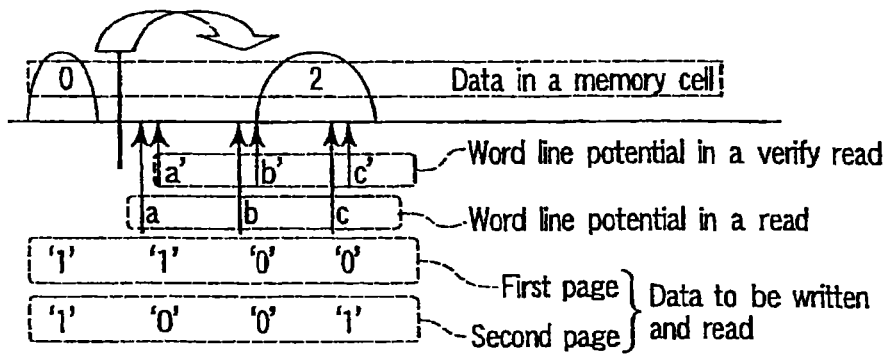
FIGS. 61A and 61B show the threshold voltages of the flag cell according to a thirteenth embodiment of the present invention.
Figure 61B:
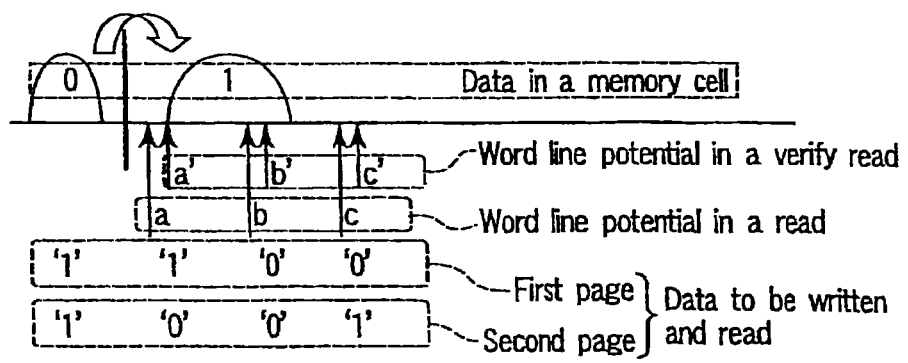

FIG. 61A shows the threshold voltage distribution in the first flag cell FC1 after the second page is written into. FIG. 61B shows the threshold voltage distribution in the second flag cell FC2.

Figures 62, 63:
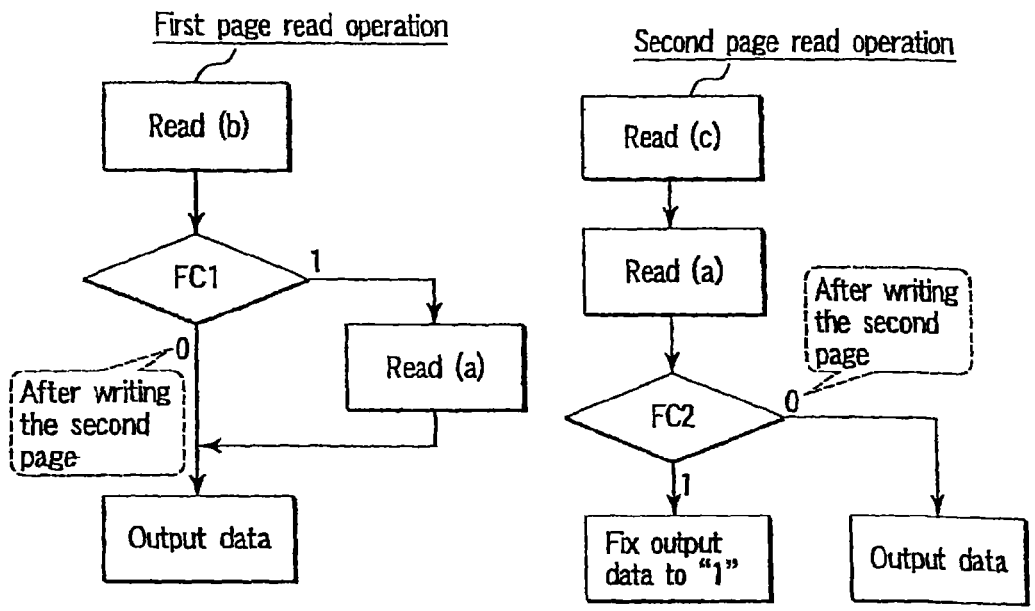
FIG. 62 shows a flowchart for the operation of reading a first page in the thirteenth embodiment.
FIG. 63 shows a flowchart for the operation of reading a second page in the thirteenth embodiment.

In a data read operation, when the data in the first page is read, it is determined from the data in the first flag cell FC1 whether the second page has been written into, as shown in FIG. 62. Specifically, first, in a read operation, the potential on the word line is set to "b" and then the data is read from the memory cell and the first flag cell FC1. If the data in the first flag cell FC1 is "0," it is found that the second page has been written into. If the data in the first flag cell FC1 is "1," it is found that the second page has not been written into. Therefore, the potential on the word line is set to "a" and then the data in the memory cell is read out.

When the data in the second page is read, it is determined from the data in the second flag cell FC2 Whether the second page has been written into, as shown in FIG. 63. Specifically, first, the potential on the word line is set to "c" and the data is read. Then, the potential on the word line is set to "a" and the data is read. If the data in the second flag cell FC2 is "0," this means that the second page has been written into. Therefore, the read-out data is outputted. On the other hand, if the data in the second flag cell FC2 is "1," this means that the second page has not been written into. Therefore, data "1" is outputted.

In the thirteenth embodiment, the first and second flag cells FC1, FC2 are provided. According to the data in the first and second flag cells FC1, FC2, it is determined whether the second page has been written into. Therefore, in the operation of writing data into the second page, even when the threshold voltage distribution in each of the first and second flag cells FC1, FC2 widens, it can be determined reliably whether the second page has been written into in reading the data.

In the thirteenth embodiment, the data in the first flag cell FC1 has been changed from "0" to "2." However, the data may be changed from "0" to "3." In addition, the data in the second flag cell FC2 has been changed from "0" to "1." However, the data may be changed from "0" to "2." With this configuration, a large margin for the threshold voltage distribution and the potential on the word line in a read operation can be allowed for. Consequently, it is possible to increase the reliability of data retention.

Figure 64:
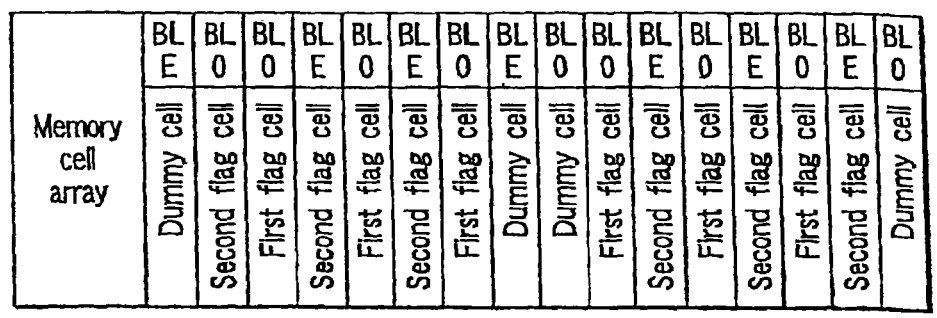
FIG. 64 shows a schematic configuration of modification of the thirteenth embodiment.

FIG. 64 is a modification of the thirteenth embodiment. In the modification, to increase the reliability further, a plurality of first and second flag cells and dummy cells are provided at one end of the memory cell array. Specifically, three first flag cells and three second flag cells are provided for even-numbered pages (BLE). Three first flag cells and three second flag cells are provided for odd-numbered pages (BLO). In this configuration, when the data is read, a decision by majority is made using the three first flag cells on an even-numbered page and a decision by majority is made using the three second flag cells on the even-numbered page, thereby determining whether the second page has been written into on the even-numbered page. Furthermore, a decision by majority is made using the three first flag cells on an odd-numbered page and a decision by majority is made using the three second flag cells on the odd-numbered page, thereby determining whether the second page has been written into on the odd-numbered page. With this configuration, even when the threshold voltage in a cell written into earlier is changed by the threshold voltage in an adjacent cell written into later through the FG-FG capacitance of the adjacent cells, it can be determined reliably whether the second page has been written into.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. A method of operating the non-volatile semiconductor memory, the non-volatile semiconductor memory including a bit line coupled to a memory cell, a word line coupled to the memory cell, a first transistor coupled between the bit line and a sense node, a first register coupled to the sense node, a second register coupled to the first register, and a second transistor coupled between the sense node and a source of a power voltage, the memory cell being capable of storing n bits of data (n is a natural number equal to or larger than two), the method comprising:

receiving a first bit of data from an outside of the non-volatile semiconductor memory;

making a threshold voltage of the memory cell higher than a first level if the first bit of data is a first value;

receiving a second bit of data from the outside of the non-volatile semiconductor memory;

making the threshold voltage of the memory cell, that has been made higher than the first level, higher than a second level, if the second bit of data is a second value, the second level being higher than the first level; and making the threshold voltage of the memory cell, that has been made higher than the first level, higher than a third level, if the second bit of data is a third value, the third level being higher than the second level, and the third value differing from the second value, wherein the step of making the threshold voltage of the memory cell higher than the first level comprises:

storing data of a first logic level in the first register, the first logic level corresponding to the first value of the first bit of data;

applying a first program voltage to the memory cell to alter the threshold voltage of the memory cell;

determining whether the threshold voltage of the memory cell is lower than the first level; and applying a second program voltage to the memory cell to alter the threshold voltage of the memory cell if it has been determined that the threshold voltage of the memory cell is lower than the first level, the second program voltage being higher than the first program voltage by a first amount, and wherein the step of making the threshold voltage of the memory cell higher than the second level comprises:

storing data of the first logic level in the first register;

storing data of a second logic level in the second register, the second logic level corresponding to the second value of the second bit of data;

applying a third program voltage to the memory cell to alter the threshold voltage of the memory cell;

determining whether the threshold voltage of the memory cell is lower than the third level; and applying a fourth program voltage to the memory cell to alter the threshold voltage of the memory cell if it has been determined that the threshold voltage of the memory cell is lower than the third level, the fourth program voltage being higher than the third program voltage by a second amount.

2. The method according to claim 1, wherein:

the step of making the threshold voltage of the memory cell higher than the first level further comprises storing data of a third logic level in the first register if it has been determined that the threshold voltage of the memory cell has reached the first level, the third logic level differing from the first logic level; and the step of making the threshold voltage of the memory cell higher than the second level further comprises storing data of the third logic level in the first register if it has been determined that the threshold voltage of the memory cell has reached the second level.

3. The method according to claim 2, wherein the first logic level is a low level and the third logic level is a high level.

4. The method according to claim 2, wherein the step of making the threshold voltage of the memory cell higher than the third level comprises:

storing data of the first logic level in the first register; and storing data of a fourth logic level in the second register, the fourth logic level corresponding to the third value of the second bit of data, the fourth logic level differing from the second logic level.

5. The method according to claim 2, wherein the step of determining whether the threshold voltage of the memory cell is lower than the first level comprises:

electrically connecting the bit line to the source of the power voltage through the first and second transistors by applying a first control voltage to the gate of the first transistor;

applying a read voltage to the word line, after applying the first control voltage to the gate of the first transistor; and electrically connecting the bit line to the sense node by applying a second control voltage to the gate of the first transistor so that a voltage on the bit line is reflected to a voltage on the sense node, after applying the read voltage to the word line.

6. The method according to claim 5, wherein the data of the third logic level is stored in the first register according to the voltage on the sense node, after applying the read voltage to the word line.

7. The method according to claim 5, wherein the first control voltage causes the first transistor to charge the bit line to a voltage lower than the power voltage.

8. The method according to claim 5, wherein the first control voltage causes the first transistor to charge the bit line to a voltage lower than a voltage on the sense node.

9. The method according to claim 5, wherein:

the first transistor is an N-channel transistor; and the first control voltage is higher than the second control voltage.

10. The method according to claim 1, wherein the second amount is smaller than the first amount.

11. The method according to claim 1, wherein the non-volatile semiconductor memory is a NAND type flash memory.

12. The method according to claim 1, wherein the first value is "0".

13. The method according to claim 1, wherein the second value is "0" and the third value is "1".

14. The method according to claim 1, the method further comprising maintaining the threshold voltage of the memory cell if the first bit of data is a fourth value, the fourth value differing from the first value.

15. The method according to claim 14, wherein the fourth value is "1".

16. The method according to claim 1, wherein:
the step of making the threshold voltage of the memory cell higher than the second level further comprises determining whether the threshold voltage of the memory cell is lower than a fourth level, before applying the third program voltage, the fourth level being lower than the first level.

17. The method according to claim 1, wherein the step of making the threshold voltage of the memory cell higher than the second level further comprises transferring the data of the second logic level in the second register to the first register.

18. The method according to claim 1, wherein, in the step of applying the first program voltage to the memory cell, the first register storing the data of the first logic level provides a ground potential to the bit line through the first transistor.

* * * * *